(12) United States Patent
Kim et al.

(10) Patent No.: US 11,631,681 B2
(45) Date of Patent: Apr. 18, 2023

(54) VERTICAL CONTACTS FOR SEMICONDUCTOR DEVICES

(71) Applicant: Micron Technology, Inc., Boise, ID (US)

(72) Inventors: Byung Yoon Kim, Boise, ID (US); Sangmin Hwang, Boise, ID (US); Kyuseok Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 171 days.

(21) Appl. No.: 17/189,485

(22) Filed: Mar. 2, 2021

(65) Prior Publication Data

US 2022/0285365 A1 Sep. 8, 2022

(51) Int. Cl.
| | | |
|---|---|---|
| H01L 27/108 | (2006.01) | |
| H01L 29/06 | (2006.01) | |
| H01L 29/423 | (2006.01) | |
| H01L 29/786 | (2006.01) | |
| H01L 21/02 | (2006.01) | |
| H01L 29/66 | (2006.01) | |

(52) U.S. Cl.
CPC .. *H01L 27/10897* (2013.01); *H01L 21/02603* (2013.01); *H01L 27/1085* (2013.01); *H01L 27/10805* (2013.01); *H01L 27/10873* (2013.01); *H01L 27/10894* (2013.01); *H01L 29/0673* (2013.01); *H01L 29/42392* (2013.01); *H01L 29/66742* (2013.01); *H01L 29/78696* (2013.01)

(58) Field of Classification Search
CPC ......... H01L 27/10897; H01L 21/02603; H01L 27/10805; H01L 27/1085; H01L 27/10873; H01L 27/10894; H01L 29/0673; H01L 29/42392; H01L 29/66742; H01L 29/78696

USPC ........................................................ 257/296
See application file for complete search history.

(56) References Cited

U.S. PATENT DOCUMENTS

| | | | |
|---|---|---|---|
| 10,607,995 B2 | 3/2020 | Roberts et al. | |
| 2017/0352678 A1* | 12/2017 | Lu ........................ | H01L 27/1157 |
| 2018/0323200 A1 | 11/2018 | Tang et al. | |
| 2019/0103406 A1 | 4/2019 | Tang et al. | |
| 2019/0164985 A1 | 5/2019 | Lee et al. | |
| 2021/0013226 A1 | 1/2021 | Tang et al. | |
| 2022/0108988 A1* | 4/2022 | Kim ....................... | H01L 28/86 |

* cited by examiner

*Primary Examiner* — Tong-Ho Kim
(74) *Attorney, Agent, or Firm* — Brooks, Cameron & Huebsch, PLLC

(57) ABSTRACT

Embodiments herein relate to vertical contacts for semiconductor devices. For instance, a memory device having vertical contacts can comprise a substrate including circuitry components, a vertical stack of layers formed from repeating iterations of a group of layers disposed on the substrate, the group of layers comprising a first dielectric material layer, a semiconductor material layer, and a second dielectric material layer including horizontal conductive lines formed along a horizontal plane in the second dielectric material layer, and vertical contacts coupled to the horizontal conductive lines, the vertical contacts extending along a vertical plane within the vertical stack of layers to directly electrically couple the horizontal conductive lines to the circuitry components.

20 Claims, 37 Drawing Sheets

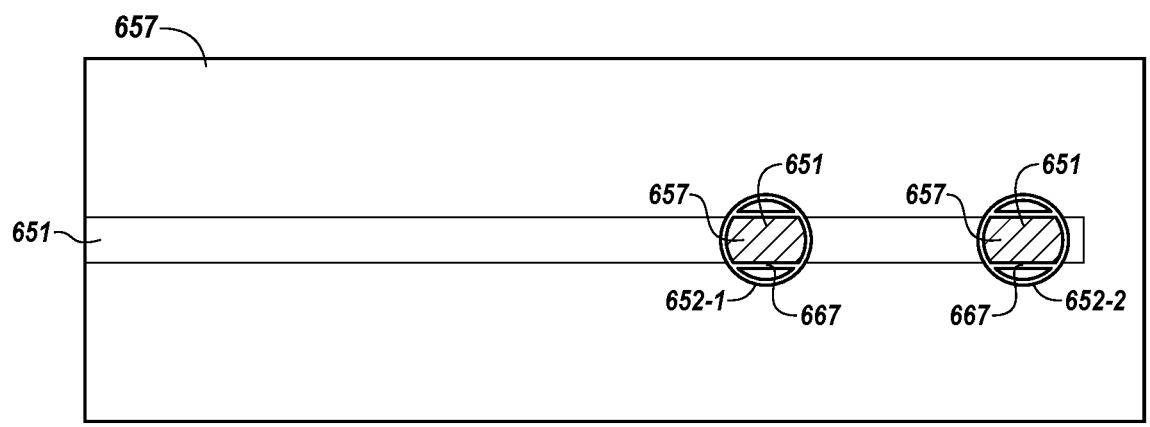
FIG. 6H
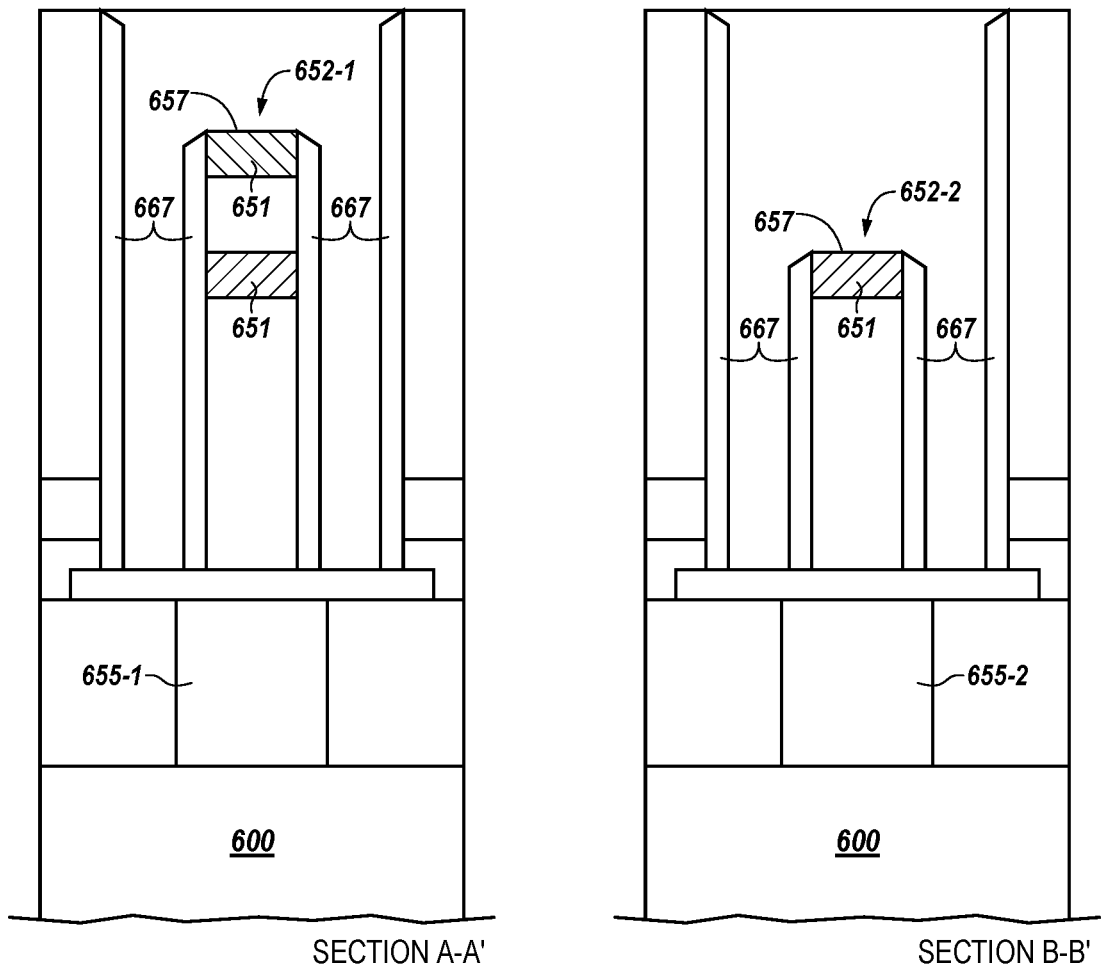
FIG. 6I   FIG. 6J

US 11,631,681 B2

1

VERTICAL CONTACTS FOR SEMICONDUCTOR DEVICES

TECHNICAL FIELD

The present disclosure relates generally to memory devices, and more particularly, to vertical contacts for semiconductor devices.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device (e.g., a transistor) having a first and a second source/drain regions separated by a channel region. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a conductive line, such as a digit line. The access device can be activated (e.g., to select the cell) by an access line coupled to an access transistor. The capacitor can store a charge corresponding to a data value of a respective cell (e.g., a logic "1" or "0").

DETAILED DESCRIPTION

Figure 1:
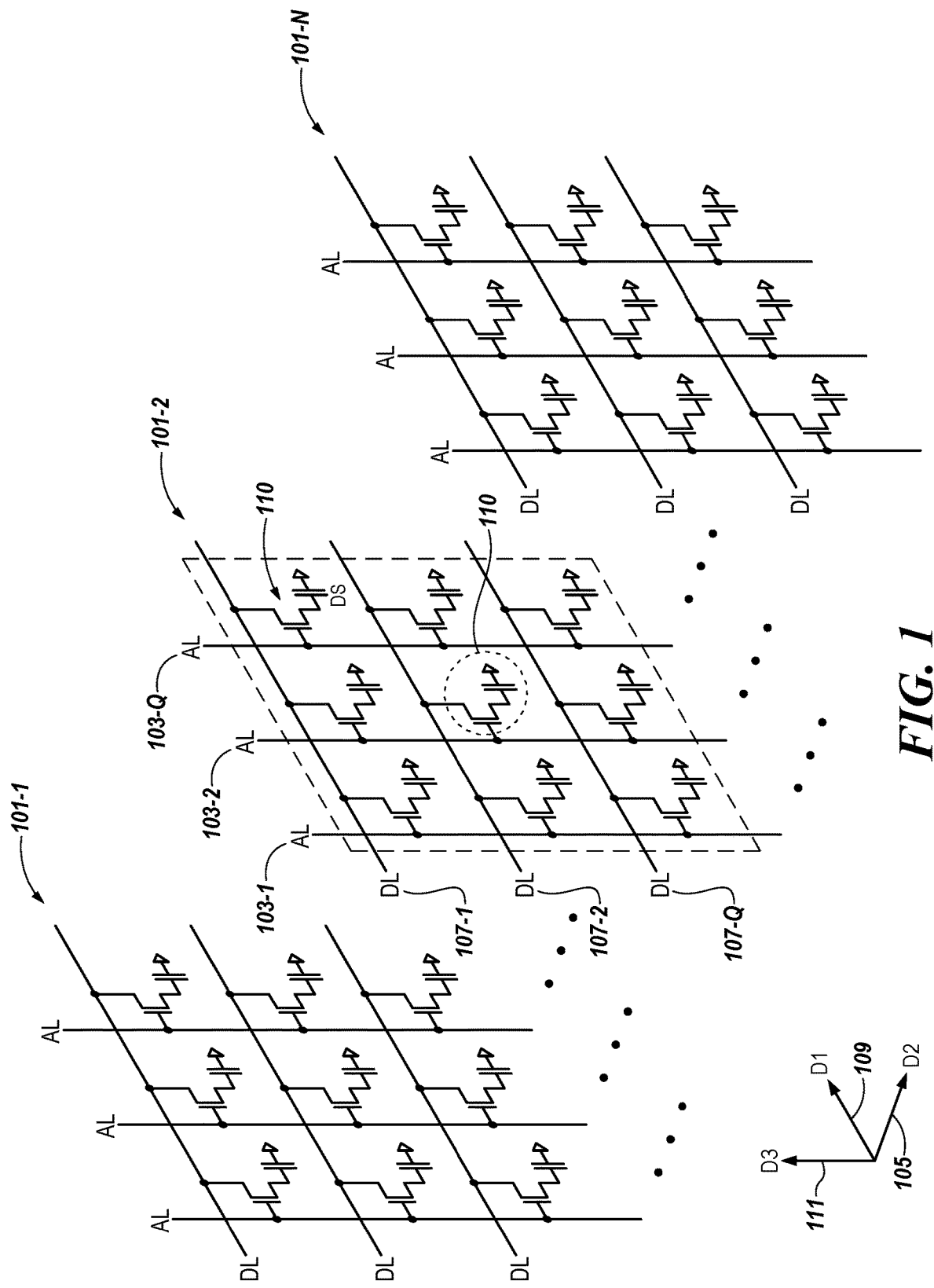
FIG. 1 is a schematic illustration of a vertical three dimensional (3D) memory device in accordance with embodiments of the present disclosure.

Stacked memory devices, such as three-dimensional (3D) dynamic random access memory (DRAM) devices, comprise multiple tiers of vertically stacked memory cells. Coupling conductive lines (e.g., digit lines, word lines) included in the stacked memory device to sense amplifiers or word line drivers can be challenging and/or can result in increased interconnection area size. For example, the traditional geometry of the conductive lines can result in a relatively large interconnection area associated with contacts used to indirectly connect the conductive lines (e.g., digit lines) to one or more circuitry components such as sense amplifiers. For instance, the traditional geometry can employ indirect connection/routing via a jumper and/or other type interconnections (e.g., horizontal interconnections) between the conductive lines to one or more circuitry components.

As such, various embodiments of the present disclosure describe vertical contacts for semiconductor devices. For instance, embodiments of the present disclosure can provide multi-direction conductive lines and can allow connection to those multi-direction conductive lines through a tiered (e.g., staircase) structure that, notably, employs vertical contacts. For instance, in some embodiments, the conductive lines may be digit lines directly coupled to one or more circuitry components (e.g., sense amplifiers) through a vertical contact in the absence of another separate and distinct interconnections such as a jumper and/or other type of horizontal interconnect. Advantages of the embodiments herein included greater interconnection density, reduce a total number of components (e.g., do not employ a jumper or other type of separate and distinct horizontal interconnect), and/or improve (reduce) parasitic current loss, etc. For instance, embodiments of the present disclosure can provide benefits such as more density of connections between conductive lines and sense amplifiers in an interconnection area as compared to conventional structures.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 302-1 may reference element 302-1 in FIGS. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302. The use of a letter, such as 302-N, means that any number of items 302 may be utilized.

FIG. 1 is a block diagram of an apparatus in accordance with embodiments of the present disclosure. FIG. 1 illustrates a circuit diagram showing a cell array of a 3D semiconductor memory device according to embodiments of the present disclosure. FIG. 1 illustrates that a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays (e.g., sub cell array 101-2) may include a plurality of access lines 103-1, 103-2, . . . , 103-Q (which also may be referred to as word lines). Also, each of the sub cell arrays (e.g., sub cell array 101-2) may include a plurality of digit lines 107-1, 107-2, . . . , 107-Q (which also may be referred to as bitlines, data lines, or sense lines). In FIG. 1, the digit lines 107-1, 107-2, . . . , 107-Q are illustrated extending in a first direction (D1) 109 and the access lines 103-1, 103-2, . . . , 103-Q are illustrated extending in a third direction (D3) 111.

The first direction (D1) 109 and the second direction (D2) 105 may be considered in a horizontal ("X-Y") plane. The third direction (D3) 111 may be considered in a vertical ("Z") direction (e.g., transverse to the X-Y plane). Hence, according to embodiments described herein, the access lines 103-1, 103-2, . . . , 103-Q are extending in a vertical direction (e.g., third direction (D3) 111).

A memory cell (e.g., 110) may include an access device (e.g., access transistor) and a storage node located at an intersection of each access line 103-1, 103-2, . . . , 103-Q and each digit line 107-1, 107-2, . . . , 107-Q. Memory cells may be written to, or read from, using the access lines 103-1, 103-2, . . . , 103-Q and digit lines 107-1, 107-2, . . . , 107-Q. The digit lines 107-1, 107-2, . . . , 107-Q may conductively interconnect memory cells along horizontal columns of each sub cell array 101-, 101-2, . . . , 101-N, and the access lines 103-1, 103-2, . . . , 103-Q may conductively interconnect memory cells along vertical rows of each sub cell array 101-1, 101-2, . . . , 101-N. One memory cell, e.g., 110, may be located between one access line (e.g., 103-2) and one digit line (e.g., 107-2). Each memory cell may be uniquely addressed through a combination of an access line 103-1, 103-2, . . . , 103-Q and a digit line 107-1, 107-2, . . . , 107-Q.

The digit lines 107-1, 107-2, . . . , 107-Q may be or include conducting patterns (e.g., metal lines) disposed on and spaced apart from a substrate. The digit lines 107-1, 107-2, . . . , 107-Q may extend in a first direction (D1) 109. The digit lines 107-1, 107-2, . . . , 107-Q in one sub cell array (e.g., 101-2) may be spaced apart from each other in a vertical direction (e.g., in a third direction (D3) 111).

The access lines 103-1, 103-2, . . . , 103-Q may be or include conductive patterns (e.g., metal lines) extending in a vertical direction with respect to the substrate (e.g., in a third direction (D3) 111). The access lines in one sub cell array (e.g., 101-2) may be spaced apart from each other in the first direction (D1) 109.

A gate of a memory cell (e.g., memory cell 110) may be connected to an access line (e.g., 103-2) and a first conductive node (e.g., first source/drain region) of an access device (e.g., transistor) of the memory cell 110 may be connected to a digit line (e.g., 107-2). Each of the memory cells (e.g., memory cell 110) may be connected to a storage node (e.g., capacitor). A second conductive node (e.g., second source/drain region) of the access device (e.g., transistor) of the memory cell 110 may be connected to the storage node (e.g., capacitor). Storage nodes, such as capacitors, can be formed from ferroelectric and/or dielectric materials such as zirconium oxide ($ZrO2$), hafnium oxide ($HfO2$) oxide, lanthanum oxide ($La2O3$), lead zirconate titanate (PZT, $Pb[Zr(x)Ti(1-x)]O3$), barium titanate ($BaTiO3$), aluminum oxide (e.g., $Al2O3$), a combination of these with or without dopants, or other suitable materials.

While first and second source/drain region references are used herein to denote two separate and distinct source/drain regions, it is not intended that the source/drain region referred to as the "first" and/or "second" source/drain regions have some unique meaning. It is intended only that one of the source/drain regions is connected to a digit line (e.g., 107-2) and the other may be connected to a storage node.

Figure 2:
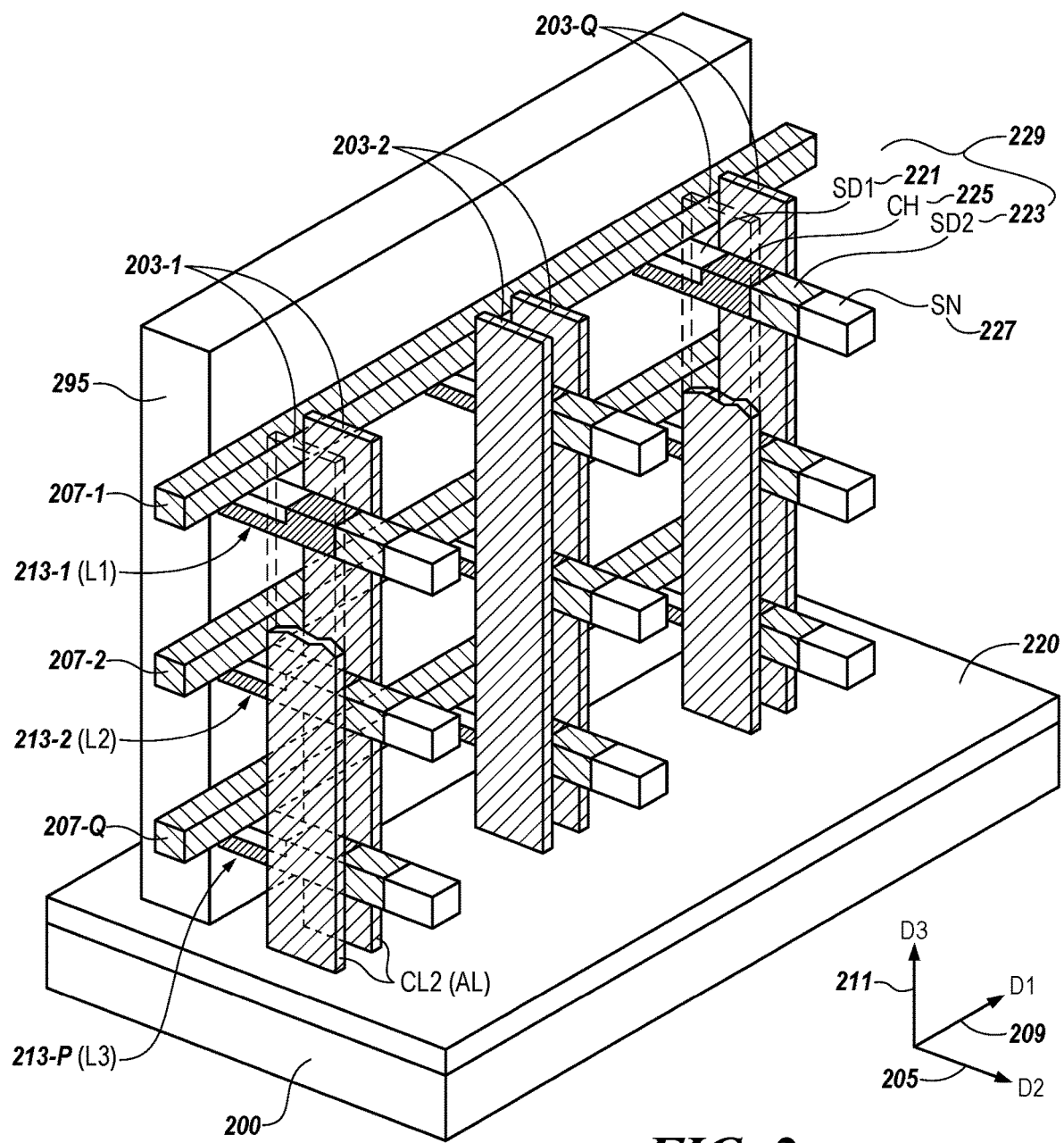
FIG. 2 illustrates a perspective view showing a 3D semiconductor memory device in accordance with embodiments of the present disclosure.
Figure 3:
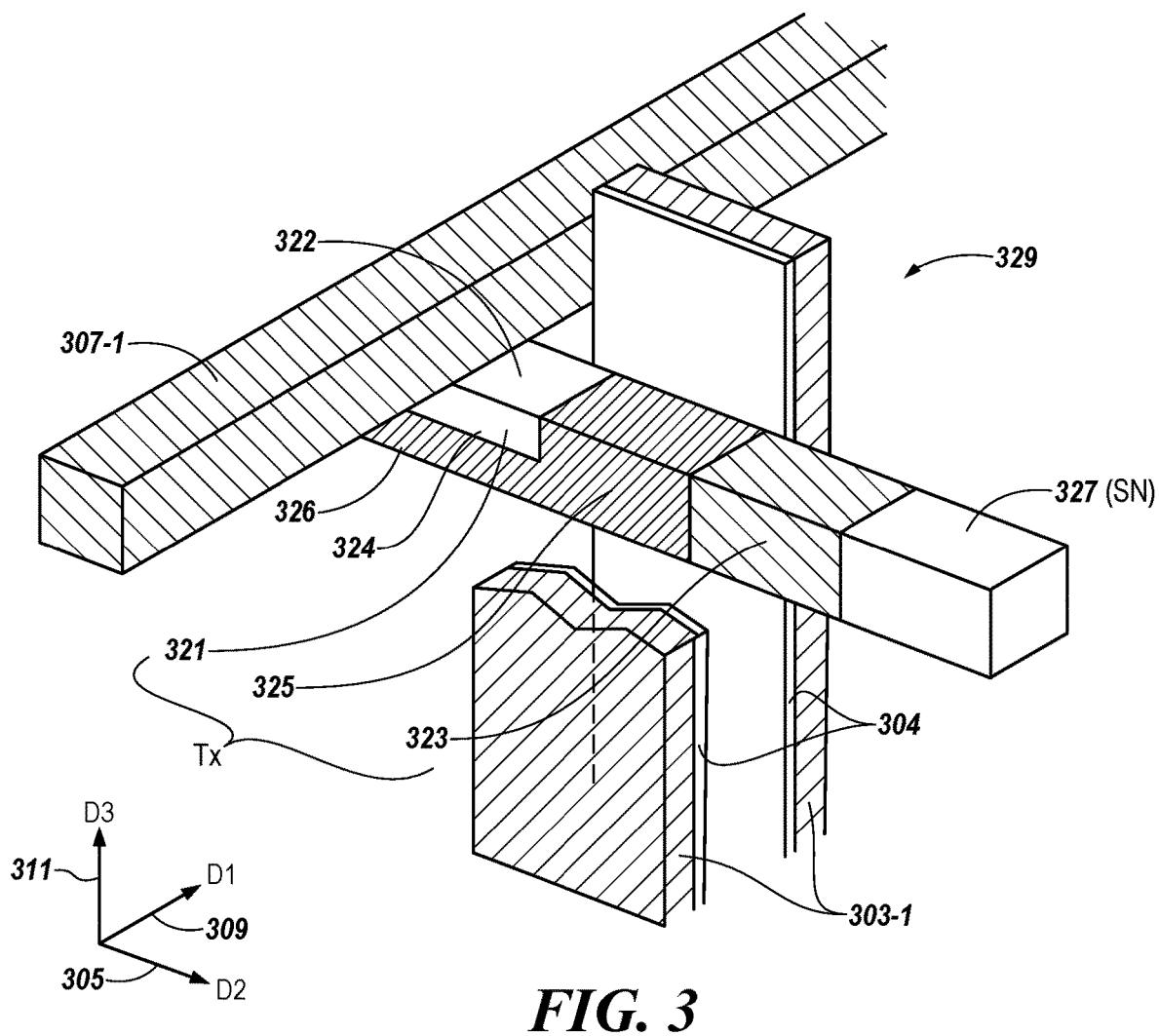
FIG. 3 is a perspective view illustrating a portion of a conductive line in accordance with embodiments of the present disclosure.

FIG. 2 illustrates a perspective view showing a 3D semiconductor memory device (e.g., a portion of a sub cell array 101-2 shown in FIG. 1 as a vertical stack of memory cells in an array) according to some embodiments of the present disclosure. FIG. 3 illustrates a perspective view showing unit cell (e.g., memory cell 110 shown in FIG. 1) of the 3D semiconductor memory device shown in FIG. 2.

As shown in FIG. 2, a substrate 200 may have formed thereon one of the plurality of sub cell arrays (e.g., 101-2) described in connection with FIG. 1. For example, the substrate 200 may be or include a silicon substrate, a germanium substrate, or a silicon-germanium substrate, etc. Embodiments, however, are not limited to these examples.

As shown in the example embodiment of FIG. 2, the substrate 200 may have fabricated thereon a vertical stack of memory cells (e.g., memory cell 110 in FIG. 1) extending in a vertical direction (e.g., third direction (D3) 111). According to some embodiments, the vertical stack of memory cells may be fabricated such that each memory cell (e.g., memory cell 110 in FIG. 1) is formed on plurality of vertical levels (e.g., a first level (L1), a second level (L2), and a third level (L3)). The repeating vertical levels, L1, L2, and L3, may be arranged (e.g., "stacked") a vertical direction (e.g., third direction (D3) 111 shown in FIG. 1) and may be separated from the substrate 200 by an insulating material 220. Each of the repeating vertical levels, L1, L2, and L3 may include a plurality of discrete components (e.g., regions) to the lateral access devices 229 (e.g., transistors) and storage nodes (e.g., capacitors) including access line 103-1, 103-2, . . . , 103-Q connections and digit line 107-1, 107-2, . . . , 107-Q connections. The plurality of discrete components to the lateral access devices 229 (e.g., transistors) may be formed in a plurality of iterations of vertically repeating layers within each level, as described in more detail below in connection with FIGS. 4A-4K and may extend horizontally in the second direction (D2) 205, analogous to second direction (D2) 105 shown in FIG. 1.

The plurality of discrete components to the lateral access devices 229 (e.g., transistors) may include a first source/drain region 221 and a second source/drain region 223 separated by a channel region 225, extending laterally in the second direction (D2) 205, and formed in a body of the access devices. In some embodiments, the channel region 225 may include silicon, germanium, silicon-germanium, and/or indium gallium zinc oxide (IGZO). In some embodiments, the first and the second source/drain regions, 221 and 223, can include an n-type dopant region formed in a p-type doped body to the access device to form an n-type conductivity transistor. In some embodiments, the first and the second source/drain regions, 221 and 223, may include a p-type dopant formed within an n-type doped body to the access device to form a p-type conductivity transistor. By way of example, and not by way of limitation, the n-type dopant may include phosphorous (P) atoms and the p-type dopant may include atoms of boron (B) formed in an oppositely doped body region of polysilicon semiconductor material. Embodiments, however, are not limited to these examples.

The storage node 227 (e.g., capacitor) may be connected to one respective end of the access device. As shown in FIG. 2, the storage node 227 (e.g., capacitor) may be connected to the second source/drain region 223 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell (e.g., memory cell 110 in FIG. 1) may similarly extend in the second direction (D2) 205, analogous to second direction (D2) 105 shown in FIG. 1.

As shown in FIG. 2 a plurality of horizontal digit lines 207-1, 207-2, . . . , 207-Q extend in the first direction (D1) 209, analogous to the first direction (D1) 109 in FIG. 1. The plurality of horizontal digit lines 207-1, 207-2, . . . , 207-Q may be analogous to the digit lines 107-1, 107-2, . . . , 107-Q shown in FIG. 1. The plurality of horizontal digit lines 207-1, 207-2, . . . , 207-Q may be arranged (e.g., "stacked") along the third direction (D3) 211. The plurality of horizontal digit lines 207-1, 207-2, . . . , 207-Q may include a conductive material. For example, the conductive material may include: one or more of a doped semiconductor (e.g., doped silicon, doped germanium, etc.), a conductive metal nitride (e.g., titanium nitride, tantalum nitride, etc.), a metal (e.g., tungsten (W), titanium (Ti), tantalum (Ta), ruthenium (Ru), cobalt (Co), molybdenum (Mo), etc.), and/or a metal-semiconductor compound (e.g., tungsten silicide, cobalt silicide, titanium silicide, etc.) Embodiments, however, are not limited to these examples.

Among each of the vertical levels, (L1) 213-1, (L2) 213-2, and (L3) 213-P, the horizontal memory cells (e.g., memory cell 110 in FIG. 1) may be spaced apart from one another horizontally in the first direction (D1) 209. However, as described in more detail below in connection with FIG. 4A, et seq., the plurality of discrete components to the lateral access devices 229 (e.g., first source/drain region 221 and second source/drain region 223 separated by a channel region 225), extending laterally in the second direction (D2) 205, and the plurality of horizontal digit lines 207-1, 207-2, . . . , 207-Q, extending laterally in the first direction (D1) 209, may be formed within different vertical layers within each level. For example, the plurality of horizontal digit lines 207-1, 207-2, . . . , 207-Q, extending in the first direction (D1) 209, may be disposed on, and in electrical contact with, top surfaces of first source/drain regions 221 and orthogonal to lateral access devices 229 (e.g., transistors) extending laterally in the second direction (D2) 205. In some embodiments, the plurality of horizontal digit lines 207-1, 207-2, . . . , 207-Q, extending in the first direction (D1) 209 are formed in a higher vertical layer, farther from the substrate 200, within a level (e.g., within level (L1)) than a layer in which the discrete components (e.g., first source/drain region 221 and second source/drain region 223 separated by a channel region 225) of the lateral access device are formed. In some embodiments, the plurality of horizontal digit lines 207-1, 207-2, . . . , 207-Q, extending in the first direction (D1) 209, may be connected to the top surfaces of the first source/drain regions 221 directly and/or through additional contacts including metal silicides.

As shown in the example embodiment of FIG. 2, the access lines, 203-1, 203-2, . . . , 203-Q, extend in a vertical direction with respect to the substrate 200 (e.g., in a third direction (D3) 211). Further, as shown in FIG. 2, the access lines, 203-1, 203-2, . . . , 203-Q, in one sub cell array (e.g., sub cell array 101-2 in FIG. 1) may be spaced apart from each other in the first direction (D1) 209. The access lines, 203-1, 203-2, . . . , 203-Q, may be provided, extending vertically relative to the substrate 200 in the third direction (D3) 211 between a pair of the lateral access devices 229 (e.g., transistors) extending laterally in the second direction (D2) 205, but adjacent to each other on a level (e.g., first level (L1)) in the first direction (D1) 209. Each of the access lines, 203-1, 203-2, . . . , 203-Q, may vertically extend, in the third direction (D3), on sidewalls of respective ones of the plurality of lateral access devices 229 (e.g., transistors) that are vertically stacked.

For example, and as shown in more detail in FIG. 3, a first one of the vertically extending access lines (e.g., 203-1) may be adjacent a sidewall of a channel region 225 to a first one of the lateral access devices 229 (e.g., transistors) in the first level (L1) 213-1, a sidewall of a channel region 225 of a first one of the lateral access devices 229 (e.g., transistors) in the second level (L2) 213-2, and a sidewall of a channel region 225 a first one of the lateral access devices 229 (e.g., transistors) in the third level (L3) 213-P, etc. Similarly, a second one of the vertically extending access lines (e.g., 203-2) may be adjacent a sidewall to a channel region 225 of a second one of the lateral access devices 229 (e.g., transistors) in the first level (L1) 213-1, spaced apart from the first one of lateral access devices 229 (e.g., transistors) in the first level (L1) 213-1 in the first direction (D1) 209. And the second one of the vertically extending access lines (e.g., 203-2) may be adjacent a sidewall of a channel region 225 of a second one of the lateral access devices 229 (e.g., transistors) in the second level (L2) 213-2 and a sidewall of a channel region 225 of a second one of the lateral access devices 229 (e.g., transistors) in the third level (L3) 213-P, etc. Embodiments are not limited to a particular number of levels.

The vertically extending access lines, 203-1, 203-2, . . . , 203-Q, may include a conductive material, such as, for example, one of a doped semiconductor material, a conductive metal nitride, metal, and/or a metal-semiconductor compound. The access lines, 203-1, 203-2, . . . , 203-Q, may correspond to word lines (WL) described in connection with FIG. 1.

As shown in the example embodiment of FIG. 2, a conductive body contact 295 may be formed extending in the first direction (D1) 209 along an end surface of the lateral access devices 229 (e.g., transistors) in each level (L1) 213-1, (L2) 213-2, and (L3) 213-P above the substrate 200. The conductive body contact 295 may be connected to a body, as shown by 336 in FIG. 3, (e.g., body region) of the lateral access devices 229 (e.g., transistors) in each memory cell (e.g., memory cell 110 in FIG. 1). The conductive body contact 295 may include a conductive material such as, for example, one of a doped semiconductor material, a conductive metal nitride, metal, and/or a metal-semiconductor compound.

Although not shown in FIG. 2, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

FIG. 3 illustrates in more detail a unit cell (e.g., memory cell 110 in FIG. 1) of the vertically stacked array of memory cells (e.g., within a sub cell array 101-2 in FIG. 1) according to some embodiments of the present disclosure. As shown in FIG. 3, the first and the second source/drain regions, 321 and 323, may be impurity doped regions to the lateral access devices 329 (e.g., transistors). The first and the second source/drain regions, 321 and 323, may be analogous to the first and the second source/drain regions 221 and 223 shown in FIG. 2. The first and the second source/drain regions may be separated by a channel region 325 formed in a body of semiconductor material (e.g., body 326) of the lateral access devices 329 (e.g., transistors). The first and the second source/drain regions, 321 and 323, may be formed from an n-type or p-type dopant doped in the body 326 (i.e., a body region). Embodiments are not so limited.

For example, for an n-type conductivity transistor construction, the body 326 of the lateral access devices 329 (e.g., transistors) may be formed of a low doped (p-) p-type semiconductor material. In some embodiments, the body 326 and the channel region 325 separating the first and the second source/drain regions, 321 and 323, may include a low doped, p-type (e.g., low dopant concentration (p-)) polysilicon material consisting of boron (B) atoms as an impurity dopant to the polycrystalline silicon. The first and the second source/drain regions, 321 and 323, may also comprise a metal and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples.

As used herein, a degenerate semiconductor material is intended to mean a semiconductor material, such as polysilicon, containing a high level of doping with significant interaction between dopants (e.g., phosphorous (P), boron (B), etc.). Non-degenerate semiconductors, by contrast, contain moderate levels of doping, where the dopant atoms are well separated from each other in the semiconductor host lattice with negligible interaction.

In this example, the first and the second source/drain regions, 321 and 323, may include a high dopant concentration, n-type conductivity impurity (e.g., high dopant (n+)) doped in the first and the second source/drain regions, 321 and 323. In some embodiments, the high dopant, n-type conductivity first and second drain regions 321 and 323 may include a high concentration of phosphorus (P) atoms deposited therein. Embodiments, however, are not limited to this example. In other embodiments, the lateral access devices 329 (e.g., transistors) may be of a p-type conductivity construction in which case the impurity (e.g., dopant) conductivity types would be reversed.

As shown in the example embodiment of FIG. 3, the first source/drain region 321 may occupy an upper portion in the body 326 of the lateral access devices 329 (e.g., transistors). For example, the first source/drain region 321 may have a bottom surface 324 within the body 326 of the lateral access device 329 which is located higher, vertically in the third direction (D3) 311, than a bottom surface of the body 326 of the laterally, horizontal access device 329. As such, the laterally, horizontal transistor 329 may have a body 326 which is below the first source/drain region 321 and is in electrical contact with the body contact (e.g., 295 shown in FIG. 2). Further, as shown in the example embodiment of FIG. 3, a digit line (e.g., 307-1) analogous to the digit lines 207-1, 207-2, . . . , 207-Q in FIGS. 2 and 107-1, 107-2, . . . , 107-Q shown in FIG. 1, may be disposed on a top surface 322 of the first source/drain region 321 and electrically coupled thereto. For instance, the digit line 307-1 can extend in a first horizontal direction (D1) 309.

As shown in the example embodiment of FIG. 3, an access line (e.g., 303-1 analogous to the access lines 203-1, 203-2, . . . , 203-Q in FIGS. 2 and 103-1, 103-2, . . . , 103-Q in FIG. 1) may be vertically extending in the third direction (D3) 311 adjacent sidewall of the channel region 325 portion of the body 326 to the lateral access devices 329 (e.g., transistors) horizontally conducting between the first and the second source/drain regions 321 and 323 along the second direction (D2) 305. A gate dielectric material 304 may be interposed between the access line 303-1 (a portion thereof forming a gate to the lateral access devices 329 (e.g., transistors) and the channel region 325.

The gate dielectric material 304 may include, for example, a high-k dielectric material, a silicon oxide material, a silicon nitride material, a silicon oxynitride material, etc., or a combination thereof. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

Figure 4:
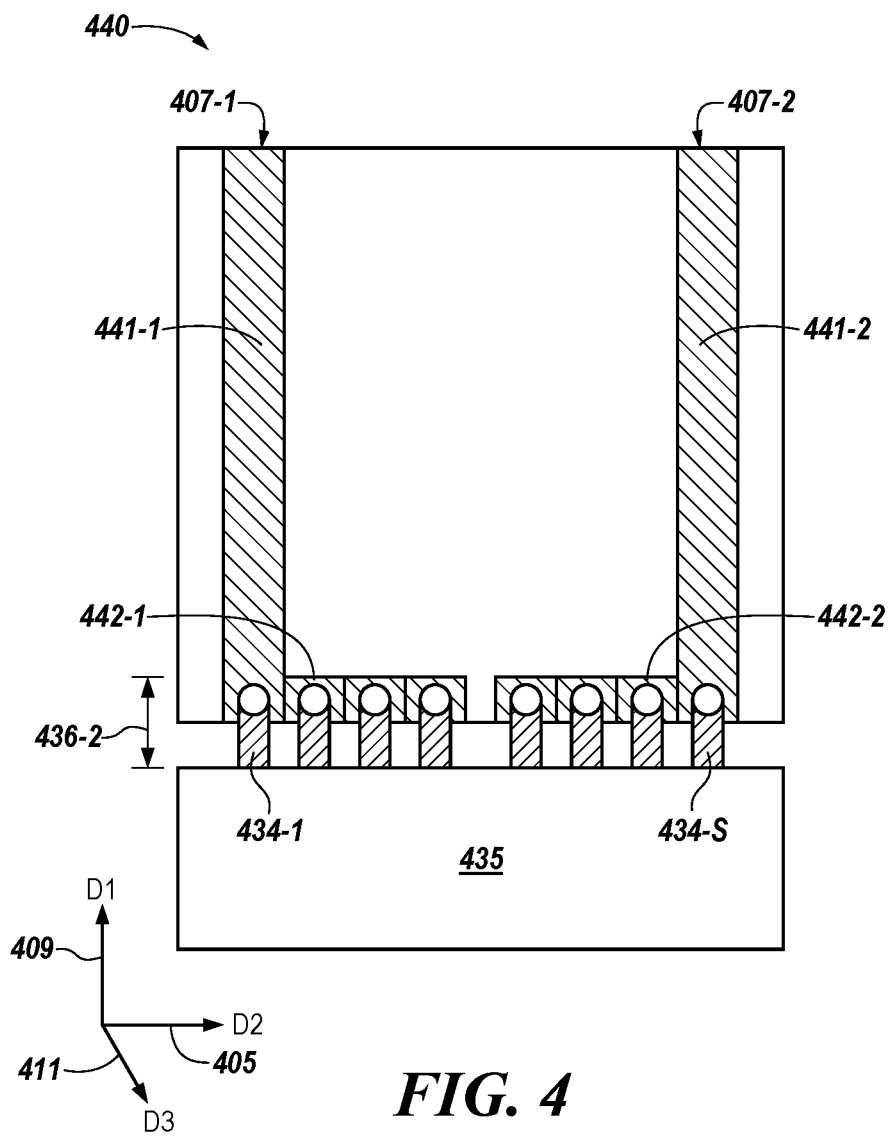
FIG. 4 is an overhead view illustrating a conventional memory device configuration.

FIG. 4 is an overhead view illustrating a conventional 3D memory device configuration. The 3D array 440 of vertically stacked memory cells may include a vertical stack of horizontal conductive lines (e.g., 407-1, 407-2). The conductive lines may be digit lines or access lines (i.e., word lines). Each conductive line 407 formed within the 3D array 440 may include a first portion 441-1, . . . , 441-2 extending in a first horizontal direction (D1) 409. Each horizontal conductive line may further include a second portion 442-1, . . . , 442-T extending in a second horizontal direction D2, at an angle to the first horizontal direction (D1) 409. In other words, the memory cell array 440 may include a number of multi-direction conductive lines 407 (also referred to as bent conductive lines).

In some embodiments, the array of vertically stacked memory cells may, for example, be electrically coupled in an open digit line architecture. The array of vertically stacked memory cells can be electrically coupled in a folded digit line architecture, in other embodiments.

For example, as shown in FIG. 4, in some embodiments, the second portion of each conductive line (e.g., 442-1, 442-2) may extend in a second horizontal direction (D2) 405 at an angle to the first portion (e.g., perpendicular to the first horizontal direction (D1) 409).

Although FIG. 4 illustrates conductive lines 407-1 and 407-2 having two portions 442-1 and 442-2, embodiments of the present disclosure are not so limited. For example, in some embodiments, each conductive line may further include a third portion extending in a third direction. The third portion may extend in direction (D1) 409. The third portion may be coupled to an end of a second portion.

As illustrated in FIG. 4, a conventional memory device may further include a number of horizontal interconnections 434-1, . . . , 434-S. In some embodiments, each horizontal interconnection 434-1, . . . , 434-S may be electrically coupled to the second portion 442-1, 442-2 of a conductive line 407-1, 407-2. In some embodiments, each of the horizontal interconnection 434-1, . . . , 434-S may be coupled to a second portion 442-1, 442-2 of a conductive line 407-1, 407-2 through a horizontal storage node. These horizontal storage nodes may include capacitor cells.

Conductive lines 407-1, 407-2 may be coupled to sense amplifier region 435 through the interconnections 434-1, . . . , 434-S. In some embodiments, the conductive lines 407-1, 407-2 may be digit lines, and the sense amplifier region 435 may include of a number of sense amplifiers. Although not illustrated herein, in some embodiments, the conductive lines 407-1, 407-2 may be access lines (i.e., word lines), which may not be coupled to a sense amplifier region 435 but may instead be coupled to one or more other circuitry components (e.g., word line drivers) via contacts.

In such a configuration, a 3D DRAM array of vertically stacked memory cells 440 (i.e., a memory cell array) may have a number of digit lines (e.g., 407-1, . . . , 407-2) (referred to collectively as conductive lines 407) formed therein. Each digit line may run in a first horizontal direction (D1) 409.

Each digit line may be coupled to one or more access devices (not shown). For example, in the embodiment illustrated in FIG. 4A, a 3D DRAM array of vertically stacked memory cells 440 has two digit lines 407 formed therein and running parallel to one another in direction (D1) 409, and each of the digit lines 407 within the array region is coupled to circuitry components such as a sense amplifier positioned within sense amplifier region 435 via interconnections 434-1, . . . , 434-S (i.e., additional horizontal interconnections).

Although not illustrated in FIG. 4 may include a plurality of vertical levels, which may also be referred to as a plurality of groups of layers. Each vertical level may include one or more layers with one or more horizontal conductive lines 407 formed therein.

In some embodiments, each second portion 442-1, . . . , 442-T of each conductive line 407 may be of a length greater than the second portion 442-1, . . . , 442-T of a conductive line 407 on a lower vertical level. Thus, if the 3D array is comprised of levels L1, L2, . . . , LN and L1 is the top level of the vertical stack, the length of the second portions of the conductive lines of L1 may be less than the length of the second portions of the conductive lines of L2, . . . , LN. For example, given that FIG. 4B is an overhead view, the conductive lines 407-1 and 407-2 illustrated in FIG. 4B may be formed on a top level L1 of the vertical 3D array 440. Thus, the conductive lines 407-1 and 407-2 may each include a second portion 442-1 and 442-2 of a length less than the second portions of each conductive line on the lower levels of the 3D array 440.

This conventional configuration of horizontal interconnections 434-1, . . . , 434-S and digit lines 407-1, . . . , 407-Q adds additional device space (illustrated at 436-1) to the memory cell array 440, which may be undesirable if spatial constraints apply. Further, the interconnections 434-1, . . . , 434-S, inherently provide an indirect and relatively long electrical path (a portion of the electrical path extending at least some distance in a D3 direction above 411 and/or extending horizontally in direction (D1) 409) between the digit lines 407 and the circuitry components such as the sense amplifier, which as detailed herein, are located a distance in the D3 411 direction below the digit lines 407. The indirect and relatively long electrical path may have a relatively high amount of parasitic signal/current loss (i.e., a relatively high amount of signal degradation).

As such, embodiments herein providing such direct vertical coupling of the digit line to the one or more circuitry contacts via vertical contact (e.g., in the absence of horizontal interconnections such as horizontal interconnections 434-1, . . . , 434-S). As detailed herein providing direct vertical coupling of the digit line via vertical contact can provide greater interconnection density, reduce a total number of components, and/or provide improved (i.e., reduced) parasitic resistance due at least in part to a shorter electrical path provided via the connection between the digit line and the one or more circuitry contacts as compared to conventional structures. For instance, embodiments of the present disclosure can provide benefits such as more density of connections between conductive lines and sense amplifiers in an interconnection area as compared to prior approaches.

Figure 5A:
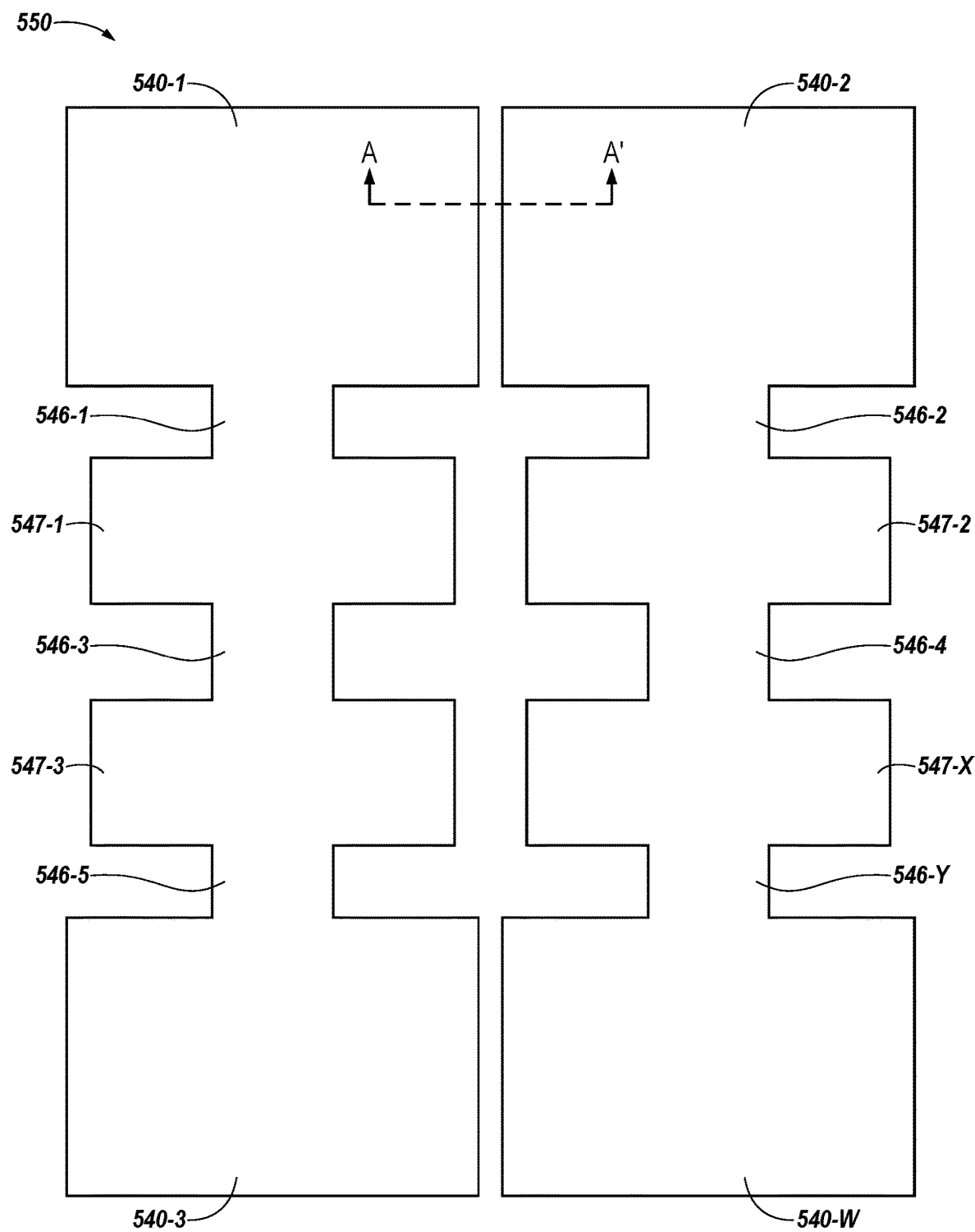
FIGS. 5A-5T illustrate an example method for forming arrays of vertically stacked memory cells in accordance with embodiments of the present disclosure.
Figure 5B:
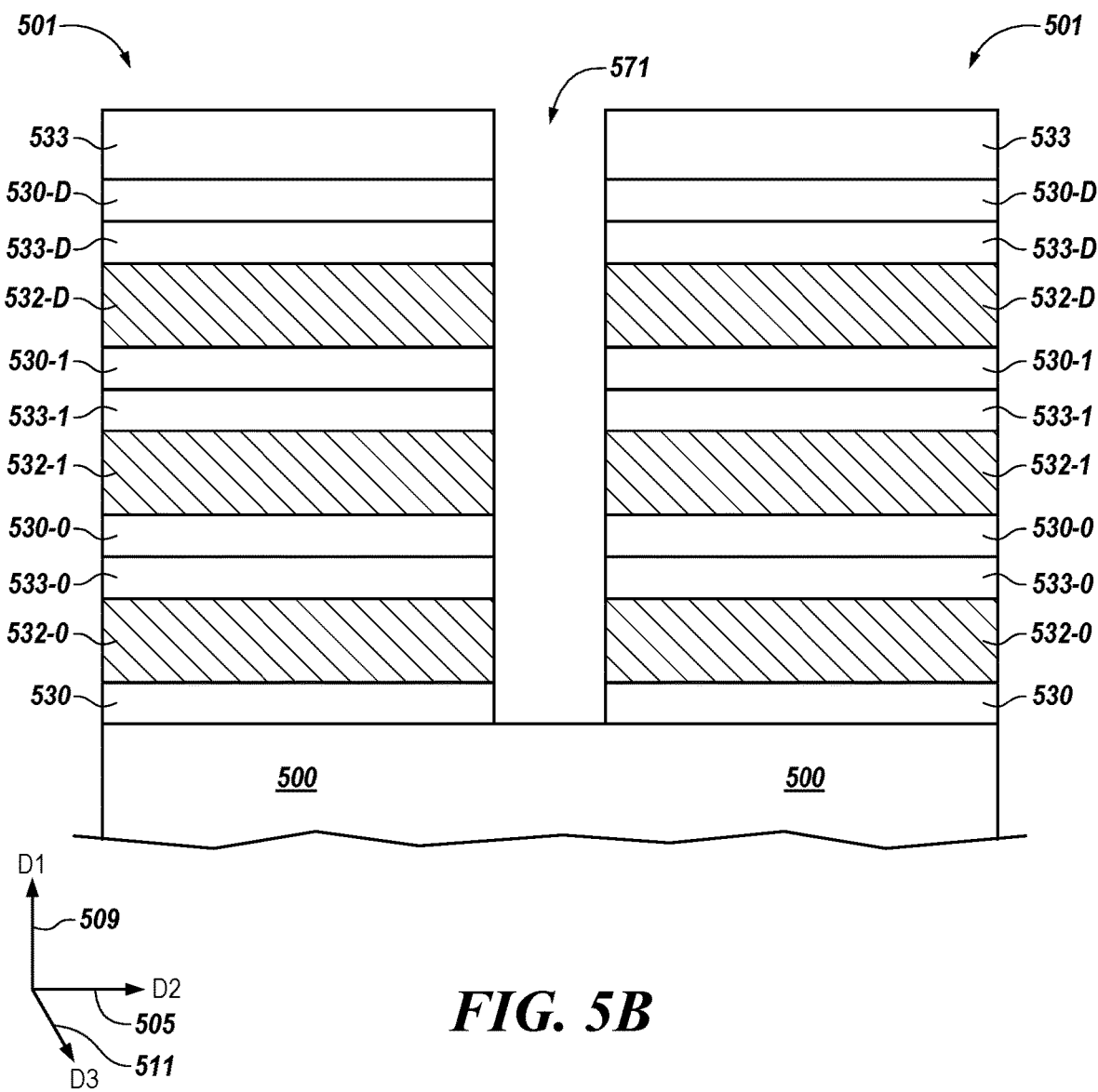
Figure 5C:
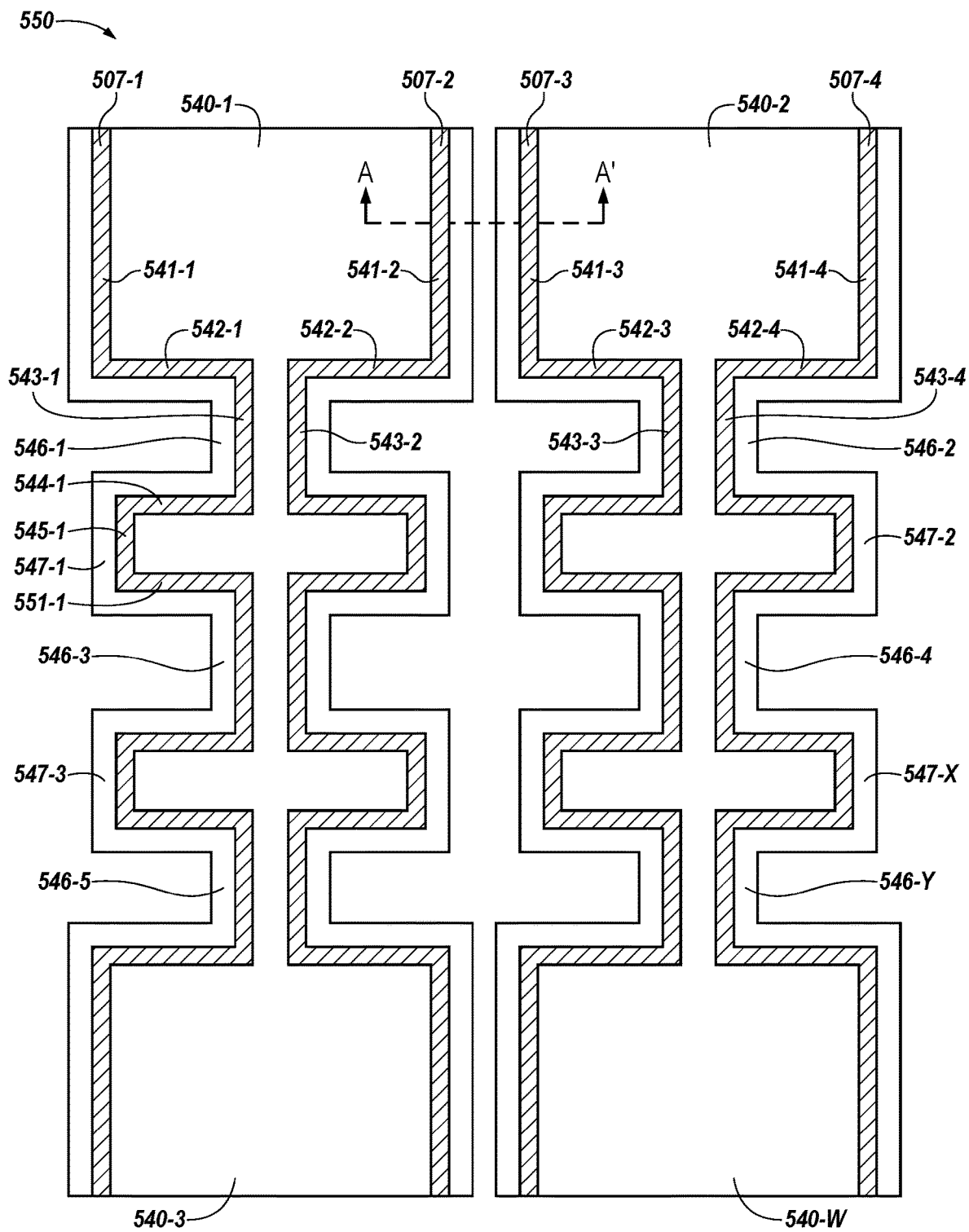
Figure 5D:
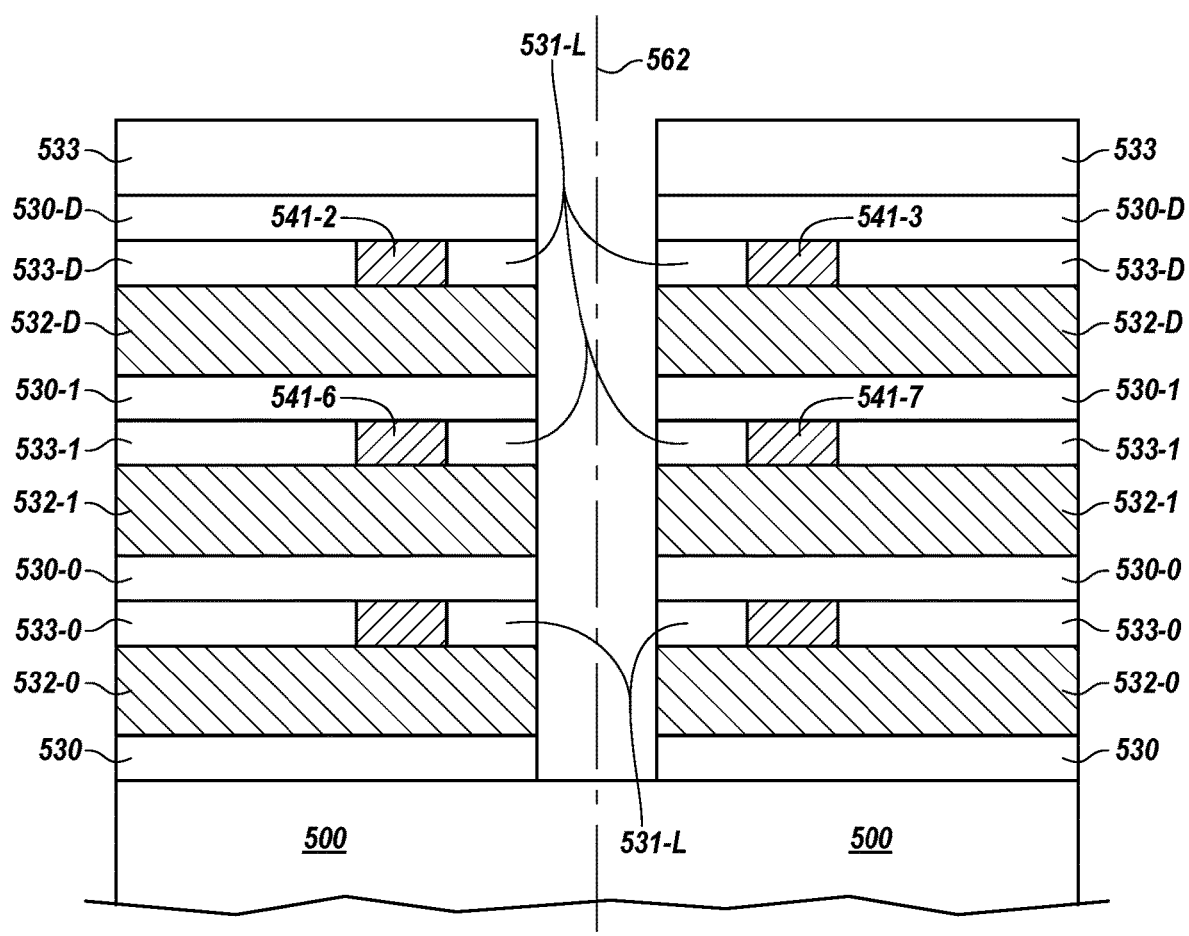
Figure 5E:
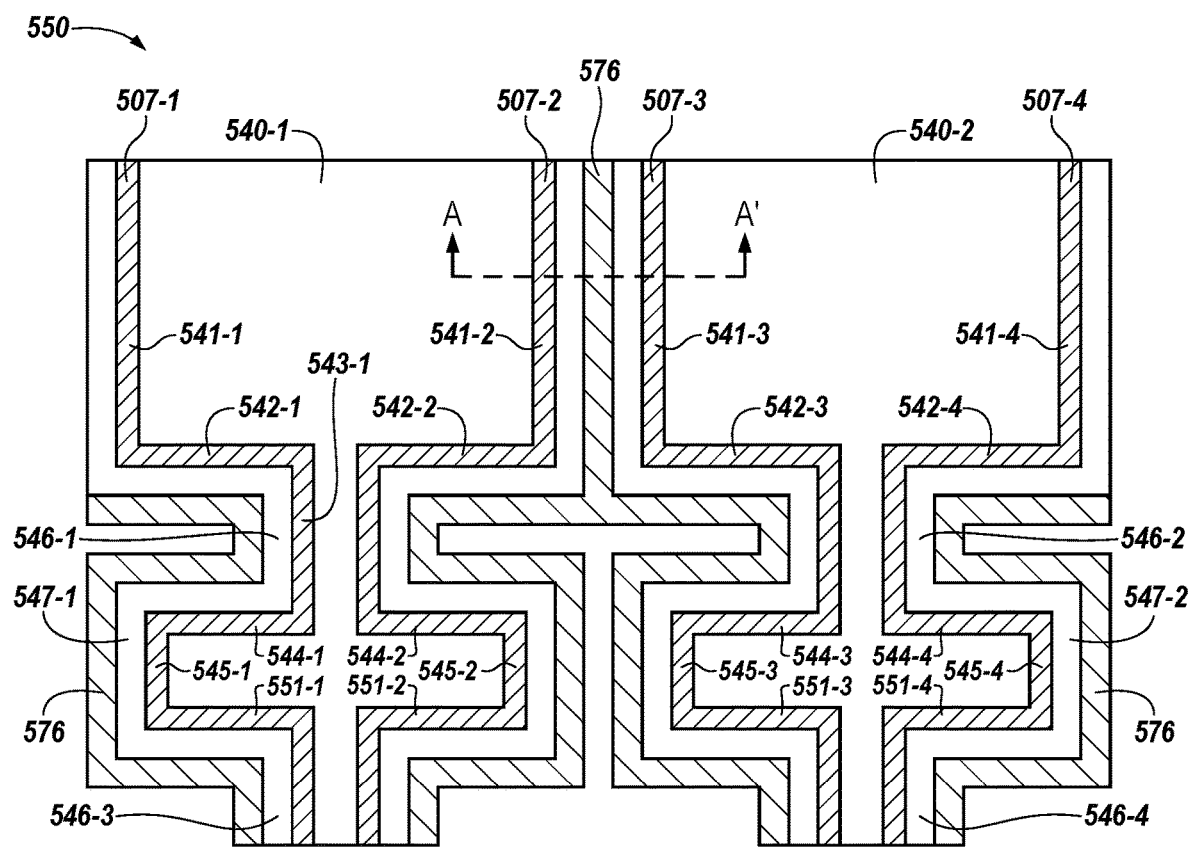
Figure 5F:
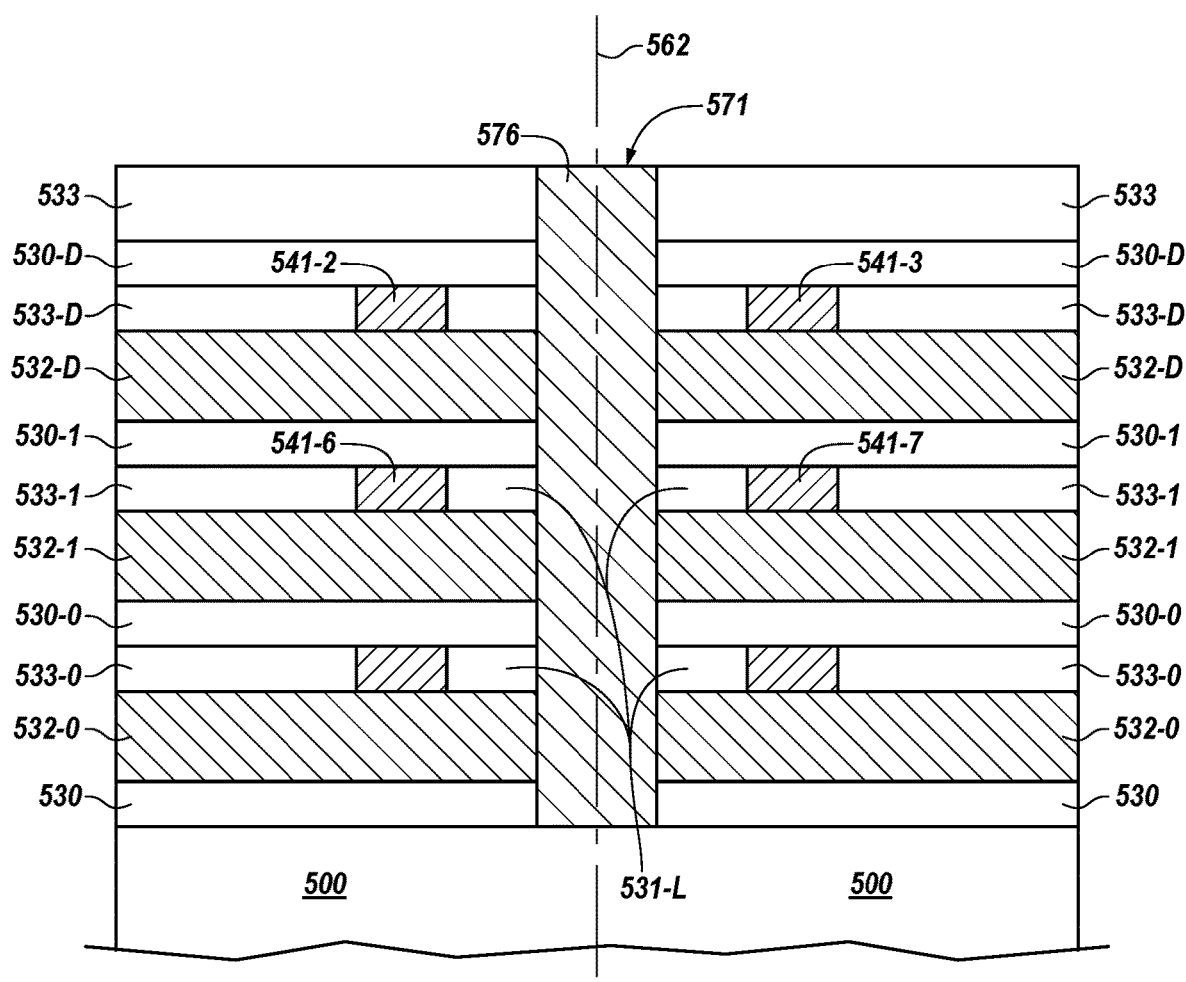
Figure 5G:
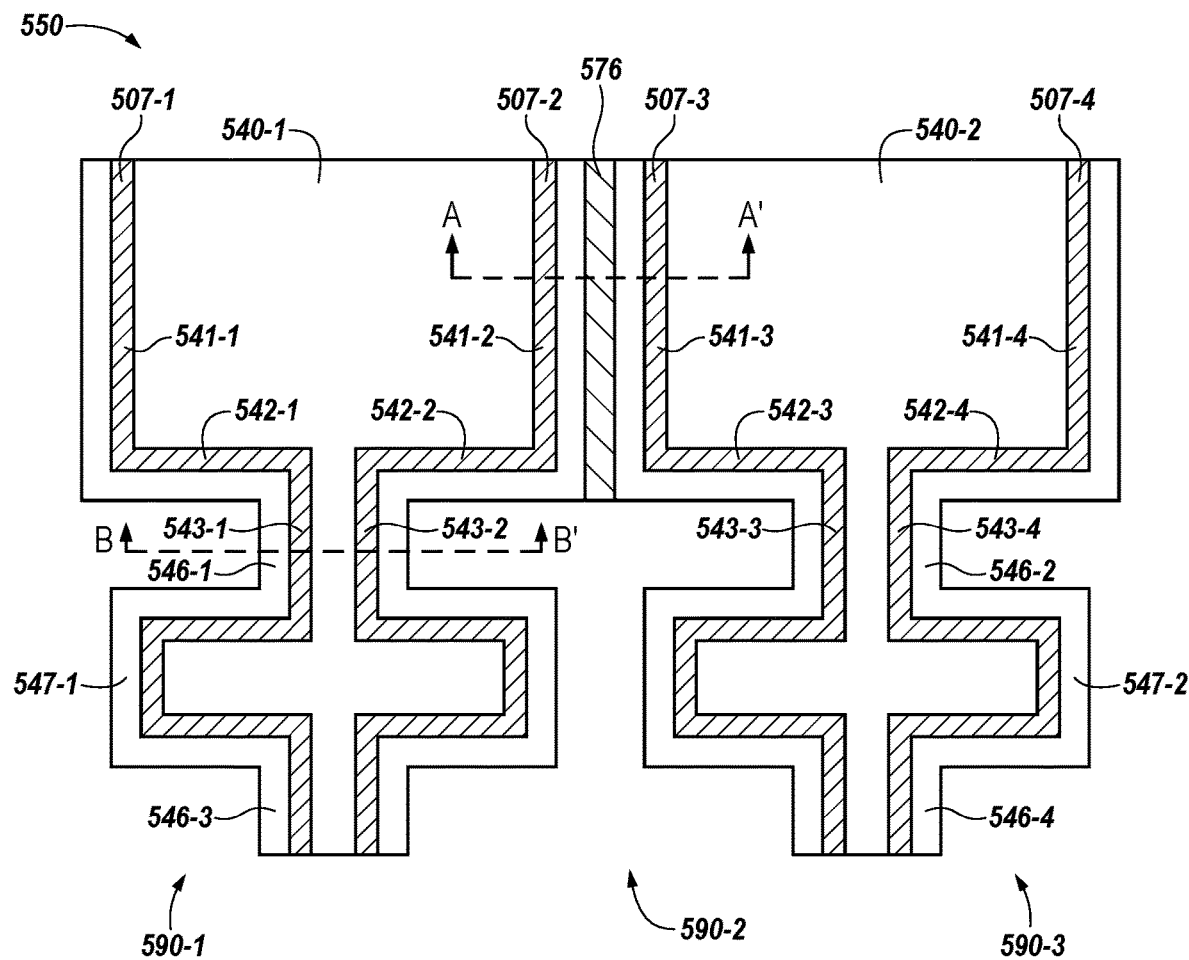
Figure 5H:
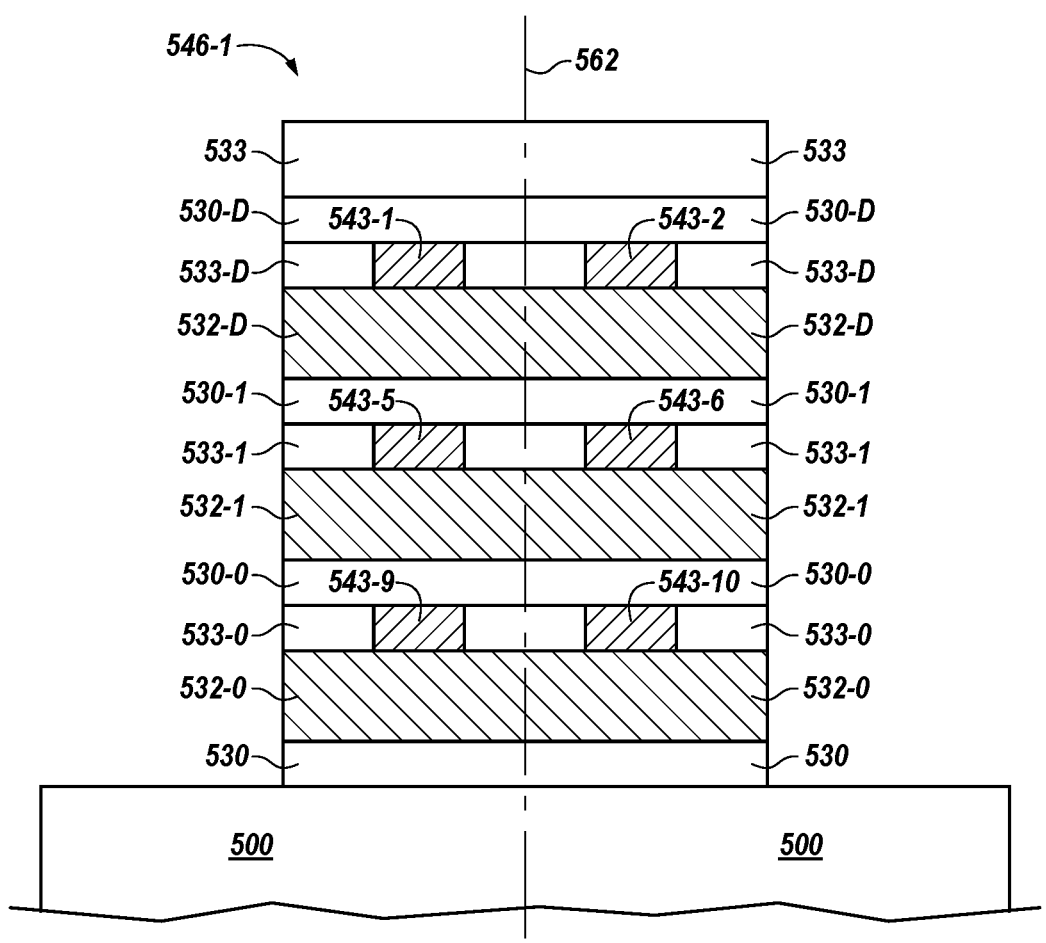
Figure 5I:
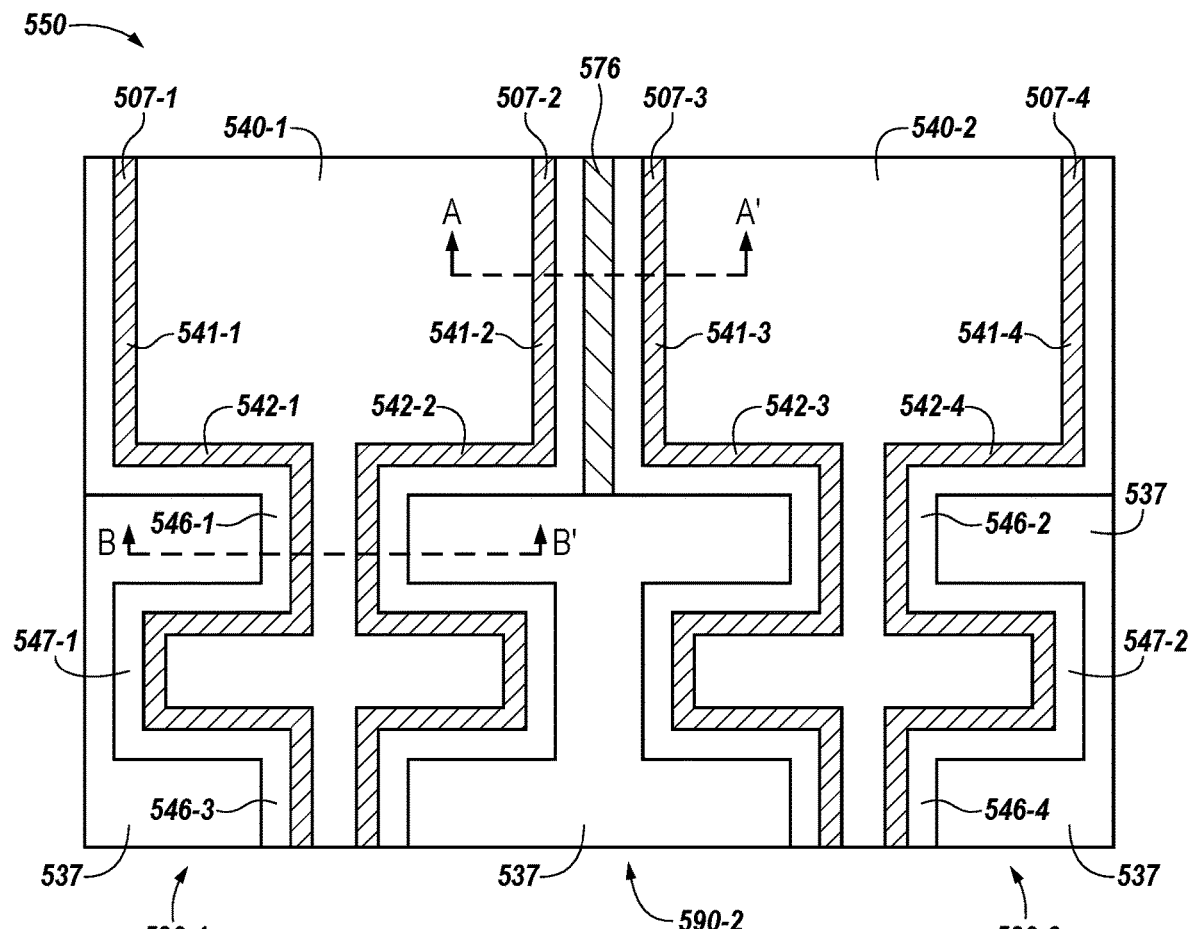
Figure 5J:
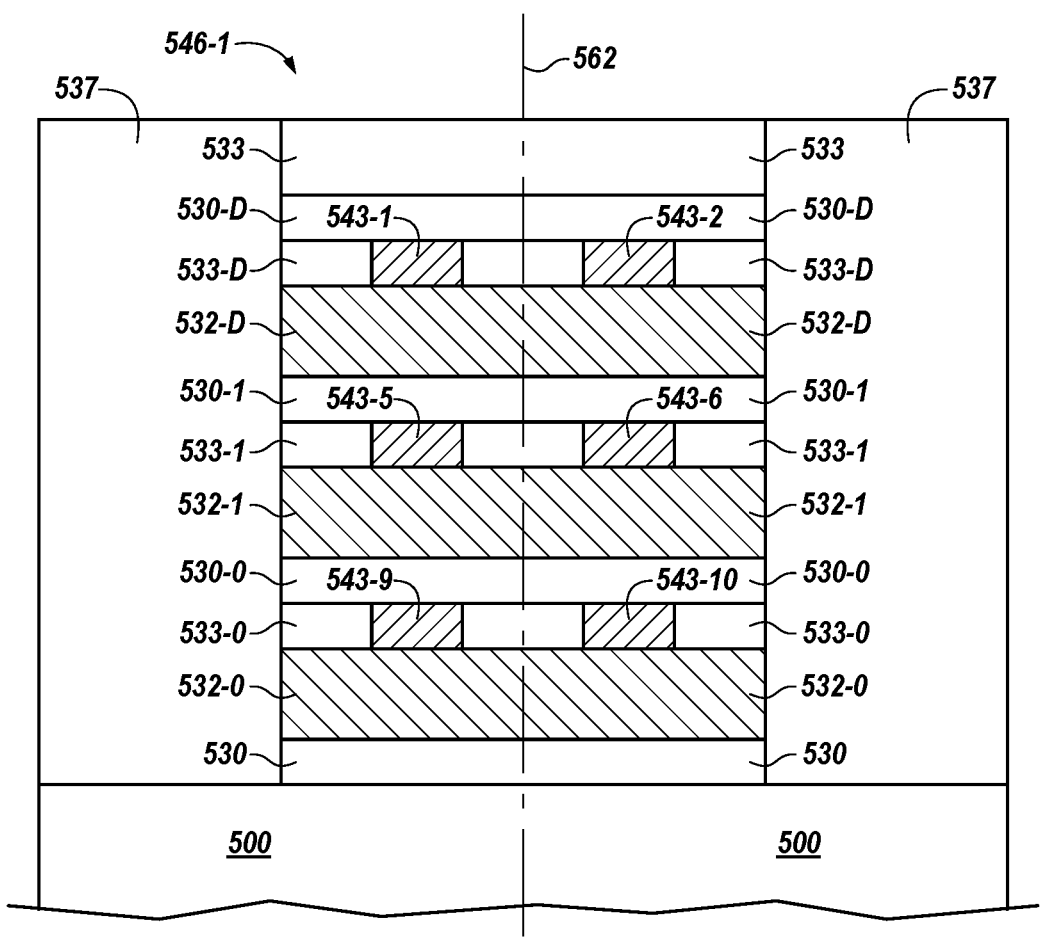
Figure 5K:
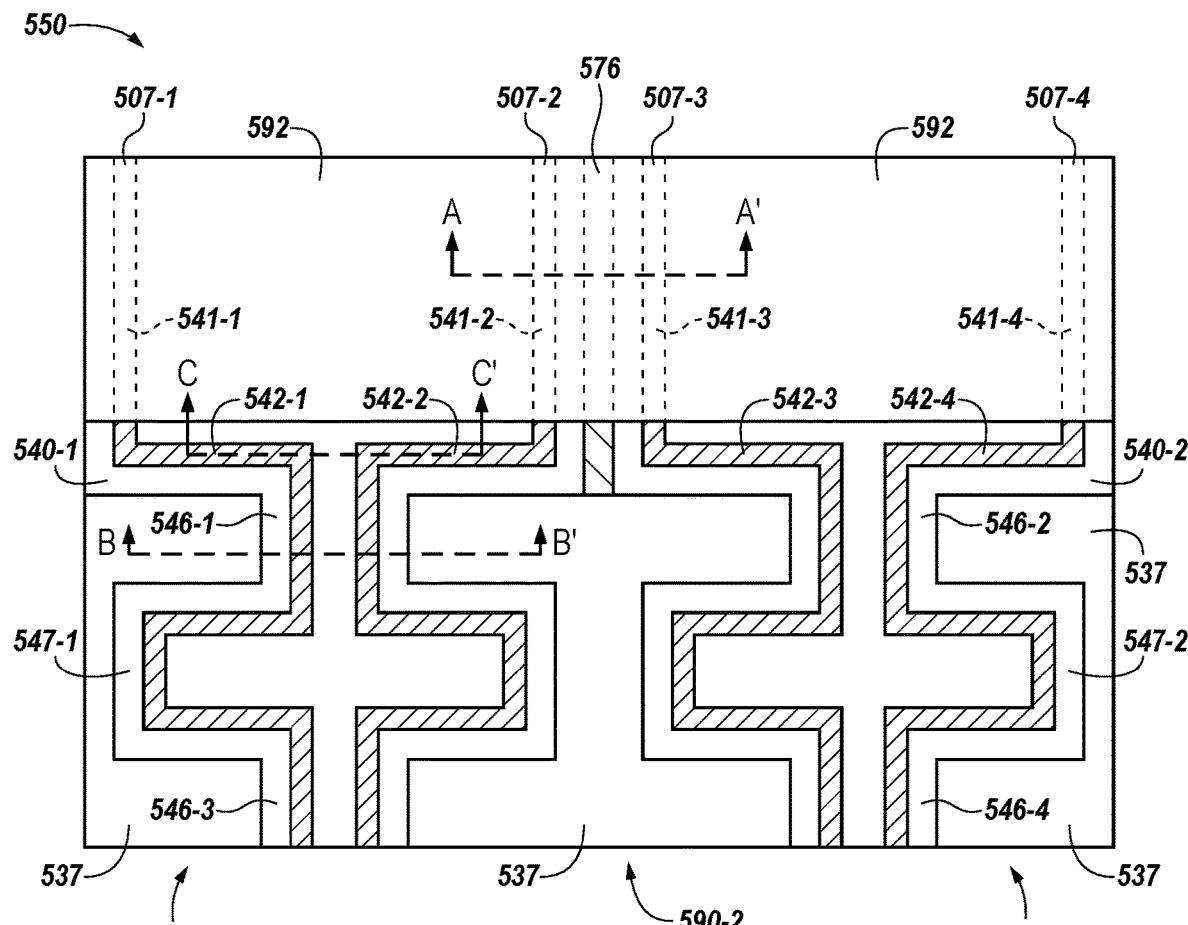
Figure 5L:
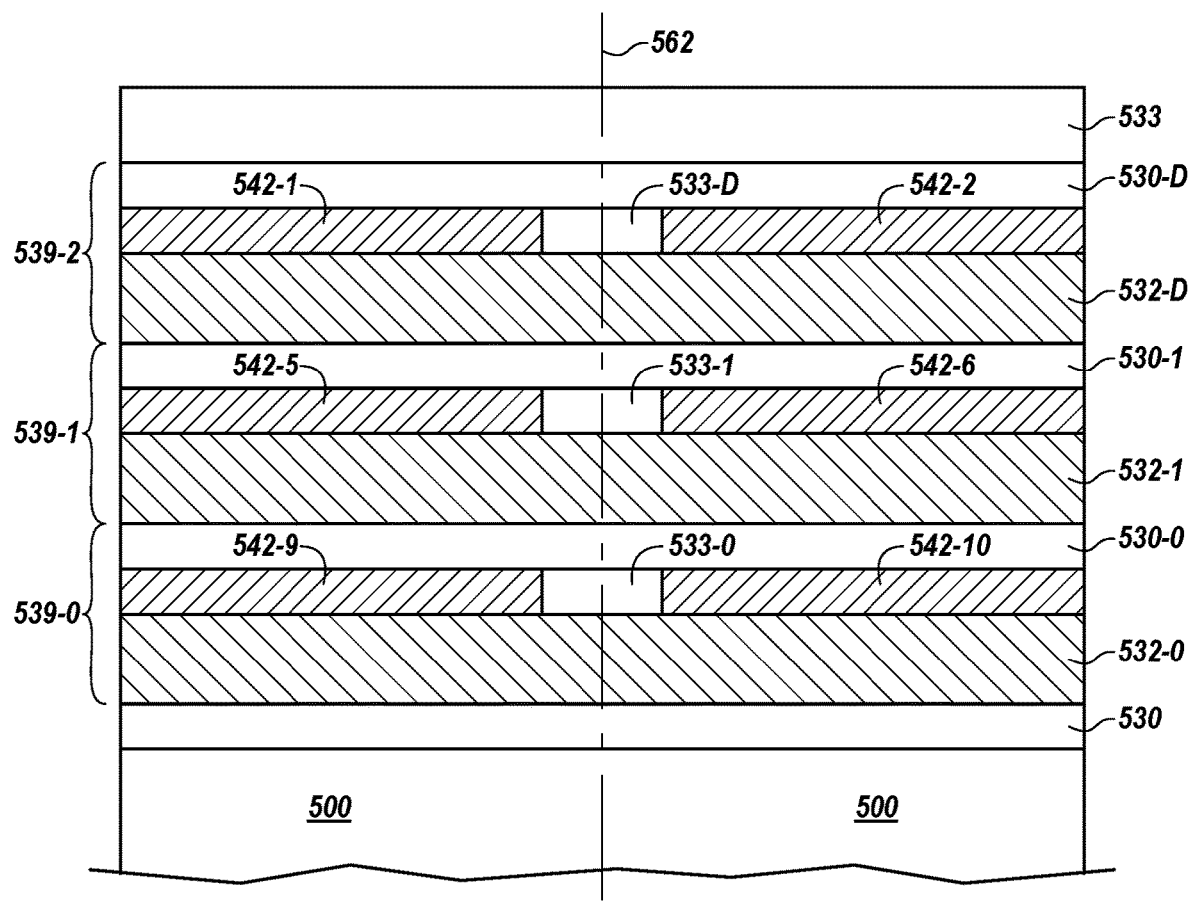
Figure 5M:
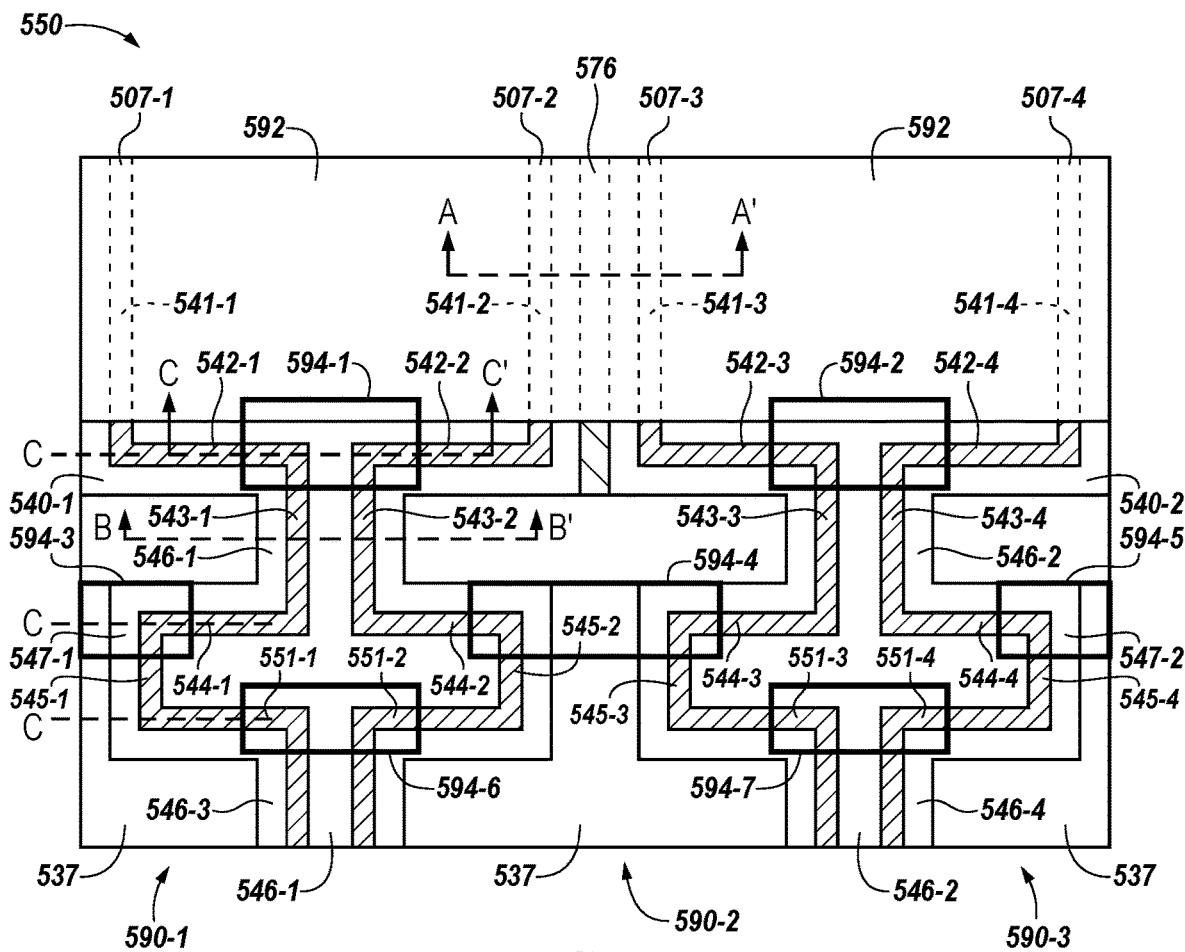
Figure 5N:
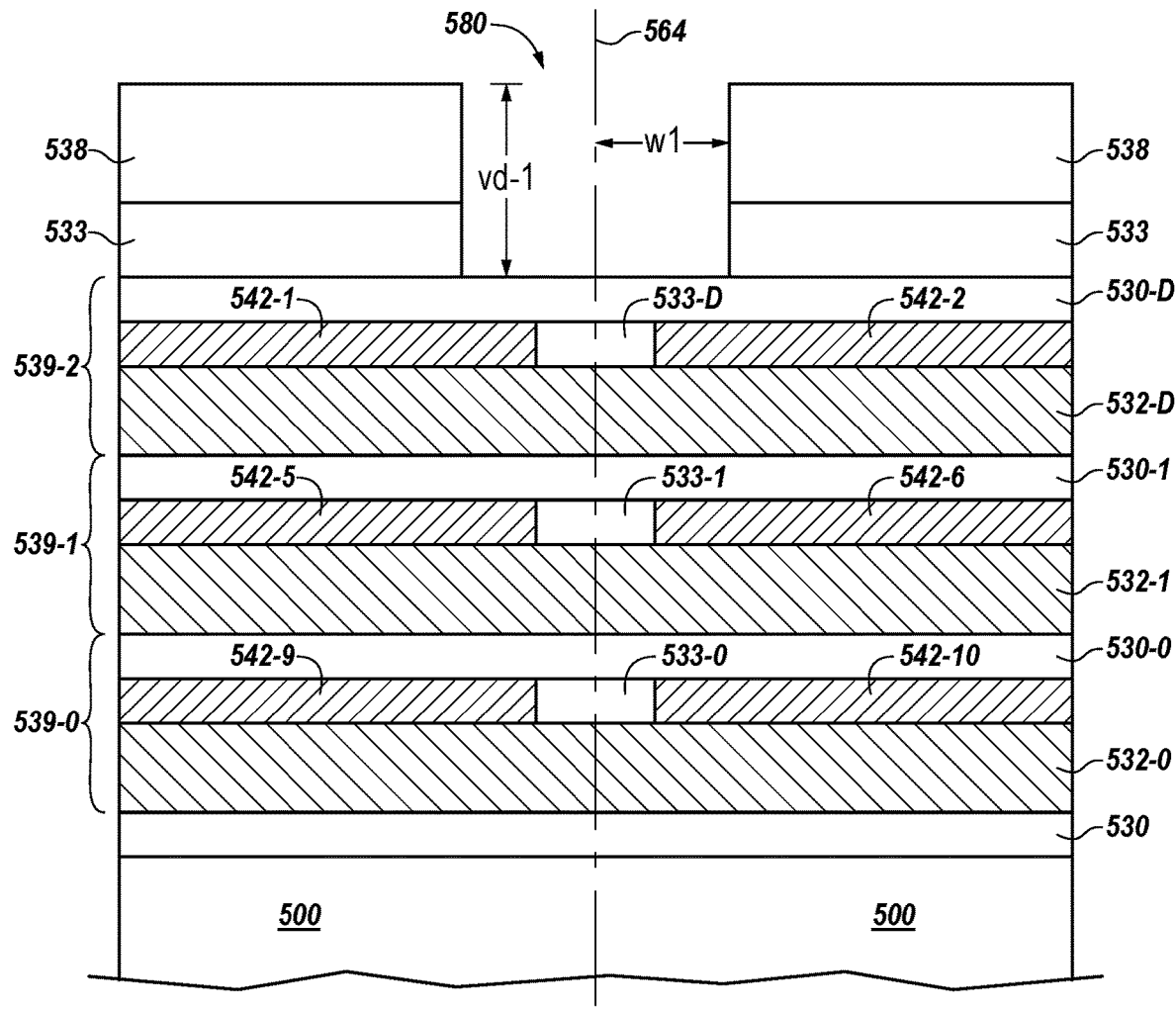
Figure 5O:
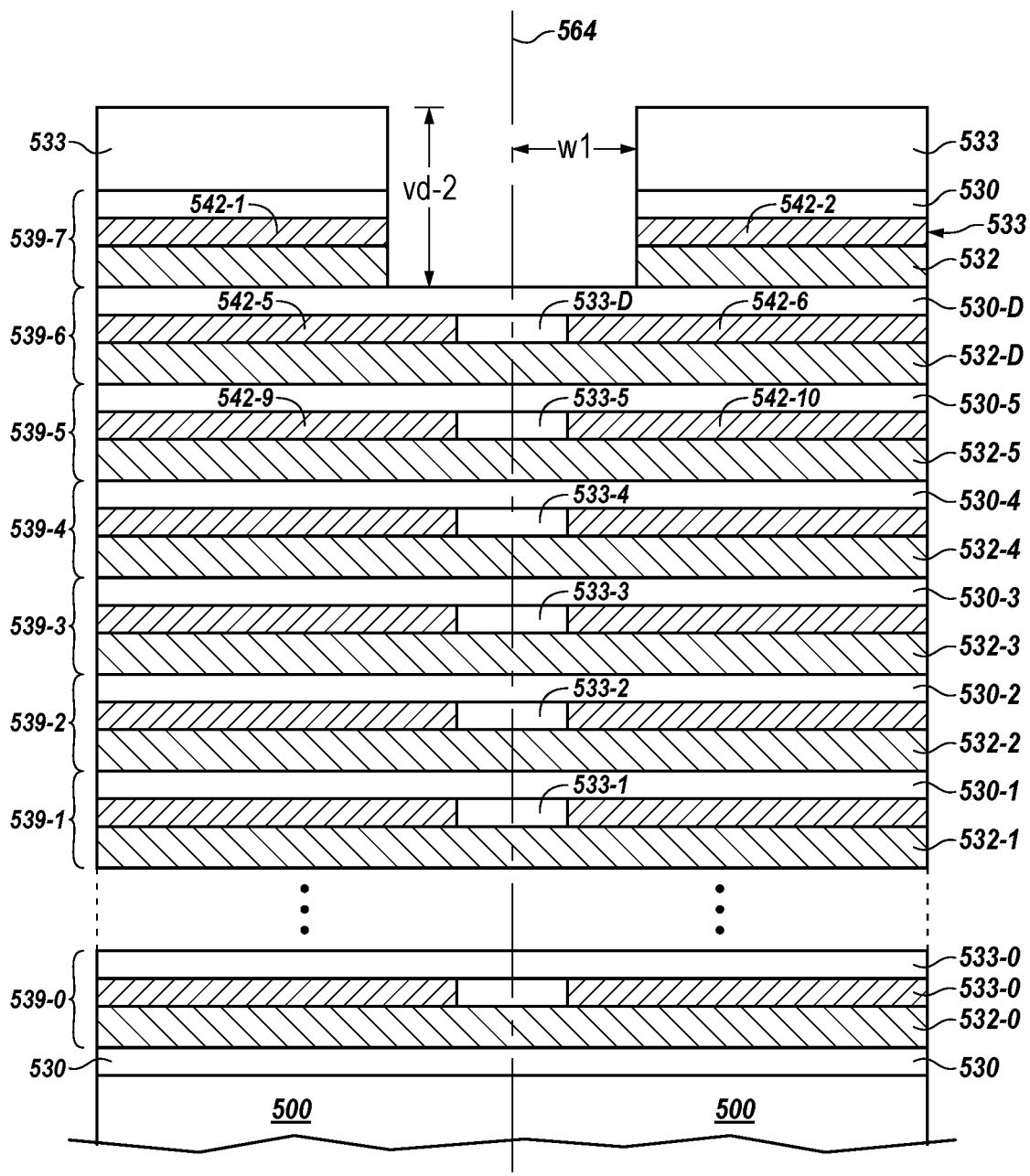
Figure 5P:
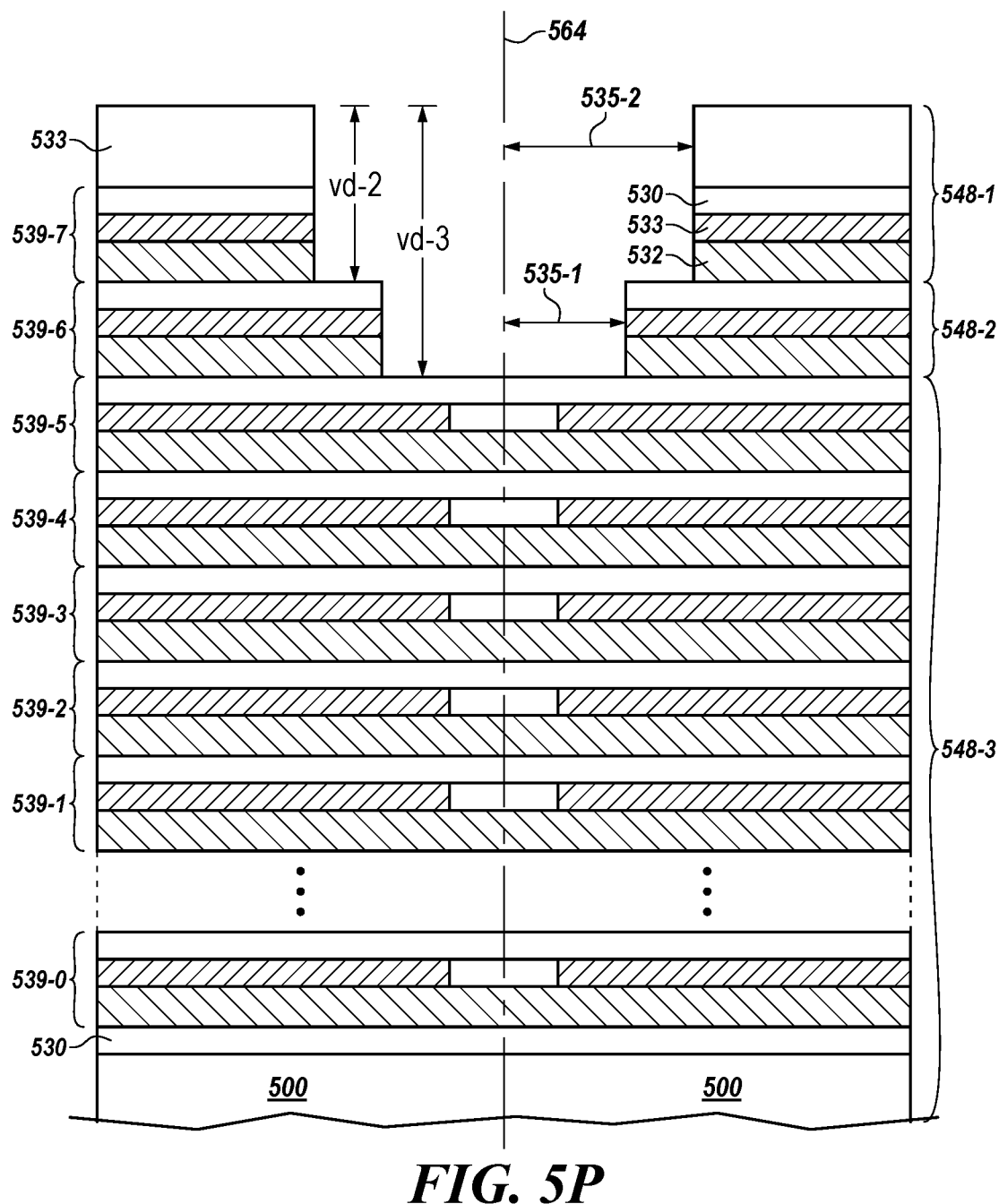
Figure 5Q:
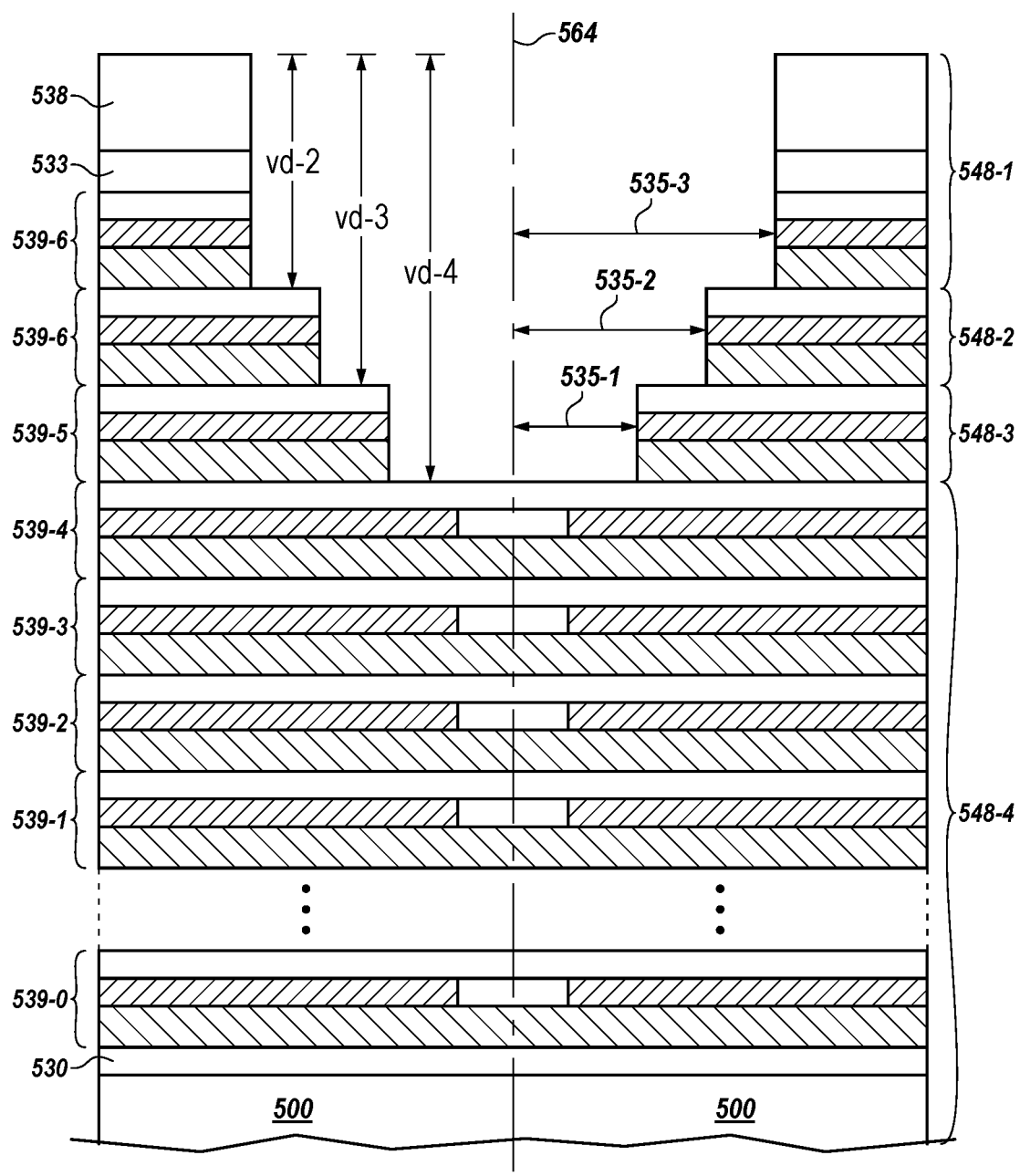
Figure 5R:
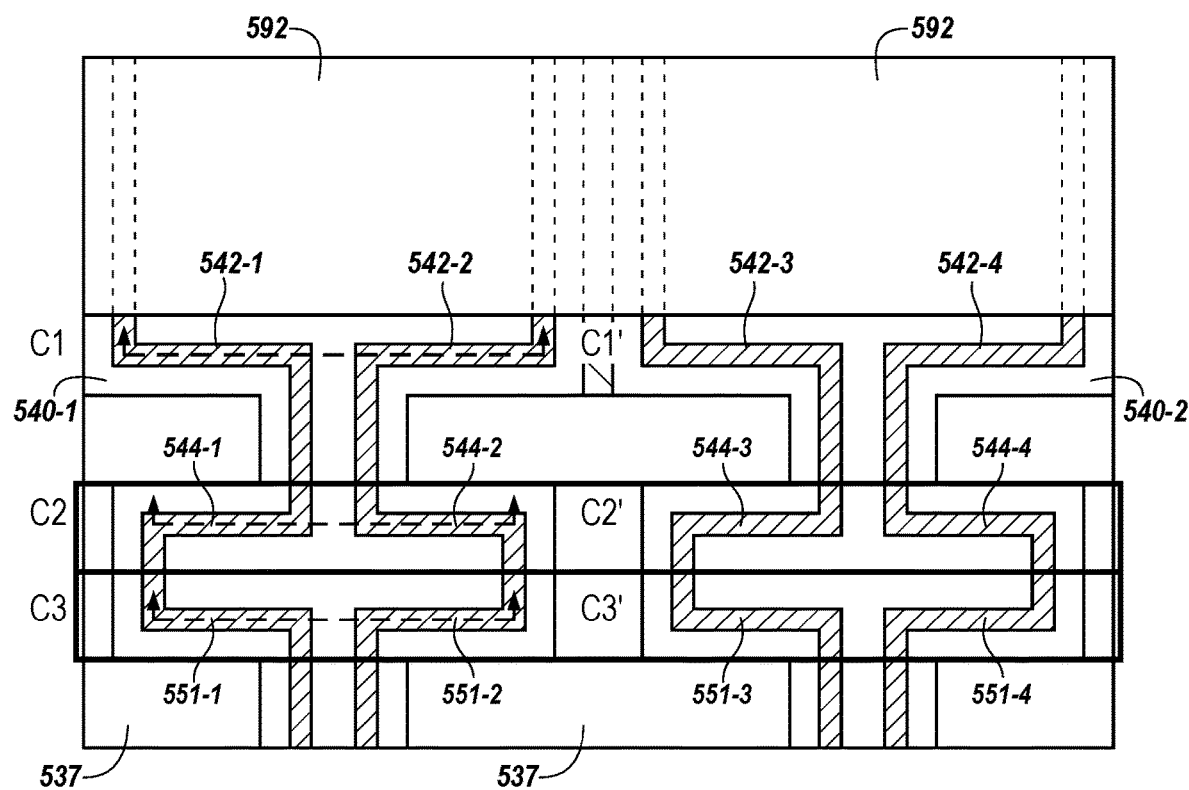
Figure 5S:
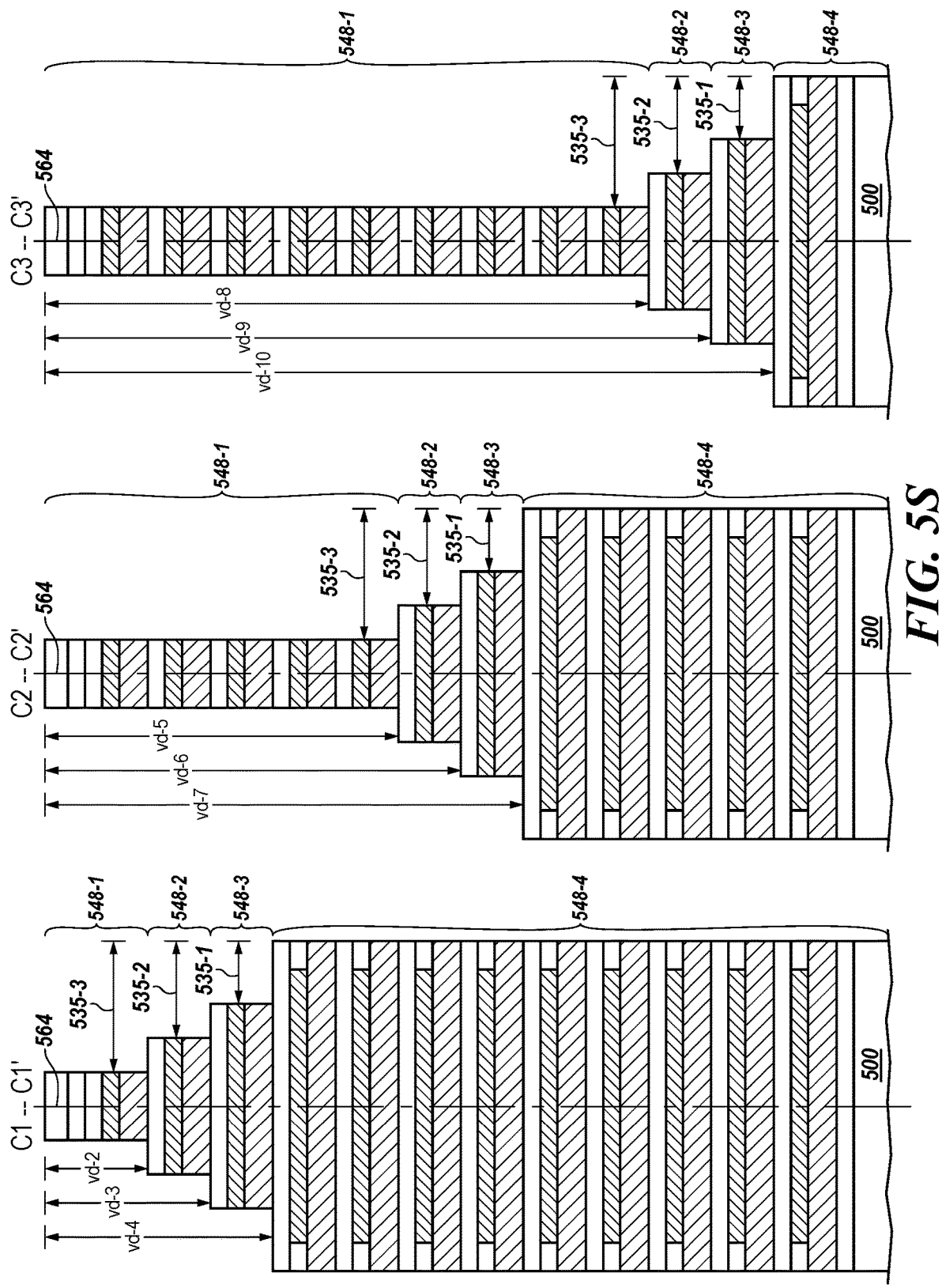
Figure 5T:
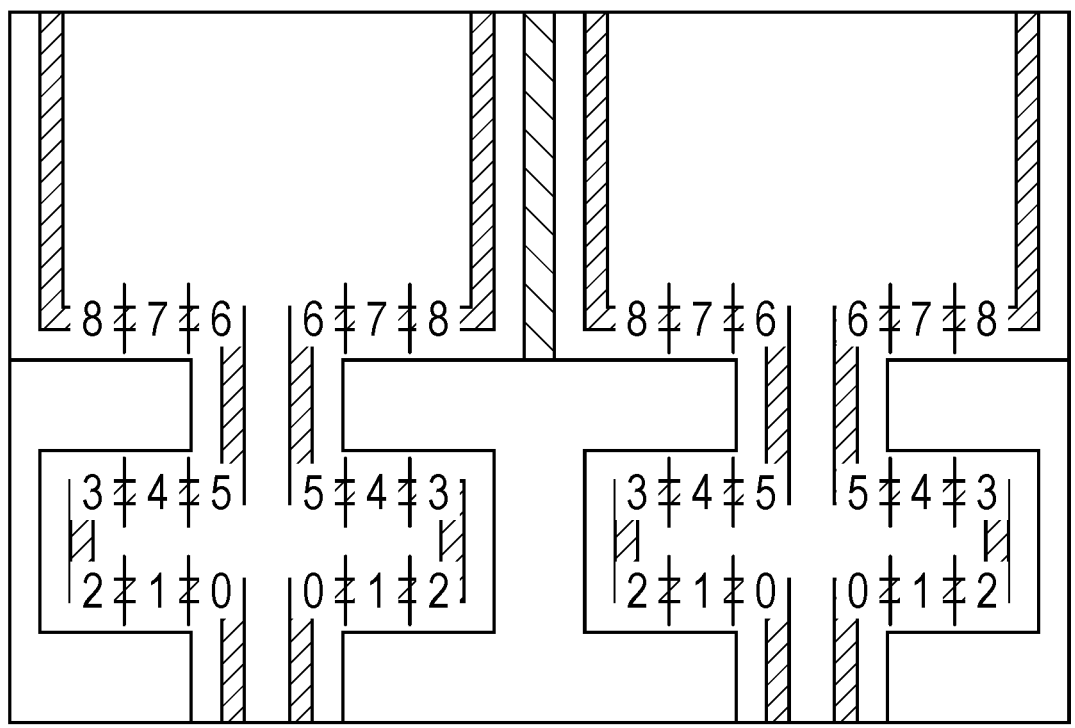

FIGS. 5A-5T illustrate an example method for forming arrays of vertically stacked memory cells in accordance with embodiments of the present disclosure. FIG. 5A is an overhead view illustrating a memory device configuration in accordance with embodiments of the present disclosure.

As illustrated, a memory device may include a number of 3D array regions 540-1, . . . , 540-W (i.e., a number of memory cell arrays). Each of these array regions 540-1, . . . , 540-W includes vertically stacked memory cells (e.g., memory cell 110 of FIG. 1). The number of memory cell array regions 540-1, . . . , 540-W may be positioned in a configuration to form an array 550. During formation, each of the memory cell array regions 540-1, . . . , 540-W may be temporarily coupled to an adjacent array region of regions 540-1, . . . , 540-W in the same column through one or more bridges 546 (e.g., 546-1, . . . , 546-Y), and one or more conductive line contact regions 547 (e.g., digit line contact regions 547-1, . . . , 547-X) as shown in FIG. 5A. This coupling will be severed later in the process, creating a single array having one or more bridges and conductive line contact areas.

FIG. 5B is a cross-sectional view along line A-A' of FIG. 5A illustrating a stage of a process for forming conductive line contact regions having multiple multi-direction conductive lines and the staircase conductive line contact structures for semiconductor devices, such as illustrated in FIGS. 1-3, and in accordance with embodiments of the present disclosure. As illustrated in FIG. 5B, the method includes forming alternating layers of a first dielectric material, 530-0, 530-1 . . . , 530-D (collectively referred to as first dielectric material 530), a semiconductor material, 532-0, 532-1, . . . , 532-D (collectively referred to as semiconductor material 532), and a second dielectric material, 533-0, 533-1, . . . , 533-D (collectively referred to as second dielectric material 533), in repeating iterations to form a vertical stack 501 on a working surface of a substrate 500, analogous to substrate 200 in FIG. 2. In some embodiments, the method may further include depositing a top layer of the first dielectric material 530 and a top layer of the second dielectric material 533 above the alternating layers. As shown in FIG. 5B, a horizontal direction is illustrated as a first horizontal direction (D3) (e.g., Y-direction in an X-Y-Z coordinate system) analogous to the first direction (D2), among first, second, and third directions, shown in FIGS. 4A-4C. A second horizontal direction (D3) is also illustrated in FIG. 5B (e.g., X-direction in an X-Y-Z coordinate system) analogous to the second horizontal direction (D3) shown in FIGS. 4A-4C. A vertical direction (D1) (e.g., Z-direction in an X-Y-Z coordinate system) is also illustrated in FIG. 5B and is analogous to the vertical direction (D1) shown in FIGS. 4A-4C.

In some embodiments, the first dielectric material may be an interlayer dielectric (ILD). By way of example, and not by way of limitation, the first dielectric material may include a silicon nitride ($Si_3N_4$) material (also referred to herein as ("SiN"). In another example, the first dielectric material may include a silicon oxy-carbide material ($SiO_xN_y$) material (also referred to herein as "SiON"), and/or combinations thereof. Embodiments are not limited to these examples.

In some embodiments, the semiconductor material may include a silicon material. The semiconductor material may be in a polycrystalline and/or amorphous state. The semiconductor material may, for example, be a low doped, p-type (p-) silicon material. The semiconductor material may, for instance, be formed by gas phase doping boron atoms (B), as an impurity dopant, at a low concentration to form the low doped, p type (p-) silicon material. In some embodiments, the low doped, p-type (p-) silicon material may be a polysilicon material. Embodiments, however, are not limited to these examples.

In some embodiments, the second dielectric material may be an interlayer dielectric (ILD). By way of example, and not by way of limitation, the second dielectric material may include a nitride material. The nitride material may be a silicon nitride ($Si_xN_4$) material (also referred to herein as ("SiN").

In another example, the second dielectric material, 533-0, 533-1, . . . , 533-D, may include a silicon oxy-carbide (SiOC) material. In another example, the second dielectric material may include silicon oxy-nitride (SiON), and/or combinations thereof. Embodiments are not limited to these examples. However, according to some embodiments, the second dielectric material can be purposefully chosen to be different in material or composition than the first dielectric material, such that a selective etch process may be performed on one of the first and second dielectric layers, selective to the other one of the first and second dielectric layers, (e.g., the second SiN dielectric material may be selectively etched relative to the semiconductor material.

The repeating iterations of alternating first dielectric material, 530-0, 530-1, . . . , 530-D layers, semiconductor material, 532-0, 532-1, . . . , 532-D layers, and second dielectric material, 533-0, 533-1, . . . , 533-D layers may be deposited according to a semiconductor fabrication process such as chemical vapor deposition (CVD) in a semiconductor fabrication apparatus. Embodiments, however, are not limited to this example, and other suitable fabrication techniques may be used to deposit the alternating layers of a first dielectric material, a semiconductor material, and a second dielectric material, in repeating iterations to form the vertical stack 501.

In the example of FIG. 5B, three levels of the repeating iterations are shown. For example, the stack may include: a first dielectric material 530-1, a semiconductor material 532-1, a second dielectric material 533-1, a third dielectric material 530-2, a second semiconductor material 532-2, a fourth dielectric material 533-2, a fifth dielectric material 530-3, a third semiconductor material 532-3, and a sixth dielectric material 533-3. As such, a stack may include: a first oxide material 530-1, a first semiconductor material 532-1, a first nitride material 533-1, a second oxide material 530-2, a second semiconductor material 532-2, a second nitride material 533-2, a third oxide material 530-D, a third semiconductor material 532-D, and a third nitride material 533-D in further repeating iterations. Embodiments, however, are not limited to this example, and more or fewer repeating iterations may be included.

It should be noted by the reader that, although not illustrated in FIG. 5A or FIG. 5B, a number of trenches may be formed between rows of interconnections of the memory cell array. The number of trenches may be configured such that conductive lines may be formed therein. Conductive lines formed in these trenches may be referred to as "undercut" or "buried" conductive lines.

FIG. 5C is an overhead view of another stage of a method for forming arrays of vertically stacked memory cells with horizontal digit lines and vertical access lines. As shown in FIG. 5C, conductive lines 507-1, . . . , 507-4 may be formed within the second dielectric (e.g., 533-0, 533-1, . . . , 533-D, in FIG. 5B). The conductive lines in the present disclosure include portions (e.g., 541-1, 542-1, 543-1, 544-1, 545-1, 551-1 and 541-2, 542-2, 543-2, 544-2, 545-2, 551-2) that are at angles to each other, such as when they progress through the array regions 540-1, . . . , 540-W, bridges 546-1, . . . , 546-Y, and conductive line contact regions 547-1, . . . , 547-X, as shown in FIG. 5C. These conductive lines 507-1, . . . , 507-4 may, for example, be aligned with the edge of a perimeter of the array regions, bridges, and/or conductive line contact regions (i.e., running generally parallel to an edge of the array region 540, bridge 546, or conductive line contact region 547, as shown). In some embodiments, the conductive lines may be in an undercut or buried formation.

FIG. 5D is a cross-sectional view, along line A-A' of FIG. 5C, illustrating a stage of a method for forming conductive line contact regions having multiple multi-direction conductive lines and the staircase conductive line contact structures for semiconductor devices, such as illustrated in FIGS. 1-3, and in accordance with embodiments of the present disclosure.

In some embodiments, conductive lines may be formed within the one or more layers of the second dielectric material 533-0, 533-1, . . . , 533-D of the stack. This may be achieved through a conductive line formation process including, for example, selectively removing the second dielectric material 533-0, 533-1, . . . , 533-D (e.g., to form a first horizontal opening by removing the second dielectric material to a first distance back from a reference line 562 (e.g., a center line in vertical opening between memory cell stacks 501).

The conductive line formation process may further include depositing a conductive material into the vertical opening. In some embodiments, this may include conformally depositing the conductive material into a portion of the vertical opening (e.g., using a chemical vapor deposition (CVD) process) such that the conductive material may also be deposited into the first horizontal opening. In some embodiments, the conductive material may include a titanium nitride (TiN) material. The conductive material may form a horizontally (e.g., laterally) oriented digit line.

The conductive material may then be recessed back in the horizontal opening (e.g., etched away from the vertical opening using reactive ion etching or other suitable techniques). In some examples, the conductive material may be removed back in the horizontal opening a second distance from the vertical opening, to form the digit line. The conductive material may be selectively etched, leaving the dielectric material 530, a portion of the conductive material, and the semiconductor material 532 intact. The conductive material may be etched to define the desired conductive line width. In some embodiments, the conductive material may be etched using an atomic layer etching (ALE) process. In some embodiments, the conductive material may be etched using an isotropic etch process.

As such, the conductive material may be selectively removed a second distance back from the vertical opening, forming a smaller horizontal opening between the first dielectric 530-0, . . . , 530-D and semiconductor 532-0, . . . , 532-D layers. A third dielectric 531-L may then be deposited into each of the horizontal openings laterally adjacent to the conductive material. In some embodiments, the third dielectric material 531-L may be identical or similar to the second dielectric material 533. For example, in some embodiments, the second dielectric material and third dielectric material may each include a nitride material.

The third dielectric material 531-L may be recessed back to a second distance from the reference line 562 to remove it from the first vertical opening and maintain the first vertical opening to allow for deposition of a conductive material to form a direct, electrical contact between such conductive material deposited within the vertical opening and the low doped semiconductor material 532-0, . . . , 532-D (e.g., body region contact) of the horizontal interconnection (e.g., access device) (not pictured in FIG. 5D) within the memory cell array region 540. In some embodiments, the third dielectric material 531-L may be removed away from the vertical opening to expose the sidewalls of the first dielectric material 530-0, . . . , 530-D, the third dielectric material 531-L, and the semiconductor material 532-0, . . . , 532-D.

FIG. 5E is an overhead view of another stage of a method for forming conductive line contact regions having multiple multi-direction conductive lines and the staircase conductive line contact structures for semiconductor devices, in accordance with embodiments of the present disclosure. For simplicity, FIG. 5E illustrates the top half of the memory cell structure (e.g., shown in FIG. 5C), however, the description of the method described with respect to FIG. 5E can be applied to those elements in the bottom half of the memory cell structure as well.

Such a method may include depositing a conductive material 576 (e.g., polysilicon) over, around, or between the one or more memory cell regions 540-1, . . . , 540-W, bridges 546-1, . . . , 546-Y, and digit line contact regions 547, . . . , 547-X, for example, for body bias control during this part of the formation process. The conductive material 576 may include, for example, a conductive polymer material. In some embodiments, the conductive material 576 may form a doped body contact to the number of interconnections described in connection with FIG. 4B. The conductive material 576 can also be etched back as appropriate.

Although FIG. 5E only illustrates two memory cell regions 540-1 and 540-2, embodiments of the present disclosure are not so limited. For example, a conductive material 576 may be deposited between or around a group of memory cell array regions of an array (e.g., four cell array 550 illustrated in FIGS. 5A and 5C), among other arrangements of cell arrays.

FIG. 5F is a cross-sectional view of line A-A' in FIG. 5E, which is analogous to line A-A' in FIG. 5C and line A-A' in FIG. 5A. As shown in FIG. 5F, the vertical opening 571 between the memory cell array regions (e.g., 540-1 and 540-2 in FIG. 5E) may be filled with the conductive material 576 as a result of the process described in connection with FIG. 5E.

FIG. 5G is an overhead view of another stage of a method for forming conductive line contact regions having multiple multi-direction conductive lines and the staircase conductive line contact structures for semiconductor devices, in accordance with embodiments of the present disclosure. As shown in FIG. 5G, the conductive material 576 may be partially removed from regions 590 (e.g., 590-1, . . . , 590-3). Although not shown in FIG. 5G, a mask (e.g., a photoresist layer) may be deposited over regions 590 before the conductive material 576 is removed.

FIG. 5H is a cross-sectional view along line B-B' of FIG. 5G after the processes described in connection with FIG. 5G has been performed. FIG. 5H illustrates portions 543-1 and 543-2 of conductive lines 507-1 and 507-2 of FIG. 5G already formed at this stage. However, embodiments of the present disclosure are not so limited. For example, in some embodiments, the areas of conductive lines illustrated in FIG. 5H may include empty trenches, and those trenches may be filled with a conductive material at a later stage to form conductive lines. FIG. 5H also identifies conductive line portions 543-5 and 543-6 and portions 543-9 and 543-10 of digit lines formed below conductive lines 507-1 and 507-2 shown in FIG. 5G.

FIG. 5I is an overhead view of another stage of a method for forming conductive line contact regions having multiple multi-direction conductive lines and the staircase conductive line contact structures for semiconductor devices, in accordance with embodiments of the present disclosure. As shown in FIG. 5I, a fourth dielectric material 537 (e.g., a spin on dielectric) may be deposited into regions 590 around and between bridges 546-1, 546-2, 546-3, 546-4 and digit line contact regions 547-1 and 547-2. In some embodiments, the fourth dielectric material 537 may be similar or identical to the first dielectric material 530. For example, in some embodiments, the first dielectric material 530 and the fourth dielectric material 537 may each include an oxide material.

FIG. 5J is a cross-sectional view along line B-B' of FIG. 5I after the process described in connection with FIG. 5I has been performed. As with FIG. 5I. FIG. 5J shows a fourth dielectric material 537 may be deposited into regions on the sides of the stack.

FIG. 5K is an overhead view of another stage of a method for forming conductive line contact regions having multiple multi-direction conductive lines and the staircase conductive line contact structures for semiconductor devices, in accordance embodiments of the present disclosure. In some embodiments, a hard mask material (e.g., a photoresist layer) may be deposited over a portion 592 of the array regions 540-1, 540-2. In other embodiments, a hard mask material may be deposited over a part of each memory array region. The hard mask material may serve to protect the memory cell array regions and body contacts throughout the remainder of the processes described herein.

In some embodiments, a photoresist layer may be deposited over region 592. The photoresist layer may serve as a protective layer to keep the portions of the memory cell array that are not being removed intact during the staircase formation process.

Further, as shown in FIG. 5K, a portion of the array regions (e.g., 540-1 and 540-2) having the portions (e.g., 542-1 and 542-2) of the digit lines therein can be exposed for further processing as described in more detail below. In this manner, part of the staircase structure can be formed.

FIG. 5L illustrates a cross-sectional view along line C-C' of FIG. 5K. In other words, FIG. 5L illustrates a cross-ssectional view along the second portions 542-1 and 542-2 of conductive lines shown in FIG. 5K. As illustrated in FIG. 5L, each memory cell region includes a vertical stack of horizontal conductive lines, each conductive line comprising a portion 542, extending in a horizontal direction.

Each memory cell region may include a number of groups of layers (e.g., 539-1, 539-2, 539-3), wherein each group of layers includes a first dielectric material layer 530-0, . . . , 530-D, a semiconductor material layer 532-0, . . . , 532-D, and a second dielectric material layer 533-0, . . . , 533-D. The second dielectric material having one or more conductive lines formed therein.

For example, the second dielectric material layer 533-0, . . . , 533-D of each group of layers 539-0, . . . , 539-2 may include second portions 542 of one or more conductive lines. Each memory cell 540-1, . . . , 540-W may include a layer 533 of a second dielectric material above the top group of layers 539-2.

FIG. 5M is an overhead view of a stage of a method embodiment for forming conductive line contact regions having multiple multi-direction conductive lines and the staircase conductive line contact structures in an odd-even arrangement for semiconductor devices, in accordance with embodiments of the present disclosure. As shown in FIG. 5M, in some embodiments, each conductive line may include a third portion (e.g., 543-1, . . . , 543-4) extending in a third horizontal direction at an angle to the second horizontal direction. In some embodiments, as shown in FIG. 5M, the third portion 543-1, . . . , 543-4 may extend at an angle perpendicular to the second portion 542-1, . . . , 542-4 and parallel to the first portion 541-1, . . . , 541-4.

In some embodiments, a masking, patterning, and etching process can be used to selectively open regions, such as 594 (e.g., regions 594-1, . . . , 594-2) identified by the rectangles shown in FIG. 5M to form a staircase structure as described below. The regions may each be a region that spans across multiple areas of the array structure. For example, the regions can include parts of the array regions 540, bridges 546, and conductive line contact regions 547.

Regions 594 may include vertically stacked groups of layers as described in connection with FIG. 5L and material may be removed in various regions to form structures such as those shown in FIG. 5S. For example, regions 594-1, . . . , 594-2 may include vertically stacked groups of layers, where each group of layers includes a first dielectric material layer, a semiconductor layer, and a second dielectric material layer with conductive lines formed therein. For example, regions 594-1, . . . , 594-2 may include groups of layers 539-0, . . . , 539-2 as shown in FIG. 5L.

The regions 594-1 through 594-7 in FIG. 5M are regions that have been opened to create the lowest levels of the staircases, such as levels 535-1 in the illustrations of FIG. 5S. As will be understood by the reader, the illustration in 5M represents the opening regions used to form the lowest levels of the staircase and are located above those parts of the staircase. Consequently, when forming other layers of the staircase, such as 535-2 and 535-3 shown in FIG. 5S, different areas will be opened to form those structures.

One methodology that can be used to form these staircases involves two processes. First, an etch-trim sequence can be used to form the stairs themselves and then cut or chop masks can be used to get the stair structure down to the desired level of the tiered stack of layers. Typically, a series of stairs, such as the three stairs shown in C1-C1' of FIG. 5S (e.g., 535-1, 535-2, and 535-3 shown in FIG. 5S) are formed and then that whole series of stairs is brought to their desired levels (e.g., vd-2, vd-3, vd-4 shown in FIG. 5S) through the cut or chop mask process. For deeper tiers, more than one cut or chop mask may be used.

Additionally, if multiple staircases (e.g., three levels of stairs) are being formed at different locations (e.g., C1-C1', C2-C2', C3-C3' in FIG. 5R) then, in some embodiments, all of the staircases can be formed at the same levels (e.g., all sets of stairs are formed with vertical depths of vd-1, vd-2, vd-3) and then different cut or chop mask processes can be used to drop these sets of stairs to different levels. For example, both of the staircases shown at C1-C1' and C3-C3' of FIG. 5S can initially have vertical depths of vd-1, vd-2, and vd-3, but further cut or chop mask processing can be done at C3-C3' to drop that set of stairs to vd-8, vd-9, and vd-10.

Imaginary reference lines may, for example, run through the centers of each memory cell array to provide the reader with a reference as the formation process is discussed herein. A vertical opening may be formed, as illustrated in FIG. 5N. In some embodiments, the reference line may be central to the vertical opening. In some embodiments, the vertical opening may be centered around the intersection of the reference line and line C-C'.

FIG. 5N is a cross-sectional view along line C-C' of FIG. 5M. As shown in FIG. 5N, a vertical opening 580 may be formed through the layers within the vertically stacked memory cells to expose vertical sidewalls in the vertical stack. Imaginary reference lines 564 may run through the centers of each memory cell array region. A vertical opening 580 may be formed. In some embodiments, the reference line 564 may be central to the vertical opening 580. In some embodiments, the vertical opening 580 may be centered around the intersection of the reference line 564 and line C-C'.

The vertical opening 580 may be of a first horizontal width ("w1" in FIG. 5N) and a first vertical depth ("vd-1" shown in FIG. 5N). The vertical opening 580 may be formed by selectively removing the top layers 538, 533 and then one or more groups of layers of the groups of layers 539-0, . . . , 539-2 of the vertical stack. The one or more layers of the vertical stack be selectively removed a first distance on each side of the reference line 564 (i.e., to the left of the reference line 564 and the first distance to the right of the reference line 564).

In some embodiments, the vertical opening 580 may be formed through a mask 538 and the second dielectric material 533. Forming the vertical opening 580 may include removing a first portion of a mask 538 and a first portion of a second dielectric layer 533. The first portions of the mask 538 and second dielectric material later 533 may be equivalent in horizontal length. Although not shown in FIG. 5N, in some embodiments where a mask 538 has not been deposited over the vertical stack 501, the vertical opening 580 may be formed through a top layer of the first dielectric material 530-D and/or a top layer of the second dielectric material 533.

As shown in FIG. 5N, the vertical stack may include layers of the second dielectric material 533 with portions 542 of digit lines formed therein. In some embodiments, the vertical opening 580 may be formed by removing each layer of material between the top of the vertical stack and the first layer of the first dielectric material 530-D.

As shown in FIG. 5N, the vertical stack may include multiple levels (also referred to as tiers) 539-0, . . . , 539-2 (e.g., three tiers shown in FIG. 5N), with each level 539-0, . . . , 539-2 including a layer of the semiconductor material 532, a layer of the first dielectric material 530, and a layer of the second dielectric material 533 with one or more conductive lines formed therein. The vertical stack may include any number of such levels 539-0, . . . , 539-2. As discussed herein, the vertical stack may be formed on a substrate 500.

As shown in more detail in FIGS. 5O-5S, FIG. 5T, FIGS. 6A-6C, a method of forming various levels of an array region may be repeated in any number of iterations to form multi-level conductive line contacts at more than two levels. For example, a method may be repeated in a number of iterations such as to form eight-levels of conductive line contacts, as illustrated in FIGS. 5O-5S, FIG. 5T, FIGS. 6A-6N.

FIG. 5O is a cross-sectional view of an embodiment similar to FIG. 5M taken along line C-C' of FIG. 5M illustrating another stage of a method for forming conductive line contact regions having multiple multi-direction conductive lines and the staircase conductive line contact structures for semiconductor devices, in accordance with embodiments of the present disclosure. In this embodiment, the stack has many more layers 530, 532, 533 and accordingly groups of layers 539.

The vertical depth of the vertical opening may be increased to a second vertical depth "vd-2". This may be done by removing a part of the layer of the second dielectric material 533, where the layer also contains first portions 542-1 and 542-2 of conductive lines formed therein. A part of the semiconductor material layer 532 may also be removed. At this stage, the opening into layers 533 (top layer), 530, 533, and 532 all have the same as width w1, as shown in FIG. 5O.

FIG. 5P is a cross-sectional view of an embodiment similar to FIG. 5M taken along line C-C' of FIG. 5M illustrating another stage of a method for forming conductive line contact regions having multiple multi-direction conductive lines and the staircase conductive line contact structures for semiconductor devices, in accordance with embodiments of the present disclosure. The method includes creating a first level 548-1 and a second level 548-2 that are different from the remainder of the layers in level 548-3 of a vertical stack.

This may be done by removing a first portion of each layer of a first group of layers a second distance 535-2 back from the reference line 564 on either side, where the second distance 535-2 is greater than the first distance 535-1. And, by removing a first portion of each layer of a second group of layers a first distance 535-1 back from the reference line 564 on either side, where the second distance 535-2 is greater than the first distance 535-1. This will also create two different depths vd-2 (for the top/first level 548-1) and vd-3 (for the second level 548-2).

In some embodiments, the top level 548-1 may include a mask (e.g., a photoresist layer) not shown in FIG. 5P, a top second dielectric material layer 533, a first dielectric material layer 530, a second dielectric material layer 533 with portions of the digit lines formed therein, and a semiconductor material layer 532, as discussed in previous figures. However, embodiments of the present disclosure are not so limited.

FIG. 5Q illustrates the formation of a third level 548-3 comprising a layer of a semiconductor material, conductive lines, and a layer of a first dielectric material. The method includes creating a first level 548-1, a second level 548-2, and a third level 548-3 that are different from the remainder of the layers in level 548-4 of a vertical stack. This may be done by removing a portion of each layer of a first group of layers 548-1 a third distance 535-3 back from the reference line 564 on either side, where the third distance 535-3 is greater than the first and second distances 535-1 and 535-2. And, by removing a portion of each layer of a second group of layers 548-2 a second distance 535-2 back from the reference line 564 on either side, where the second distance 535-2 is greater than the first distance 535-1. And, further, by removing a portion of each layer of a third group of layers 548-3 a first distance 535-1 back from the reference line 564 on either side, where the second distance 535-2 is greater than the first distance 535-1. This will also create three different depths vd-2 (for the first level 548-1), vd-3 (for the second level 548-2), and vd-4 (for the third level 548-3).

FIG. 5R illustrates an overhead view of another stage of a method of forming conductive line contact regions having multiple multi-direction conductive lines and the staircase conductive line contact structures for semiconductor devices, in accordance with embodiments of the present disclosure. Line C1-C1' runs along the second portions 542-1 and 542-2, line C2-C2' runs along the fourth portions 544-1 and 544-2, and line C3-C3' runs along the second portion 551-1 and 551-2. As discussed below, each of these areas is formed differently to allow for connections to be formed to different levels of the stack.

FIG. 5S illustrates cross-sections along lines C1-C1', C2-C2', and C3-C3' of FIG. 5R, illustrating different structures that can be used to access different levels of the stack. Each cross-section includes the same vertical stack of horizontal digit lines and layers of the first dielectric material 530, the semiconductor material 532, and the second dielectric material 533, but at different viewing lines to see the different staircase patterns that are formed in different locations within the stack. As illustrated in FIG. 5S, a group of layers 548-4 at the bottom of the vertical stacks may remain unaltered (no material removed). As can be understood from FIG. 5S, the number of layers in the group of layers 548-4 can change based on the layers to be accessed for contact with sense amplifiers or other circuitry.

In the representation on the left of FIG. 5S, multiple levels 548-1, 548-2, and 548-3 can be accessed at depths in the stack of vd-2, vd-3, and vd-4. Further, in the representation in the middle of FIG. 5S, multiple levels 548-1, 548-2, and 548-3 can be accessed at depths in the stack of vd-5, vd-6, and vd-7, and in the representation on the left of FIG. 5S, multiple levels 548-1, 548-2, and 548-3 can be accessed at depths in the stack of vd-8, vd-9, and vd-10. This is achieved by have a vertical opening having different widths 535-1, 535-2, and 535-3 from a reference line 564. Although three widths are illustrated any suitable number of widths can be created.

Figure 6A:
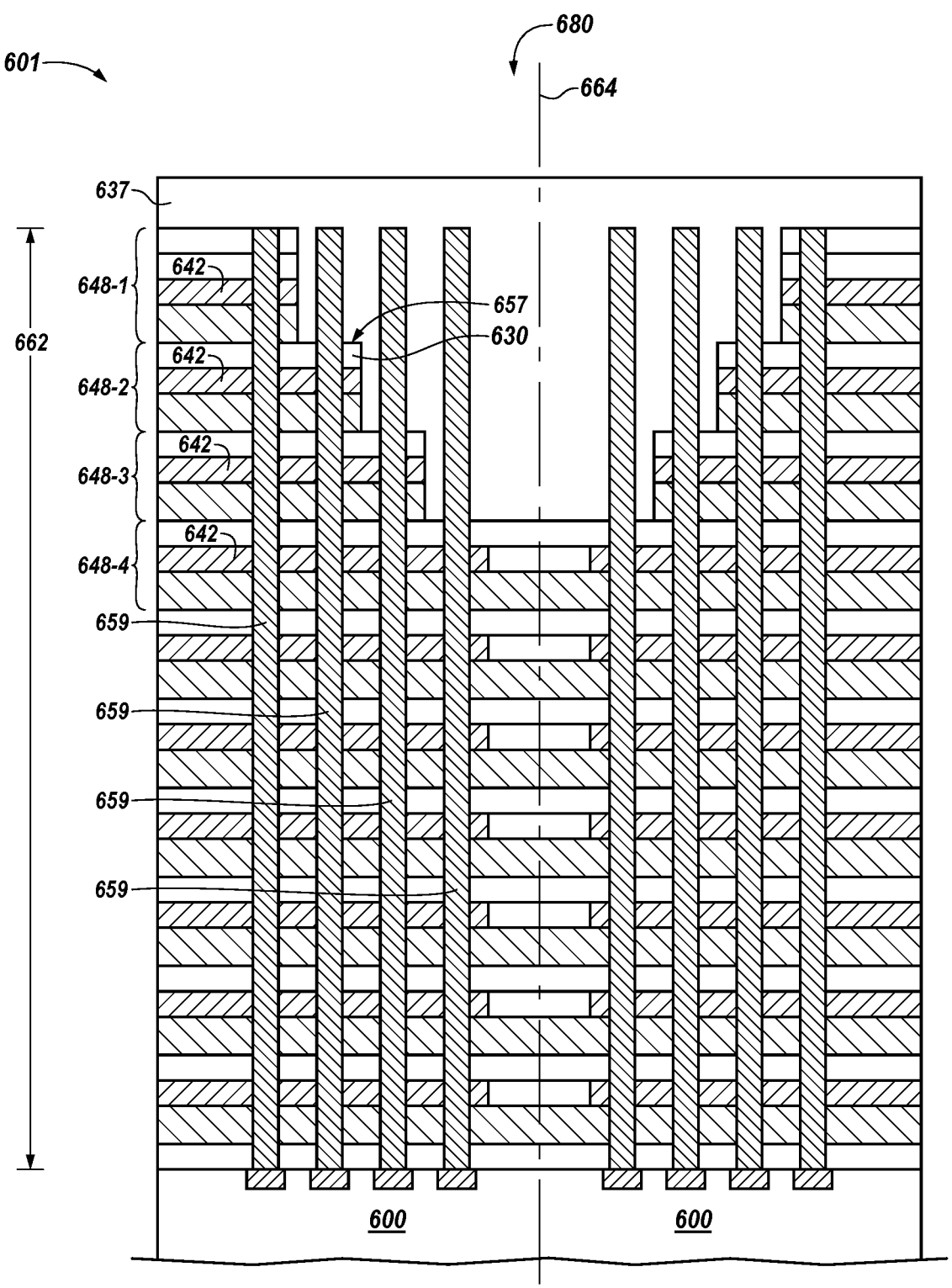
FIG. 6A-6N are cross-sectional views illustrating a method of forming vertically orientated contact structures for different tiers of a vertical memory array in accordance with embodiments of the present disclosure.
Figure 6B:
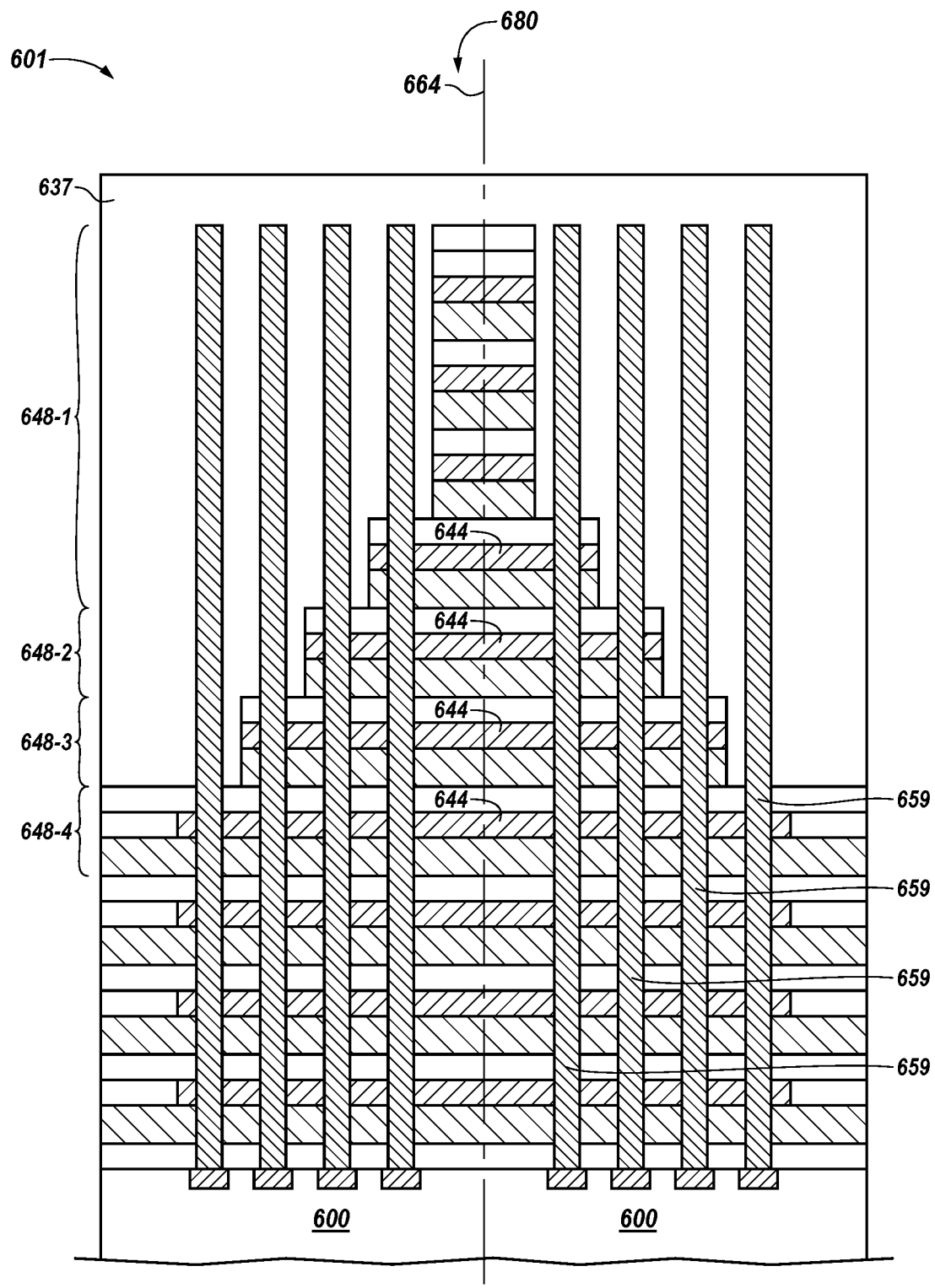
Figure 6C:
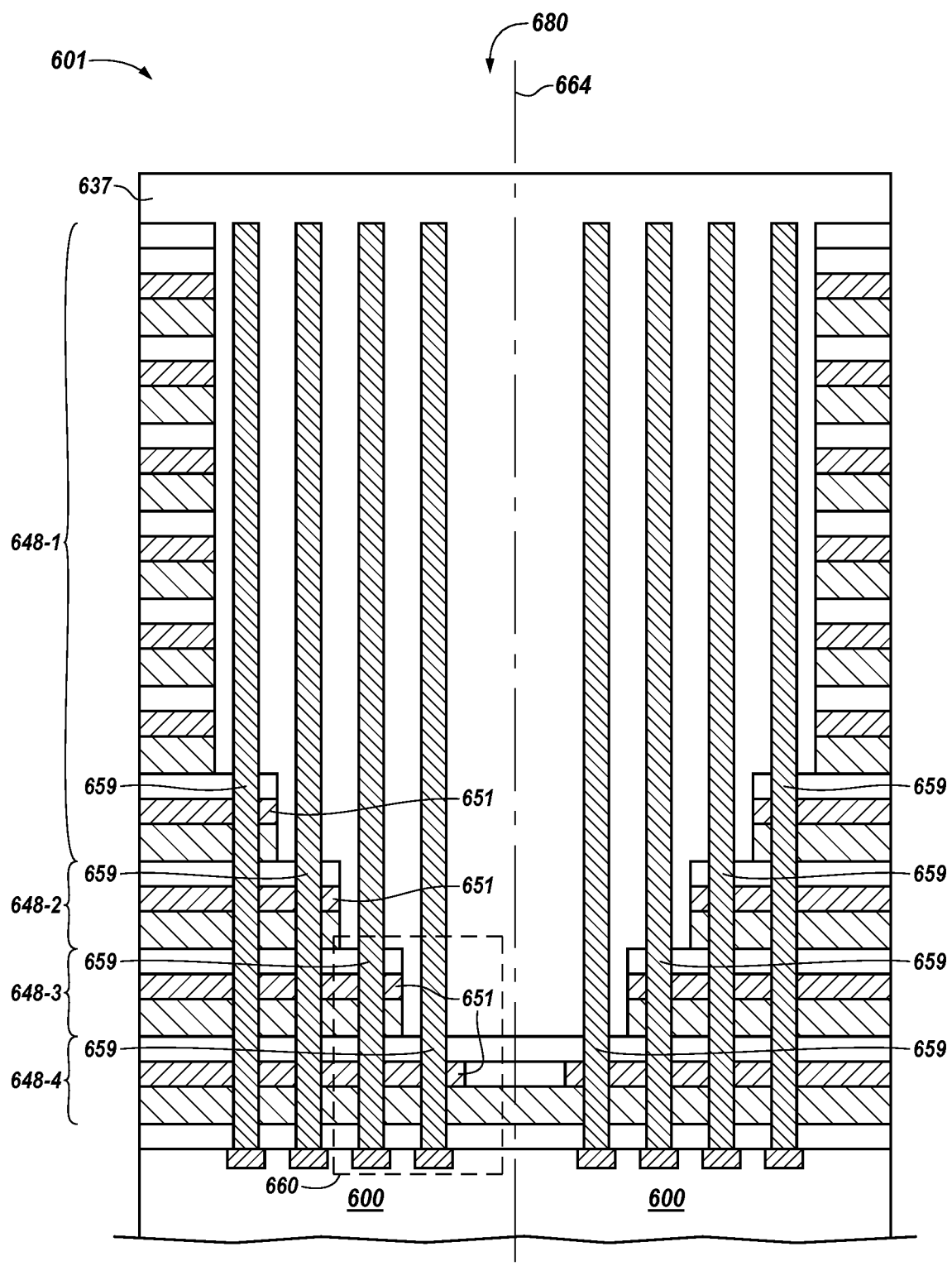
Figure 6D:
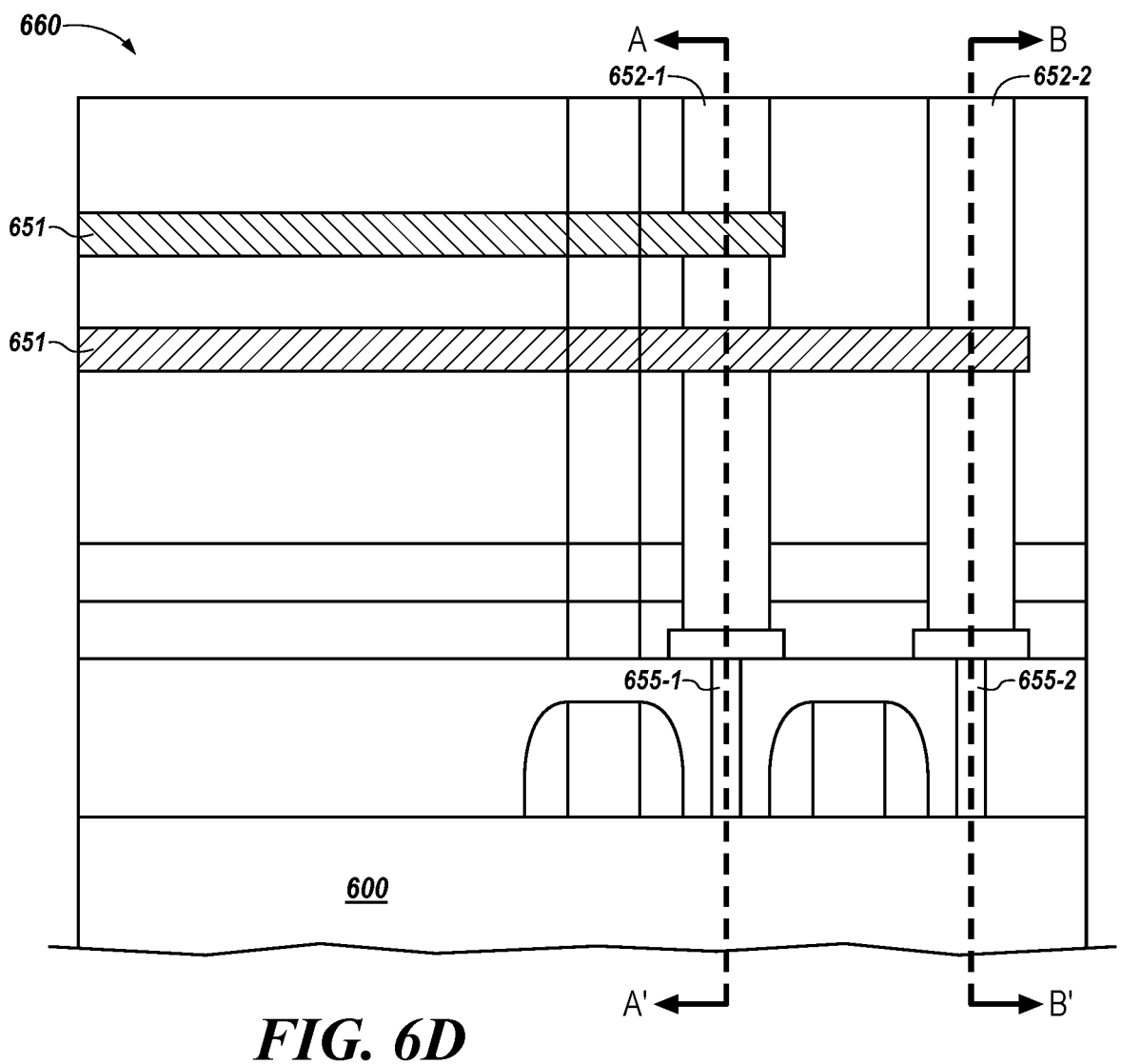
Figure 6E:
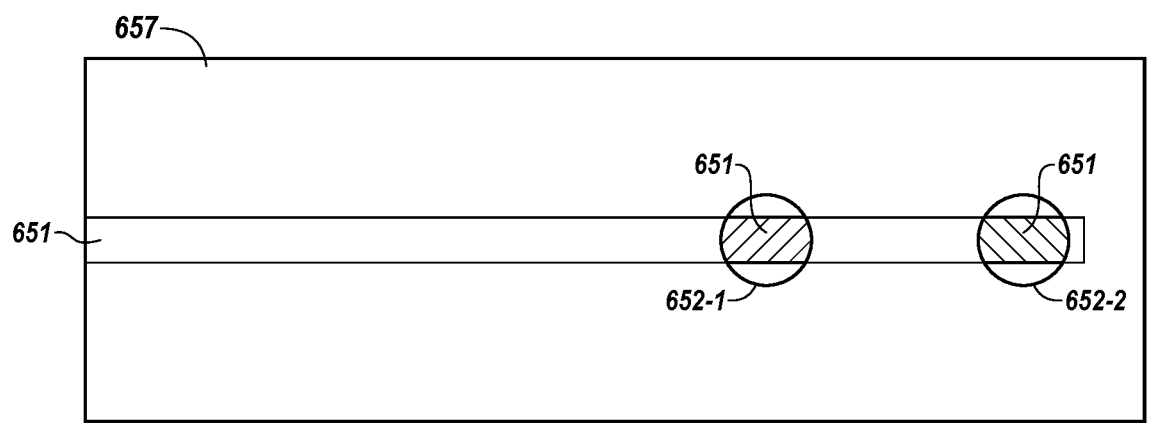
Figure 6F:
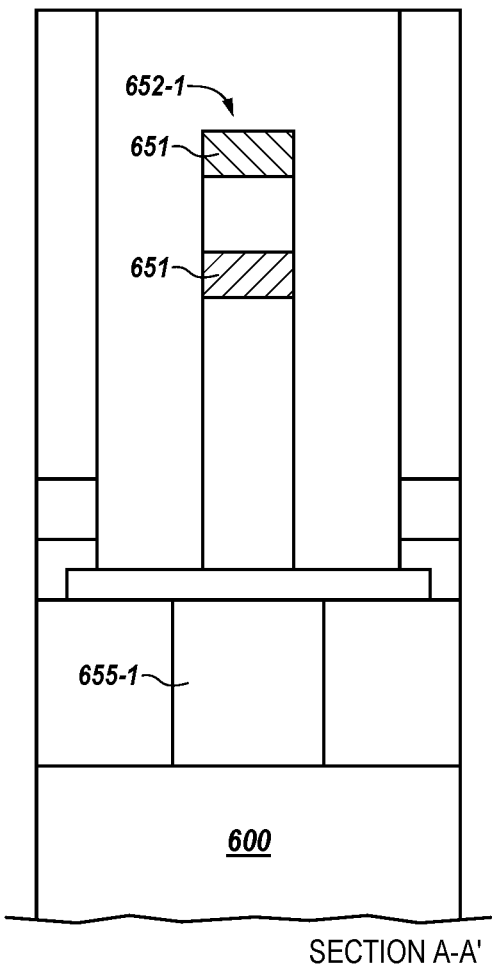
Figure 6G:
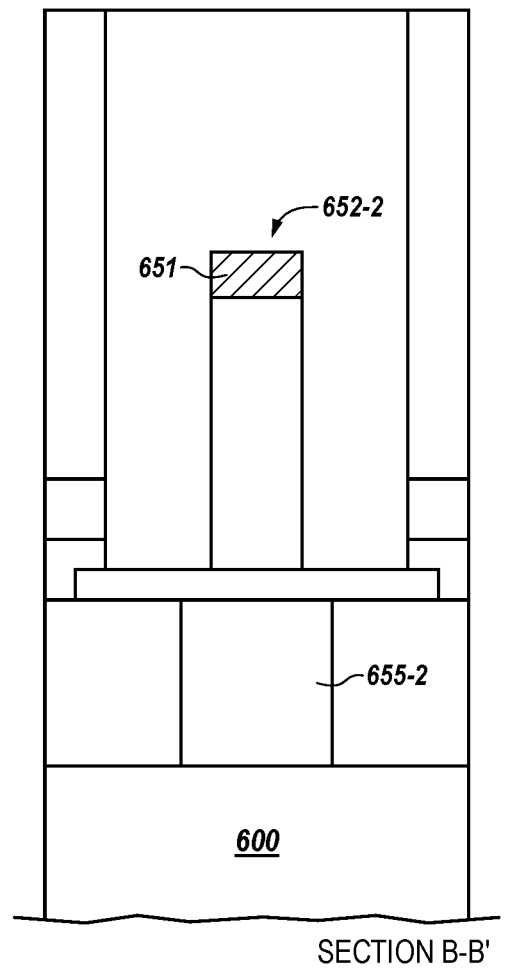
Figure 6K:
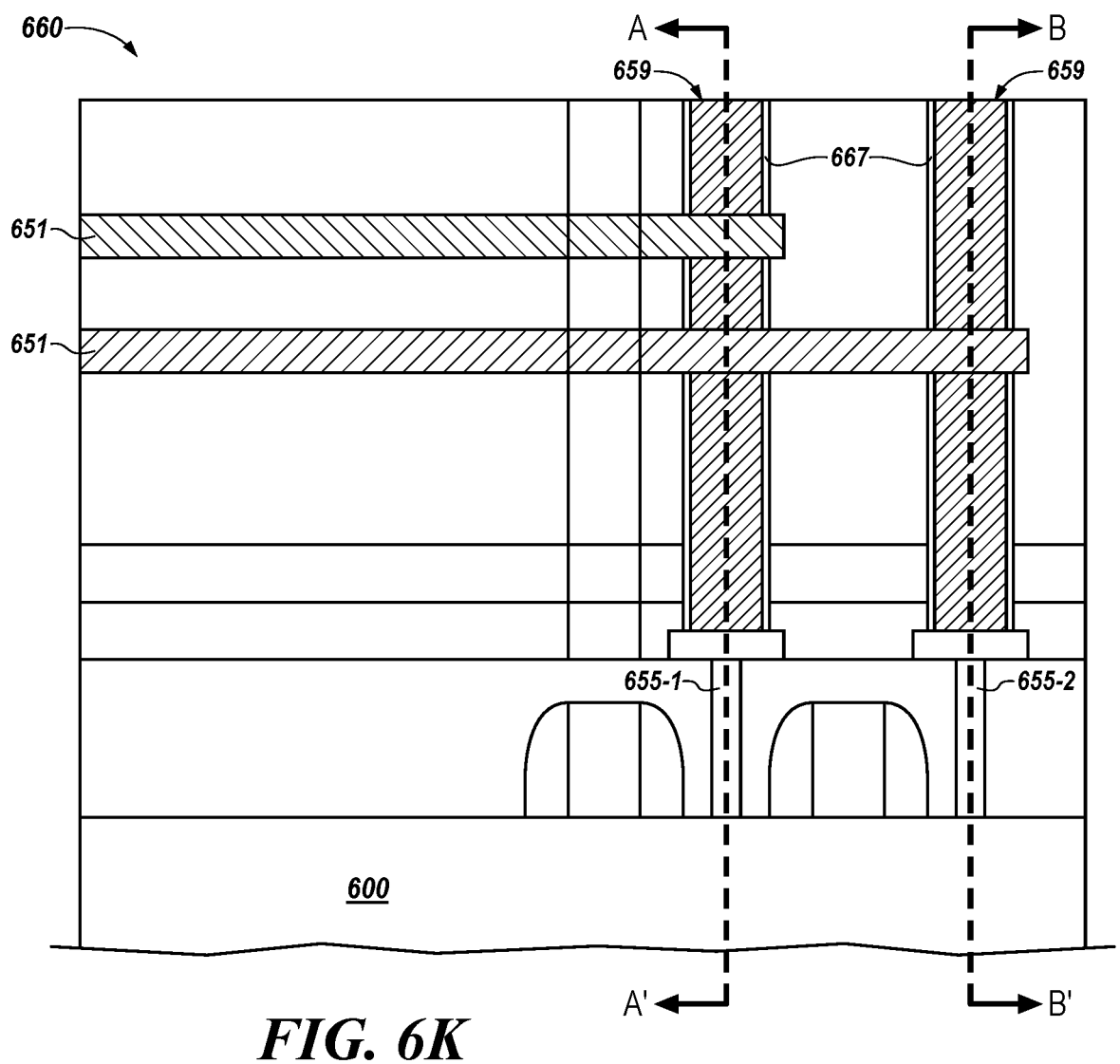
Figure 6L:
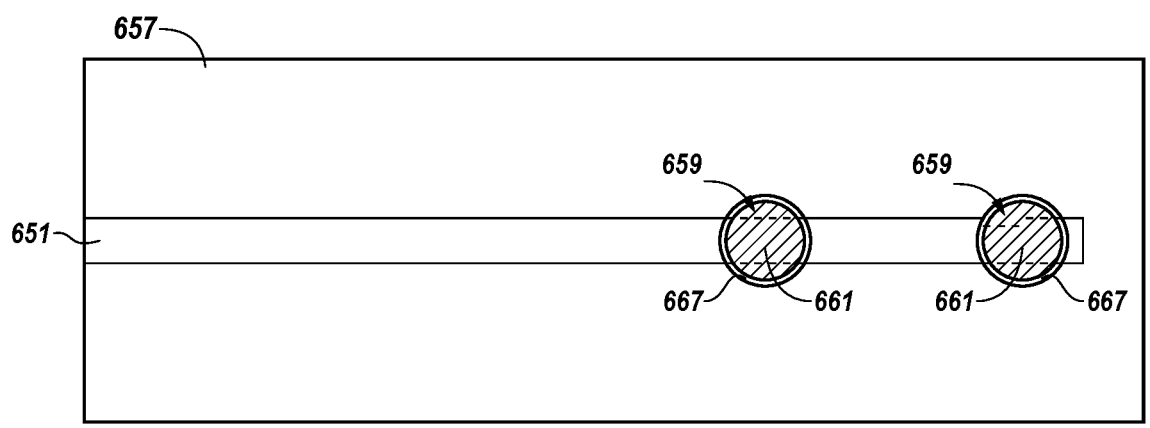
Figure 6M:
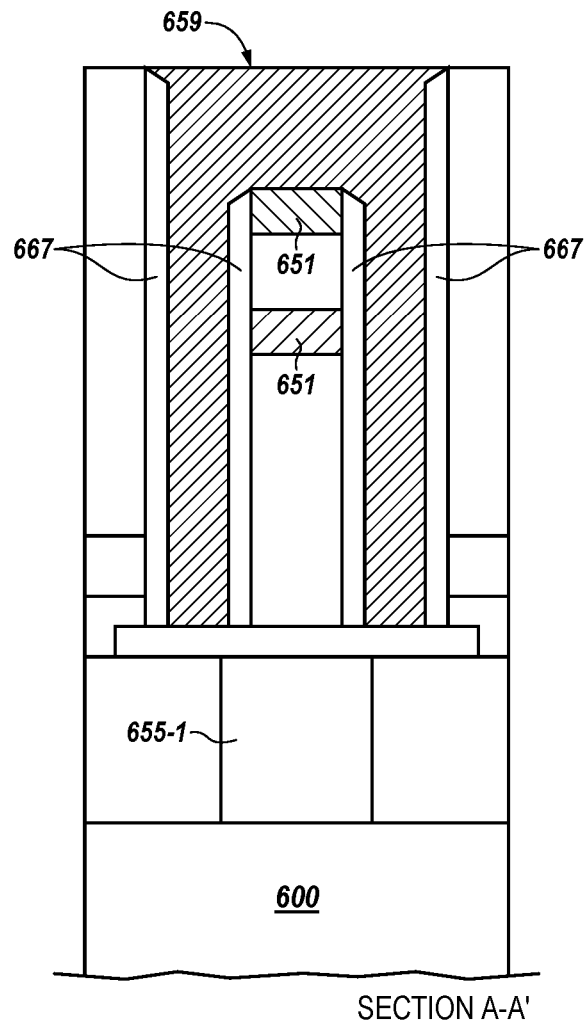
Figure 6N:
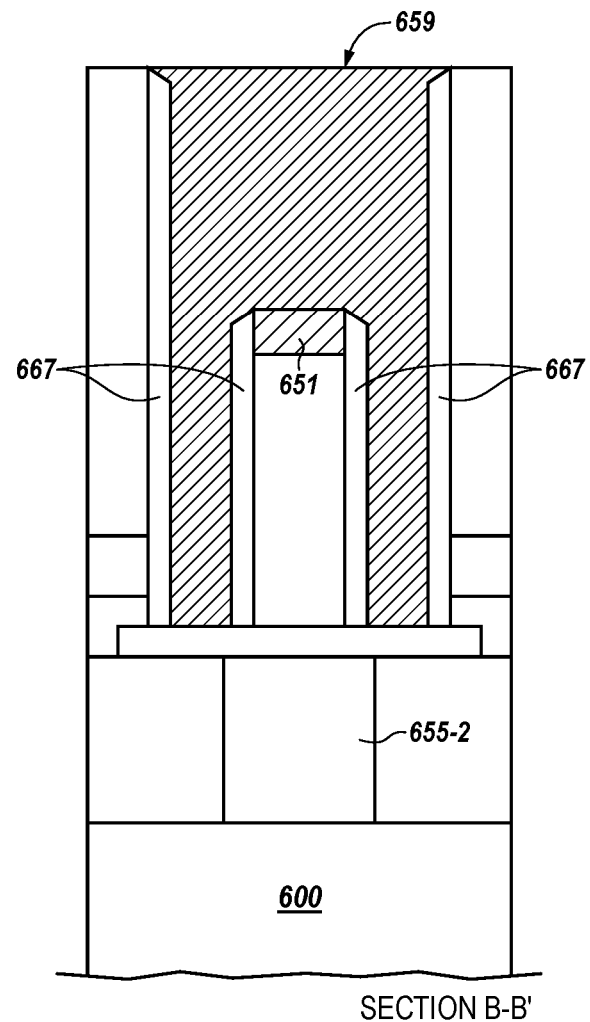

Using this staircase structure allows for direct vertical contacts to be made with the sense amplifiers or other circuitry, as are illustrated in FIGS. 6A-6N. In the embodiment illustrated in FIG. 5S, this allows for conductive line contacts to nine sense amplifiers or other circuits, thereby providing added density to the conductive line contact region that could not be provided previously. It should be understood by the reader that this staircase concept could be utilized to connect conductive lines to many (e.g., hundreds) of sense amplifiers or other circuits.

FIG. 5T illustrates an overhead view illustrating an example of the number of connections and an example arrangement thereof on the conductive line contact regions having multiple multi-direction conductive lines, in accordance with embodiments of the present disclosure. This figure illustrates vertical connection areas where contacts between digit lines and sense amplifiers can be made. Although as illustrated, each horizontal digit line area has three vertical connection areas where contacts can be positioned, more or less could be provided based on the space available for the connections. In the illustration shown, the left side of the left array has three connection areas along each horizontal conductive line portion. For example, positions labeled 0, 1, and 2 will each connect with a second portion 542/642 of a different vertical tier of the vertical stack as shown in FIG. 6A. Each array shown in FIG. 5T has 9 interconnection locations available (labeled 0, 1, 2, 3, 4, 5, 6, 7, 8), although the embodiments of the present disclosure could have more or less interconnection locations. As may be understood based on the numbering of the interconnection locations, the area with interconnections 876-678 and the area with interconnection locations 210-012 are configured as valleys as shown in FIG. 5S at C1-C1' and C3-C3', while the area where the interconnection locations 345-543 are configured as a peak as shown in FIG. 5S at C2-C2'. If more horizontal portions (and corresponding vertical levels) are provided, more connection areas could be created.

FIG. 6A is a cross-sectional view along line C1-C1' of FIG. 5R. FIG. 6B is a cross-sectional view along line C2-C2' of FIG. 5R. FIG. 6C is a cross-sectional view along line C3-C3' of FIG. 5R. These figures illustrate other example views of a method of forming conductive line contact regions having multiple multi-direction conductive lines and the vertically orientated staircase conductive line contact structures for semiconductor devices, in accordance with embodiments of the present disclosure.

In some embodiments and as shown in FIGS. 6A-6C, a fourth dielectric material 637 may be deposited into the vertical opening 680. The fourth dielectric material 637 may be similar in composition to the first dielectric material 630. For example, in some embodiments, the first dielectric material 630 and the fourth dielectric material 637 may each include an oxide material.

The portions of the different levels of digit lines 642, 644, and 651 illustrated in FIG. 6A-6C may correspond to the portions of the different levels of digit lines 542, 544, and 551, illustrated in FIG. 5R. In some embodiments, each digit line portion 642, 644, and 651 in the vertical stack may be of a length greater than that of the respective digit line 642, 644, or 651 above it in the vertical stack 601.

Each level of the vertical stack may include digit lines 642, 644, or 651 coupled to a sense amplifier or other circuitry via a vertical contact, as described herein, on either side of the reference line 664. For instance, as illustrated in FIGS. 6A-6C conductive line portion 642, 644, or 651 can be connected to respective vertical contacts 659 at or near an end of that conductive line portion 642, 644, or 651 (i.e., near the end of a given level 648). As shown in FIGS. 6A-C, the vertical contact 659 can extend downward from a respective digit line 642, 644, or 651 above it in the vertical stack 601 to couple the respective digit line 642, 644, or 651 to the substrate 600. In some embodiments, the number of vertical contacts may be equal to twice the number of levels 648 due to there being two conductive lines in each array region (e.g., array region 504-1 of FIG. 5C). For example, a three-level staircase structure as illustrated in FIG. 6A may have six vertical contacts (e.g., in a folded digit line architecture) as shown.

As illustrated in FIG. 6A, the vertical contact can extend in a vertical plane (e.g., the third direction (D3) 111 as described with respect to FIG. 1). For instance, vertically orientated contact 659 can extend a distance 662 from a top surface 657 of the stack at a given level 648-2 to the substrate 600. Similarly, the other vertical contacts 659 can extend along the vertical plane 611 respective distances 662 from top surfaces of respective levels 648-1, 648-3 to the substrate 600. That is, as shown in FIG. 6A the vertical contacts 659 can have lengths which may vary between the vertical contacts 659.

A length 662 of a respective vertically orientated is equal to or greater than a distance between a respective conductor 642, 644, and 651 and the substrate 600.

As shown in FIGS. 6D-6G, various embodiments can include forming a plurality of spaced, vertical openings 652 through the vertical stack adjacent to each of the multiple multi-direction horizontal conductive lines 651 in the staircase contact structure. Each tier or level in a staircase contact structure can have at least one opening adjacent to each of the multiple multi direction horizontal conductive lines 651 to permit subsequent formation of at least one vertical contact for each of the multiple multi-directional horizontal conductive lines. In various embodiments, a total number of the plurality of vertical openings 652 can be equal to two times a total number of tiers or levels in a staircase contact structure. For instance, each tier can have a total of two laterally spaced openings such that a first opening is on a respective side of the opening 680 and a second opening is on the same tier on the other side of the opening 680, among other possibilities. The number of vertical openings 652 can be equal to respective number of vertical contacts 659 that are subsequently formed in the openings 652. The number of vertical openings 652 can be equal to or greater than a respective number of horizontal conductive lines such as the conductors 642, 644, and 651.

FIG. 6D is a top view of a portion 660 of FIG. 6C after the process for forming vertical openings has been performed. A masking, patterning, and etching process can be used to form the vertical openings including a first opening 652-1 and a second opening 652-1 (generally referred to as 652). For instance, a selective etch process can be performed to selectively form the vertical openings 652 through the vertical stack 601. For instance, in embodiments in which the conductor 651 is a metal, such as tungsten, then an etch that is selective to tungsten can be used to form the vertical openings 652. As a result of the selective etching, the vertical openings 652 can extend along a vertical plane (e.g., the third direction (D3) 111 as described with respect to FIG. 1) within the vertical stack 601.

For instance, the vertical openings 652 can extend continuously from a top surface (e.g., top surface 657) of a given level (e.g., level 648-2) of the stack to the substrate 600. The vertical openings 652 can have a length (extending along the vertical plane 611) that is equal to or greater than a length (extending along the vertical plane 611) of the resultant vertically orientated conductors formed in the vertical openings 652. The openings can permit vertical contacts (e.g., 659 as described in FIGS. 6K-6N) to be formed in the openings to directly couple a respective digit line (e.g., 651) to the circuitry components 655-1, . . . , 655-2 in the substrate 600 below the respective digit line. The circuitry components 655 can be disposed on or disposed at least partially within the substrate 600. In some embodiments, vertical contacts 659 can extend downward from a respective digit line in the vertical stack 601 to directly couple the respective digit line 642, 644, or 651 to the circuitry components 655-1, . . . , 655-2 in the substrate 600 below the respective digit lines. Such direct coupling can occur in the absence of intervening components such as an intervening horizontal interconnect/jumper as may be employed in conventional approaches. Directly coupling the horizontal conductor such as a digit line to the circuitry components 655-1, . . . , 655-2 in the substrate 600 can provide greater interconnection density, reduce a total number of components, and/or provide improved (i.e., reduced) parasitic resistance due at least in part to a shorter electrical path provided via the connection between the digit line and the one or more circuitry contacts as compared to conventional structures such as those which employ horizontal interconnects.

In some embodiments, a vertical opening (e.g., vertical opening 652-2) can have a length (extending along the vertical plan 611) that is equal to a length of a corresponding vertically orientated conductor (e.g., vertically orientated conductor 659) formed in the opening. However, in some embodiments, a length to the vertical opening 652 can be greater than a length of a corresponding vertically orientated conductor 659 formed in the opening. In such embodiments, another material such as a fourth dielectric material 637 can be disposed in remainder of the length of the vertical opening 652 in which the vertically orientated conductor is not formed (e.g., a distal portion of the opening that is farthest from the substrate 600 in which the conductive material of the vertically orientated conductor is not present). While the figures describe a given number of openings, it is understood that a total number of openings and/or resultant vertically-orientated contacts formed in the openings may be varied.

FIG. 6E is a top view of a portion 660 of FIG. 6C after the process for forming openings has been performed. As shown in FIG. 6E, the vertical openings 652 including the vertical opening 652-2 and the vertical opening 652-3 can extend though a top surface 657 of the stack 601 and can extend from the top surface of the stack past the conductors 651 to the substrate (not illustrated in FIG. 6E for ease of illustration).

FIG. 6F is a cross-sectional view, taken along line A-A' of FIG. 6D, while FIG. 6G is a cross-sectional view, taken along line B-B' of FIG. 6D. As shown in FIG. 6F an opening such as vertical opening 652-1 can extend around the conductor 651 and extend to a circuitry component 655-1 in the substrate. Similarly, as shown in FIG. 6F an opening such as vertical opening 652-1 can extend around the conductor 651 and extend to a circuitry component 655-2 in the substrate.

As shown in FIGS. 6H-6J, various embodiments include conformally depositing an insulating material 667 in the plurality of spaced, vertical openings 652. FIG. 6H is a top view of a portion 660 of FIG. 6C after the process for forming vertical openings 652 and the process of depositing an insulating material 667 in the openings have been performed. The insulating material 667 may include one or more of a silicon oxide material, a silicon nitride material, and/or a silicon oxynitride material, etc. Embodiments, however, are not limited to these examples.

In various embodiments, the insulating material 667 can be conformally deposited in the vertical openings 652. For instance, as shown in FIGS. 6H-J the insulating material 667 can be deposited on a sidewall of the opening in the stack and on a sidewall of a pillar (e.g., sides of pillar on which the conductor 651 is located). The sidewall of the opening in the stack and the sidewall of the pillar can be the result of forming the openings as described in FIGS. 6D-6G. In various embodiments, the insulating material 667 can be adjacent to at least a portion of the vertical contacts, once formed. Stated differently, the insulating material 667 can be adjacent to at least a portion of the conductive material 661 once the conductive material 661 (e.g., as described in FIGS. 6K-6N) is disposed in the vertical openings 652 in which the insulating material 661 is deposited. In some examples, the insulating material 667 can be conformally deposited in the openings 652 and a subsequent etch can be performed.

FIG. 6I is a cross-sectional view, taken along line A-A' of FIG. 6H, while FIG. 6J is a cross-sectional view, taken along line B-B' of FIG. 6H. As shown in FIG. 6I the insulating material 667 can be conformally deposited in the openings 652-1. Similarly, as shown in FIG. 6J the insulating material 667 can be conformally deposited in the openings 652-3. In various embodiments, the insulating material 667 in the opening 652-1 can be same insulating material as the insulating material 667 in the opening 652-2. The insulating material 667 can electrically isolate components such as isolating a respective conductive line of the conductive lines 659 from the other conductive lines 651.

As shown in FIGS. 6K-6N, various embodiments including depositing conductive material 661 in the plurality of spaced, vertical openings to form vertical contacts 659. As shown in FIGS. 6K-6N the vertical contacts 659 can directly electrically couple the conductive lines 651 (e.g., multiple multi-direction horizontal conductive lines) to the circuitry components 655-1, 655-2 in the substrate 600. In some embodiments, the conductive material 661 can be a doped semiconductor material, a conductive metal nitride, a metal, a metal-semiconductor compound, or any combination thereof. In some embodiments, the conductive material 661 can be a metal such as tungsten.

FIG. 6K is a view of a portion 660 of FIG. 6C after the process for forming openings 652 and the processes of depositing an insulating material 667 and a conductive material 661 in the openings have been performed. FIG. 6K is a top view of the portion 660 of Fig. C showing the vertically orientated contacts 659 after the process for forming openings 652 and the processes of depositing an insulating material 667 and a conductive material 661 in the openings have been performed. Stated differently, FIG. 6L is a top view of the portion 660 of FIG. 6C showing the vertically orientated conducts 659.

FIG. 6M is a cross-sectional view, taken along line A-A' of FIG. 6K, while FIG. 6N is a cross-sectional view, taken along line B-B' of FIG. 6K. As shown in FIG. 6M the conductive material 661 can be deposited in the remainder of the openings 652-1 left after deposition of the insulating material 667 in the opening 652-1. Similarly, as shown in FIG. 6N the conductive material 661 can be deposited in the remainder of the openings 652-2 left after deposition of the insulating material 667 in the opening 652-2. In various embodiments, the conductive material 661 in the opening 652-1 can be the same as the conductive material (e.g., a metal such as tungsten) in the opening 652-2. As illustrated in FIGS. 6L, 6M, and 6N, in some embodiments the insulating material 667 can be adjacent to the vertical contacts such as the vertical contacts 659.

Figure 7A:
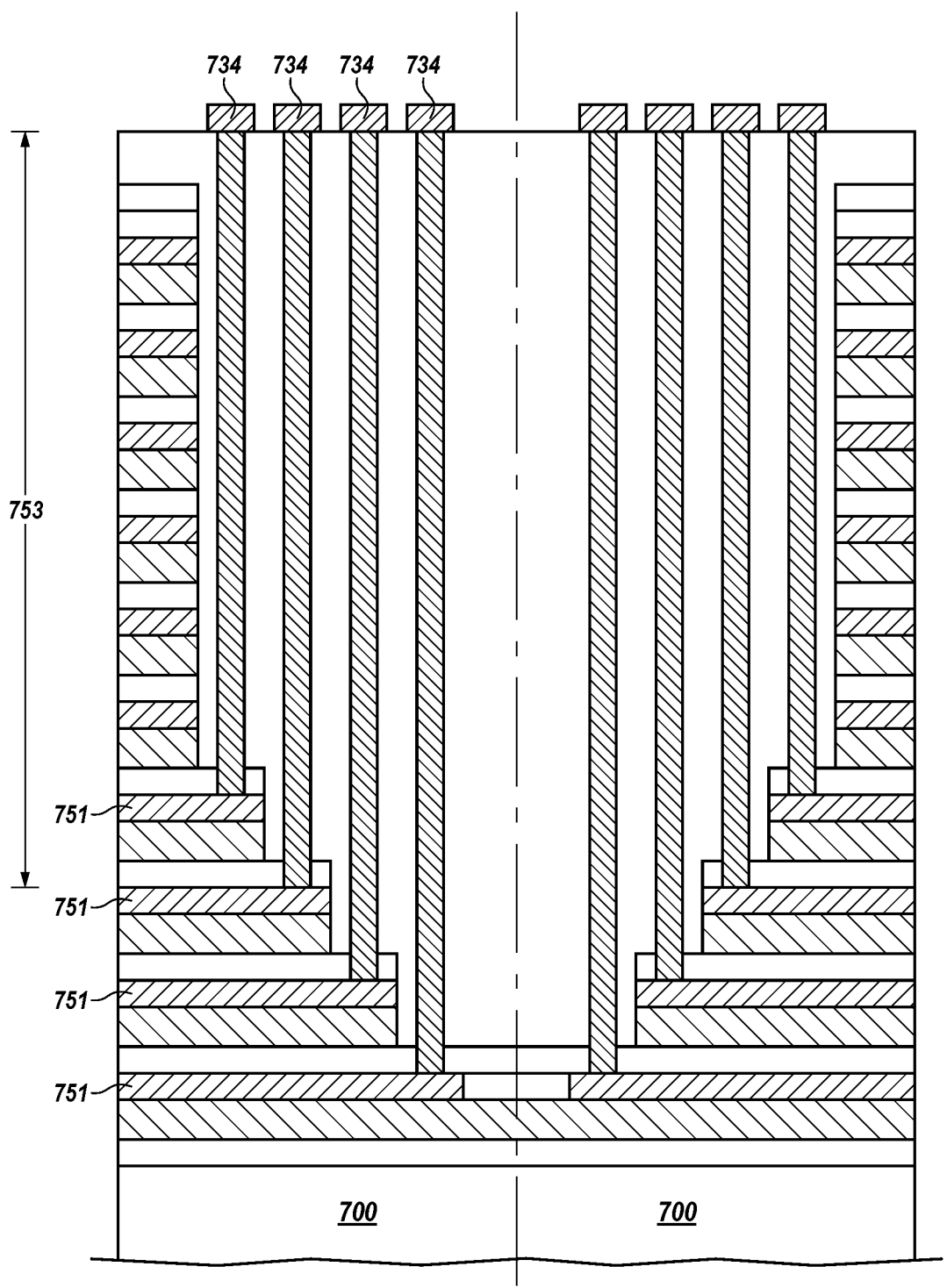
FIG. 7A is an cross-sectional view illustrating a portion of a conventional 3D memory array.
Figure 7B:
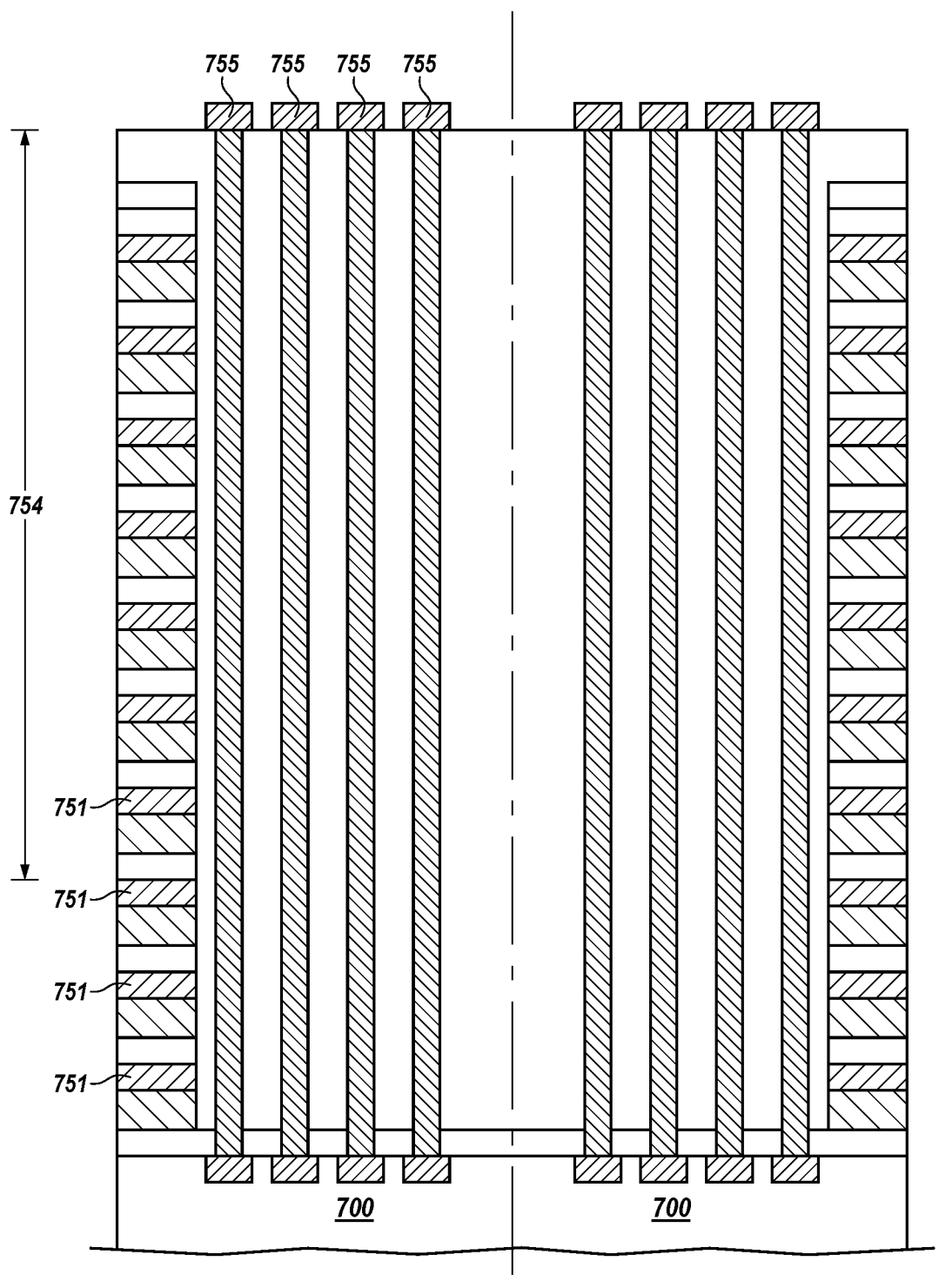
FIG. 7B is an cross-sectional view illustrating a portion of a conventional 3D memory array.
Figure 7C:
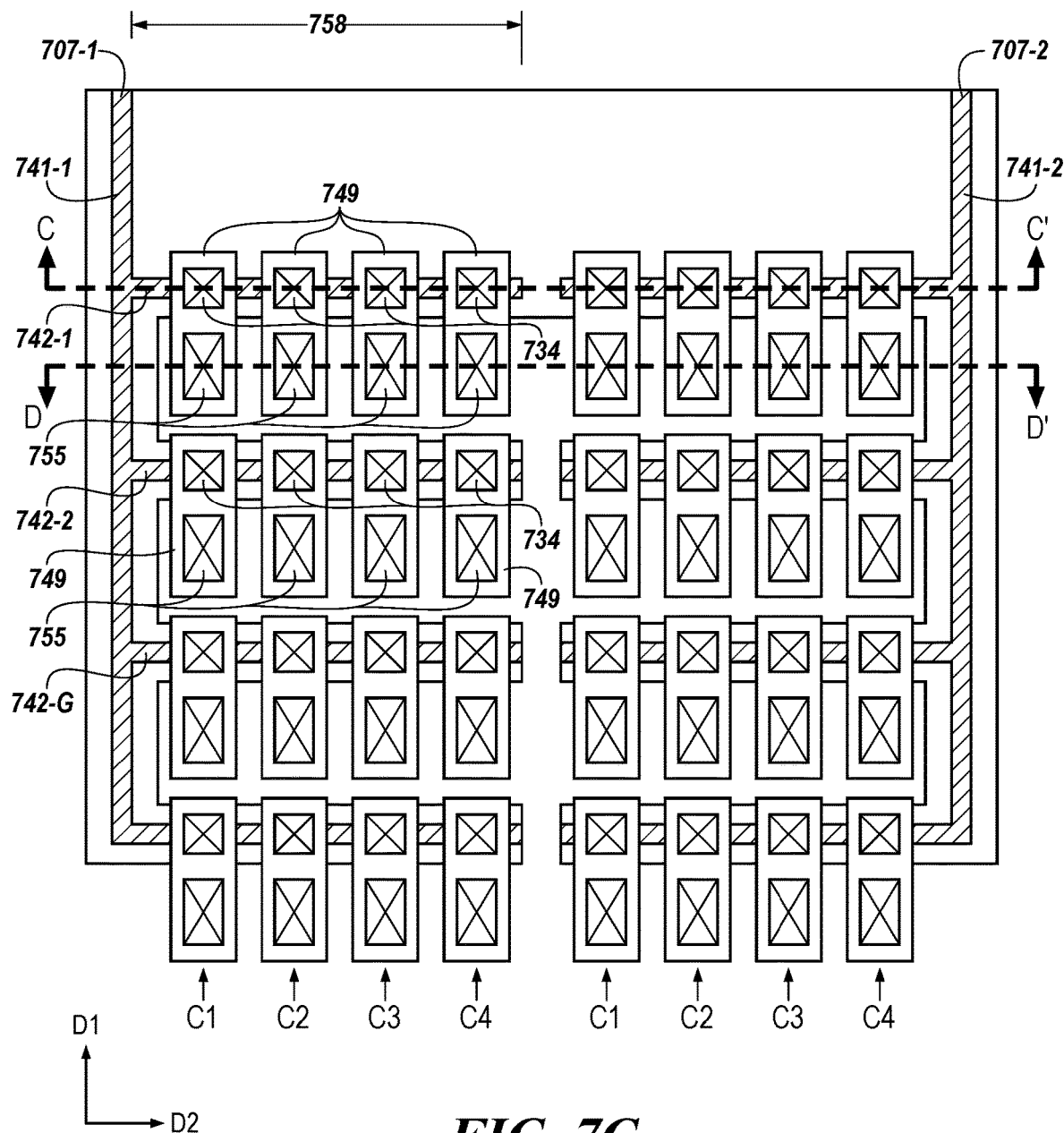
FIG. 7C is an overhead view of a conventional 3D memory array.

FIG. 7A is an cross-sectional view illustrating a portion of a conventional 3D memory array having horizontal interconnects taken along cut-line C-C' in FIG. 7C. As shown in FIG. 7A, the portions of the different levels of digit lines 751 can be coupled to a number of sense amplifiers or other circuitry via interconnections 734 located a distance (e.g., distance 753) above the digit lines 751 which, as detailed in FIGS. 7B and 7C include a horizontal interconnect. That is, a conventional 3D memory array may extend from a comparatively long electrical path that extends a distance (e.g., distance 753) above the conductive lines (e.g., above digit lines 751 in an direction opposite the substrate 600) and, once at the top/distal end of the distance 753, then extends a distance 758 horizontally, after which the conductive path finally extends downward another distance (e.g., distance 754 as illustrated in FIG. 7B) to the substrate 600.

FIG. 7B is an cross-sectional view illustrating another portion of a conventional 3D memory array taken along cut-line D-D' in FIG. 7C. As mentioned with regard to FIG. 7A, the conductive lines once at the top/distal end of the distance 753, then extends a distance (e.g., distance equal to a distance between cut-line C-C' and D-D' in Fig. C) horizontally to a circuitry contact 755, after which the conductive path finally extends downward another distance 754 to the substrate 700.

FIG. 7C is an overhead view of a conventional 3D memory array having horizontal interconnects. As illustrated in FIG. 7C, conductive lines (707-1, 707-2) may be formed having a multi-tined fork arrangement (when viewed from above the vertical stack as illustrated in FIG. 7C) such that a first portion 741 (e.g., 741-1, 741-2) of a conductive line is aligned in a first direction D1 (e.g., aligned with one side of the memory array) and the second portions 742 (i.e., each located on different tiers of layers of the vertical stack) are at an angle to the first portion (e.g., in direction D2). The second portions 742 are also spaced laterally (e.g., arranged parallel to each other) to allow interconnections including vertical interconnections to be formed for each segment 742.

Figure 7D:
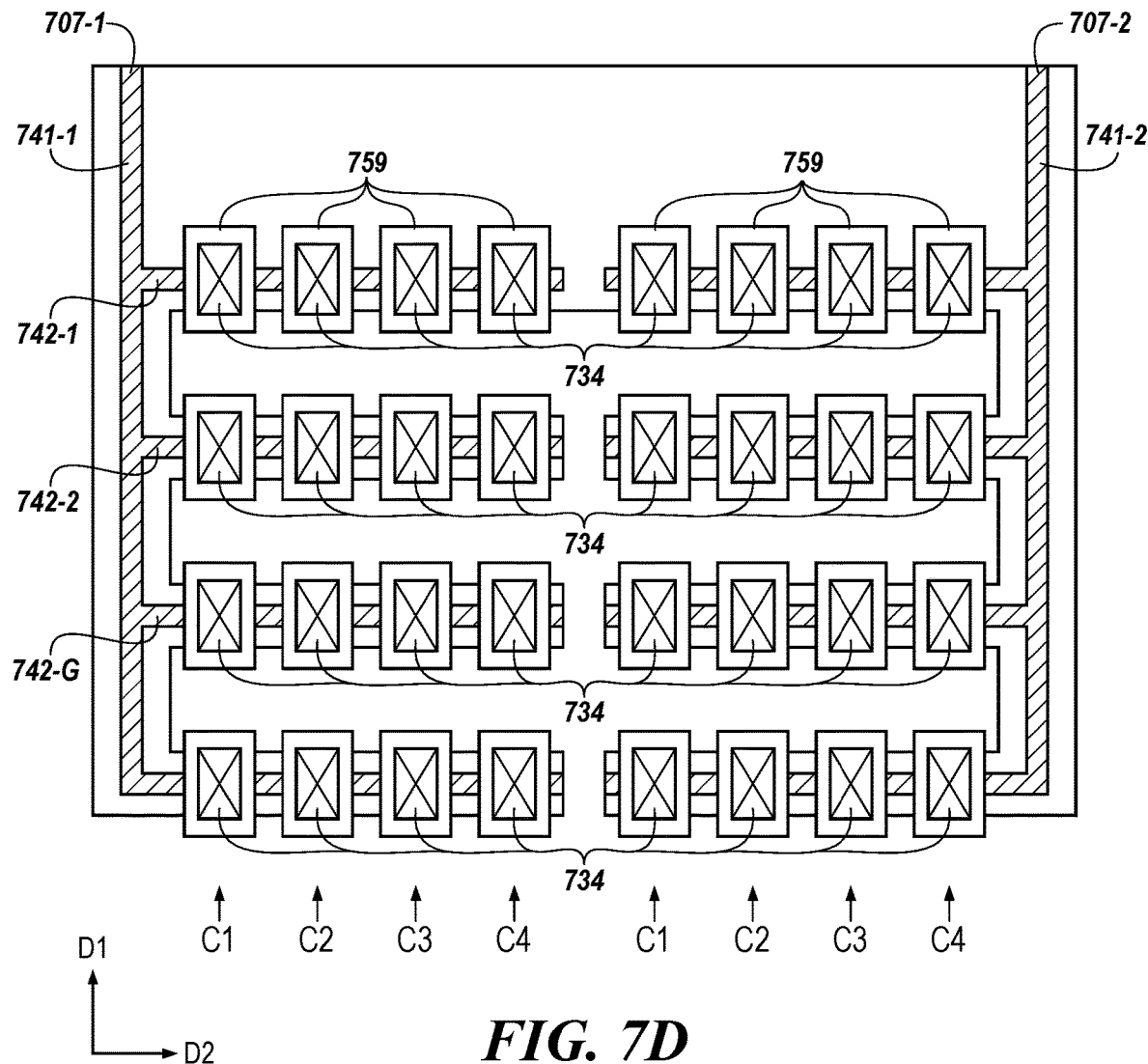
FIG. 7D is an overhead view of a 3D memory array in accordance with embodiments of the present disclosure.

Each secondary portion 742-1, . . . , 742-G may extend at an angle perpendicular to the first portion 741. In other words, the first portion 741 may extend in the D1 direction, and the secondary portions 742-1, . . . , 742-G may extend in the D2 direction. For example, FIG. 7D illustrates four secondary portions 742-1, . . . , 742-G of conductive lines 707-1 and 707-2 extending in a second direction D2 perpendicular to a first direction D1 of a first portion 741-1 and 741-2 of the conductive lines 707-1 and 707-2, respectively.

Each secondary portion 742-1, . . . , 742-G may be interconnected to a sense amplifier or other circuitry contact 755 via horizontal interconnects such as contact jumpers 749, for example. At least a portion of the contact jumper 749 extends in a first direction D1 (e.g., horizontally a distance 758). The number of contact jumpers 749 to sense amplifiers or other circuitry coupled to each secondary portion 742-1, . . . , 742-G may be equal to the number of secondary portions 742-1, . . . , 742-G of each conductive line. Although FIG. 7B illustrates four secondary portions 742-1, . . . , 742-G, the number of secondary portions can be varied. The source/drain region may be formed within a semiconductor material. In some embodiments, the secondary portions 742-1, . . . , 742-G may be spaced approximately equidistant from one another. Contact jumpers 749 coupled to the top tine of secondary portions 742-1, . . . , 742-G may be aligned in columns $C_1$, $C_2$, $C_3$, and $C_4$, among other possible arrangements.

Each contact jumper 749 may be coupled to a conductive line 707 through an interconnection 734. The interconnections 734 may include interconnections to source/drain regions. That is, an electrical path from a conductive line 707 to the sense amplifier or other circuitry contact 755 includes a horizontal interconnect in the form of at least the jumper 749. Thus, the electrical path of the conventional 3D memory array having horizontal interconnects is long, compared to approaches herein which employ vertical contacts (e.g., formed in the absence of a horizontal interconnect). The comparatively long electrical path with horizontal interconnects can render the conventional three-dimensional (3D) memory array having horizontal interconnects prone to signal degradation, etc.

In contrast, to the conventional 3D memory array having horizontal interconnects, embodiments herein are directed to vertical contacts for memory devices. For instance, FIG. 7D is an overhead view of a 3D memory array in accordance with embodiments of the present disclosure. As shown in FIG. 7D, the 3D memory array has vertical contacts 759, as described herein. Notably, the vertical contacts 759 provide a direct shorter electrical path between the conductive lines 707 and the circuitry components 755 at least due to an absence of horizontal interconnects and/or due to the absence of interconnects extending a distance above the conductive lines. Stated differently, an electrical path in the 3D memory array in FIG. 7D has a shorter electrical path due to the absence of the horizontal distance 758 and/or due to the absence of the distance above conductive lines inherent in conventional arrays such as those described in FIGS. 7A-7C.

Figure 8:
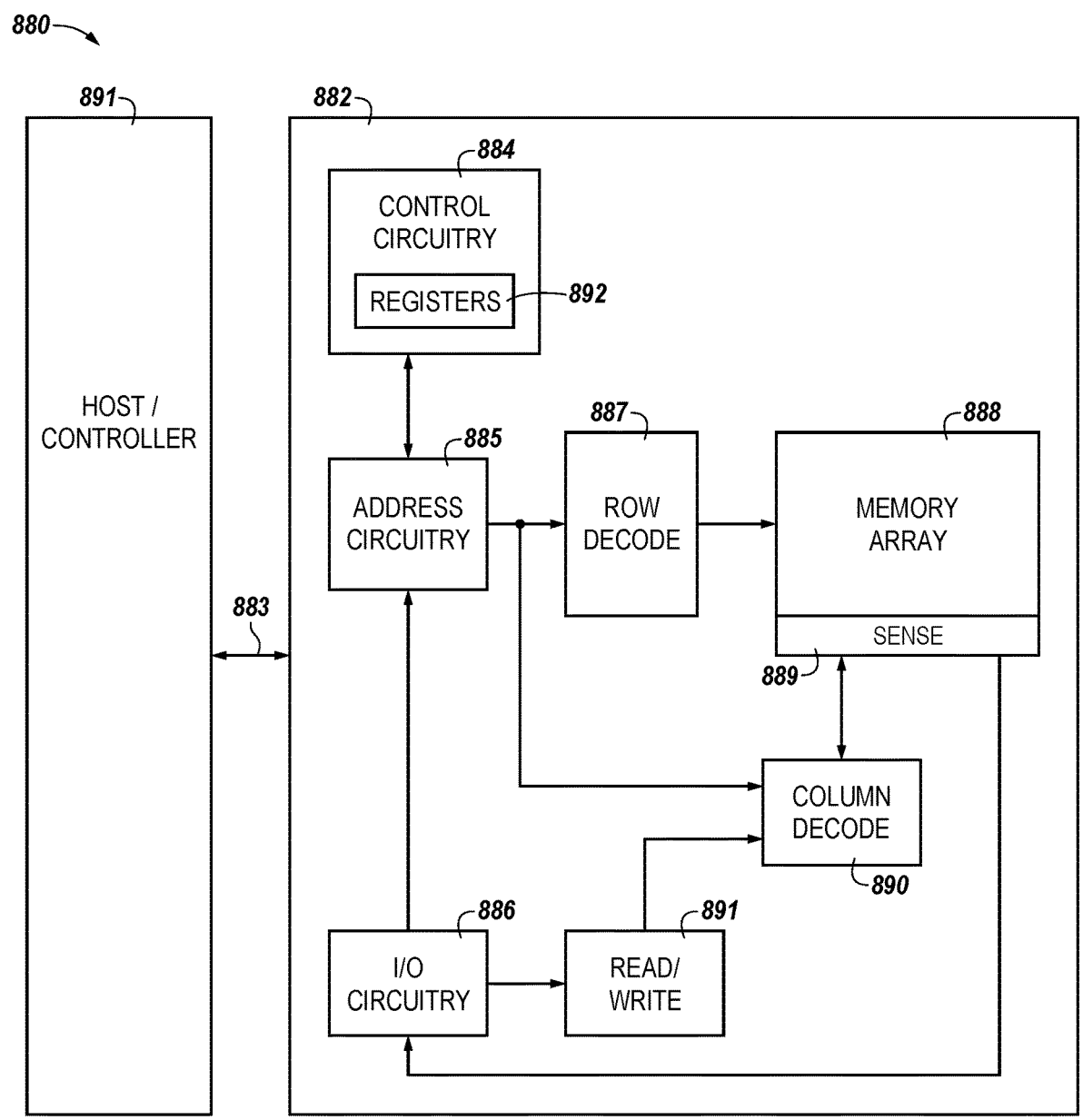
FIG. 8 is a block diagram of an apparatus in the form of a computing system including a memory device in accordance with embodiments of the present disclosure.

FIG. 8 is a block diagram of an apparatus in the form of a computing system 880 including a memory device 882 in accordance with embodiments of the present disclosure. As used herein, a memory device 882, a memory array 888, and/or a host 881, for example, might also be separately considered an "apparatus." According to embodiments, the memory device 881 may include at least one memory array 888 with a memory cell formed with conductive line contact regions having multiple multi-direction conductive lines and vertical contacts, according to the embodiments described herein.

In this example, system 880 includes a host 881 coupled to memory device 882 via an interface 883. The computing system 880 can be a personal laptop computer, a desktop computer, a digital camera, a mobile telephone, a memory card reader, or an Internet-of-Things (IoT) enabled device, among various other types of systems. Host 881 can include a number of processing resources (e.g., one or more processors, microprocessors, or some other type of controlling circuitry) capable of accessing memory 882. The system 880 can include separate integrated circuits, or both the host 881 and the memory device 882 can be on the same integrated circuit. For example, the host 881 may be a system controller of a memory system comprising multiple memory devices 882, with the system controller 884 providing access to the respective memory devices 882 by another processing resource such as a central processing unit (CPU).

In the example shown in FIG. 8, the host 881 is responsible for executing an operating system (OS) and/or various applications (e.g., processes) that can be loaded thereto (e.g., from memory device 882 via controller 884). The OS and/or various applications can be loaded from the memory device 882 by providing access commands from the host 881 to the memory device 882 to access the data comprising the OS and/or the various applications. The host 881 can also access data utilized by the OS and/or various applications by providing access commands to the memory device 882 to retrieve said data utilized in the execution of the OS and/or the various applications.

For clarity, the system 880 has been simplified to focus on features with particular relevance to the present disclosure. The memory array 888 can be a DRAM array comprising at least one memory cell with vertical contacts formed according to the techniques described herein. For example, the memory array 888 can be an unshielded DL 4F2 array such as a 3D-DRAM memory array. The array 888 can include memory cells arranged in rows coupled by word lines (which may be referred to herein as access lines or select lines) and columns coupled by digit lines (which may be referred to herein as sense lines or data lines). Although a single array 888 is shown in FIG. 1, embodiments are not so limited. For instance, memory device 882 may include a number of arrays 888 (e.g., a number of banks of DRAM cells).

The memory device 882 includes address circuitry 885 to latch address signals provided over an interface 883. The interface can include, for example, a physical interface employing a suitable protocol (e.g., a data bus, an address bus, and a command bus, or a combined data/address/command bus). Such protocol may be custom or proprietary, or the interface 883 may employ a standardized protocol, such as Peripheral Component Interconnect Express (PCIe), Gen-Z, CCIX, or the like. Address signals are received and decoded by a row decoder 887 and a column decoder 890 to access the memory array 888. Data can be read from memory array 888 by sensing voltage and/or current changes on the sense lines using sensing circuitry 889. The sensing circuitry 889 can comprise, for example, sense amplifiers that can read and latch a page (e.g., row) of data from the memory array 888. The I/O circuitry 886 can be used for bi-directional data communication with the host 881 over the interface 883. The read/write circuitry 891 is used to write data to the memory array 888 or read data from the memory array 888. As an example, the circuitry 891 can include various drivers, latch circuitry, etc.

Control circuitry 884 decodes signals provided by the host 881. The signals can be commands provided by the host 881. These signals can include chip enable signals, write enable signals, and address latch signals that are used to control operations performed on the memory array 888, including data read operations, data write operations, and data erase operations. In various embodiments, the control circuitry 884 is responsible for executing instructions from the host 881. The control circuitry 884 can include a state machine, a sequencer, and/or some other type of control circuitry, which may be implemented in the form of hardware, firmware, or software, or any combination of the three. In some examples, the host 881 can be a controller external to the memory device 882. For example, the host 881 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

As used herein, the term "secondary portion" may be used synonymously with the term "second portion", meaning a portion extending in a different direction than a "first portion" or "primary portion". For example, a first portion may extend in a first direction, and a number of secondary portions may extend in a second direction perpendicular to the first direction.

The terms "first portion" and "second portion" may be used herein to denote two portions of a single element. For example, a "first portion" of a digit line and a "second portion" of a digit line may denote two portions of a single digit line. It is not intended that the portions referred to as the "first" and/or "second" portions have some unique meaning. It is intended only that one of the "portions" extends in a different direction than another one of the "portions"

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A memory device having arrays of vertically stacked memory cells with vertical contacts, the memory device comprising:
   a substrate including circuitry components;
   a vertical stack of layers formed from repeating iterations of a group of layers disposed on the substrate, the group of layers comprising:
      a first dielectric material layer,
      a semiconductor material layer, and
      a second dielectric material layer including horizontal conductive lines formed along a horizontal plane in the second dielectric material layer; and
   vertical contacts coupled to the horizontal conductive lines, the vertical contacts extending along a vertical plane within the vertical stack of layers to directly electrically couple the horizontal conductive lines to the circuitry components.

2. The memory device of claim 1, wherein the vertical contacts are formed of a conductive material.

3. The memory device of claim 2, wherein the vertical contacts are formed of a doped semiconductor material, a conductive metal nitride, a metal, a metal-semiconductor compound, or any combination thereof.

4. The memory device of claim 1, wherein the vertical contacts are directly electrically coupled to the horizontal conductive lines to the circuitry components in the absence of an additional interconnect.

5. The memory device of claim 1, wherein an electrical path between the horizontal conductive lines that are directly electrically coupled to the circuitry components is shorter than a comparative electrical path of a different memory device which employs at least an additional horizontal interconnect located between the horizontal conductive lines and the circuitry components.

6. The memory device of claim 1, further comprising an insulating material adjacent to at least a portion of the vertical contacts.

7. The memory device of claim 6, wherein the insulating material is selected from silicon oxide material, a silicon nitride material, a silicon oxynitride, or any combination thereof.

8. The memory device of claim 1, wherein the horizontal conductive lines are digit lines.

9. The memory device of claim 1, wherein the memory device is a three- dimensional (3D) dynamic random access memory device.

10. The memory device of claim 1, wherein the horizontal conductive lines are configured in a staircase contact structure.

11. The memory device of claim 1, wherein the arrays of vertically stacked memory cells further comprises a number of horizontal access devices.

12. The memory device of claim 11, wherein each horizontal access device of the number of horizontal access devices is directly electrically coupled, via a respective vertical contact of the vertical contacts, to a corresponding circuitry component.

13. The memory device of claim 12, wherein a total number of the vertical contacts is equal to a total number of the number of horizontal access devices.

14. A method for forming arrays of vertically stacked memory cells, having vertical contacts, comprising:
    forming a number of layers, in repeating iterations vertically to form a vertical stack on a substrate, the layers comprising: a first dielectric material layer, a semiconductor material layer, and a second dielectric material layer having a conductive line formed along a horizontal plane therein; the second dielectric material layer having multiple multi-direction horizontal conductive lines has a first portion extending in a first horizontal direction and a second portion extending in a second horizontal direction at an angle to the first horizontal direction and wherein the second portions are laterally spaced with respect to each other to allow for vertical contacts to be coupled to the second portions;
    performing a removal process in repeating vertical iterations at an area that includes at least a section of the second portion of the conductive line to form a staircase contact structure, forming spaced, vertical openings through the vertical stack adjacent to each of the multiple multi-direction horizontal conductive lines in the staircase contact structure;
    conformally depositing an insulating material in the spaced, vertical openings; and
    depositing conductive material in the spaced, vertical openings to form vertical contact to directly electrically couple the multiple multi-direction horizontal conductive lines in the staircase contact structure to a circuitry components in the substrate.

15. The method of claim 14, wherein forming the spaced, vertical openings further comprises forming the spaced, vertical openings through the vertical stack adjacent to the second portion of each of the multiple multi-direction horizontal conductive lines in the staircase contact structure.

16. The method of claim 14, wherein forming the spaced, vertical openings further comprises forming the spaced vertical openings that extend at least along an entire respective distance between each of the multiple multi-direction horizontal conductive lines and the substrate.

17. The method of claim 14, wherein performing the removal process to form the staircase contact structure comprises:
    selectively removing a first portion of each layer of a first group of layers of the number of layers by removing the first portion of each layer of the first group of layers between a reference line and a first lateral distance from the reference line;
    selectively removing a portion of each layer of a second group of layers of the number of layers by removing the portion of each layer of the second group of layers between the reference line and a second distance back from the reference line; and
    selectively removing a second portion of each layer of the first group of layers of the number of layers by removing the second portion of each layer of the first group of layers between the reference line and a third distance back from the reference line and wherein the third distance is greater than the second distance.

18. A memory device comprising:
    conductive circuitry contacts;
    a plurality of stacked horizontal conductive lines with insulating layers interposed between each of the plurality of stacked horizontal conductive lines;
    an insulating material disposed on the sidewalls of the insulating layers interposed between each of the horizontal conductive lines and on sidewalls of each of the stacked horizontal conductive lines; and
    a plurality of vertical contacts coupled to respective top surfaces of the plurality of stacked horizontal conductive lines to directly electrically couple the respective top surfaces to a corresponding conductive circuitry contact of the conductive circuitry contacts.

19. The memory device of claim 18, wherein the one or more horizontal conductive lines are horizontal digit lines or word lines.

20. The memory device of claim 18, wherein the insulating material is conformally disposed an entirety of the sidewalls of the insulating layers and the sidewalls of each of the stacked conductive lines but is not disposed on the respective top surfaces of the plurality of stacked horizontal conductive lines.

* * * * *